US011763652B2

(12) United States Patent
Carlson et al.

(10) Patent No.: US 11,763,652 B2
(45) Date of Patent: *Sep. 19, 2023

(54) METHOD OF ARRANGING A SECURITY ALARM SYSTEM ON A WINDOW/DOOR AND FRAMING, AND COMBINATION COMPRISING THE WINDOW/DOOR, FRAMING AND SECURITY ALARM SYSTEM THEREOF

(71) Applicant: 1010210 B.C. Ltd., Surrey (CA)

(72) Inventors: Julian Paul Carlson, Surrey (CA); Paul Justin Carlson, Surrey (CA); Dean David Schebel, Surrey (CA)

(73) Assignee: 1010210 B.C. Ltd., Surrey (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/686,232

(22) Filed: Mar. 3, 2022

(65) Prior Publication Data

US 2022/0189271 A1 Jun. 16, 2022

Related U.S. Application Data

(63) Continuation-in-part of application No. 17/055,287, filed on Nov. 13, 2020, now Pat. No. 11,295,584, and
(Continued)

(51) Int. Cl.
*G08B 13/24* (2006.01)
*G01V 3/08* (2006.01)
(Continued)

(52) U.S. Cl.
CPC ..... *G08B 13/2491* (2013.01); *G01R 33/0023* (2013.01); *G01R 33/02* (2013.01);
(Continued)

(58) Field of Classification Search
CPC . G01V 3/081; G08B 3/10; G08B 5/36; G08B 6/00; G08B 13/24
(Continued)

(56) References Cited

U.S. PATENT DOCUMENTS 3,986,183 A 10/1976 Fujiwara
4,296,410 A 10/1981 Higgs et al.
(Continued)

FOREIGN PATENT DOCUMENTS

CA 3100201 A1 11/2019
CN 201780643 U 3/2011
(Continued)

OTHER PUBLICATIONS

Vision Security: "Installation & Operation Manual ZD 2012", published Feb. 10, 2011.
(Continued)

*Primary Examiner* — Kam Wan Ma
(74) *Attorney, Agent, or Firm* — Oyen Wiggs Green & Mutala LLP; Nicholas Garner

(57) ABSTRACT

There is provided a method of arranging a security alarm system on a window/door and framing. The system includes an object and a sensor which is capable of detecting the object within a predetermined range. The method includes positioning a first of the sensor and object on a first of the window/door and framing. The method includes opening the window/door to a threshold distance which facilitates ventilation and inhibits an intruder from passing through the window/door. The method includes positioning a second of the sensor and object along a second of the window/door and framing such that the sensor is able to detect the object as the window/door is opened up to but not past the threshold distance. There is also provided in combination, a window/door, framing extending about the window/door and a
(Continued)

security alarm system coupled to the window/door and framing in the manner described above.

20 Claims, 50 Drawing Sheets

Related U.S. Application Data a continuation-in-part of application No. 16/938,962, filed as application No. PCT/CA2019/000071 on May 17, 2019, now Pat. No. 11,341,829, said application No. 16/938,962 is a continuation-in-part of application No. 15/906,527, filed on Feb. 27, 2018, now abandoned, which is a continuation of application No. 15/329,233, filed as application No. PCT/CA2015/050711 on Jul. 27, 2015, now Pat. No. 9,905,099, which is a continuation of application No. 14/341,710, filed on Jul. 25, 2014, now Pat. No. 10,249,161, said application No. 15/906,527 is a continuation-in-part of application No. 14/341,710, filed on Jul. 25, 2014, now Pat. No. 10,249,161.

(60) Provisional application No. 62/672,593, filed on May 17, 2018, provisional application No. 62/140,439, filed on Mar. 30, 2015.

(51) Int. Cl.
| | |
|---|---|
| *G08B 3/10* | (2006.01) |
| *G08B 6/00* | (2006.01) |
| *G01R 33/00* | (2006.01) |
| *G01R 33/02* | (2006.01) |
| *G08B 5/36* | (2006.01) |
| *G08B 13/08* | (2006.01) |
| *G08B 25/10* | (2006.01) |

(52) U.S. Cl.
CPC ............... *G01V 3/081* (2013.01); *G08B 3/10* (2013.01); *G08B 5/36* (2013.01); *G08B 6/00* (2013.01); *G08B 13/08* (2013.01); *G08B 13/24* (2013.01); *G08B 25/10* (2013.01)

(58) Field of Classification Search
USPC ......................................................... 340/326
See application file for complete search history.

(56) References Cited

U.S. PATENT DOCUMENTS

| | | | |
|---|---|---|---|
| 4,954,812 A | 9/1990 | Lebron | |
| 5,164,705 A | 11/1992 | Dunagan et al. | |
| 5,434,500 A | 7/1995 | Hauck et al. | |
| 5,714,932 A | 2/1998 | Castellon et al. | |
| 6,400,267 B1 | 6/2002 | Gordon-Levitt et al. | |
| 6,577,238 B1 | 6/2003 | Whitesmith et al. | |
| 7,079,034 B2 | 7/2006 | Stilp | |
| 7,221,230 B2 | 5/2007 | Partridge et al. | |
| 8,410,937 B2 | 4/2013 | Collins | |
| 8,773,263 B2 | 7/2014 | Thibault | |
| 8,933,789 B1 | 1/2015 | Fink et al. | |
| 9,659,470 B2 | 5/2017 | Smith | |
| 9,695,015 B1 | 7/2017 | Marinelli | |
| 9,767,660 B1 | 9/2017 | Skarda | |
| 9,905,099 B2 | 2/2018 | Carlson et al. | |
| 10,249,161 B2 | 4/2019 | Carlson | |
| 11,295,584 B2 * | 4/2022 | Carlson ............. | G06K 19/0723 |
| 2001/0030605 A1 | 10/2001 | Novotny | |
| 2004/0182096 A1 | 9/2004 | Alles | |
| 2005/0024207 A1 | 2/2005 | Schebel et al. | |
| 2005/0096587 A1 | 5/2005 | Santini, Jr. et al. | |
| 2005/0179545 A1 | 8/2005 | Bergman et al. | |
| 2007/0279226 A1 | 12/2007 | Whitesmith et al. | |
| 2008/0290864 A1 | 11/2008 | Latraverse | |
| 2009/0042604 A1 | 2/2009 | Ficquette | |
| 2009/0201209 A1 | 8/2009 | Boyle | |
| 2010/0102907 A1 | 4/2010 | Schebel et al. | |
| 2011/0004916 A1 | 1/2011 | Schiffman et al. | |
| 2011/0156905 A1 | 6/2011 | Collins | |
| 2012/0089299 A1 | 4/2012 | Breed | |
| 2013/0057404 A1 | 3/2013 | Thibault | |
| 2013/0057405 A1 | 3/2013 | Seelman et al. | |
| 2013/0170532 A1 | 7/2013 | Marozsak et al. | |
| 2013/0257611 A1 | 10/2013 | Lamb et al. | |
| 2013/0316583 A1 | 11/2013 | Scherer et al. | |
| 2014/0070922 A1 | 3/2014 | Davis | |
| 2014/0244047 A1 | 8/2014 | Oh | |
| 2014/0340222 A1 | 11/2014 | Thornton et al. | |
| 2015/0199888 A1 | 7/2015 | Shapira et al. | |
| 2015/0348385 A1 * | 12/2015 | Lamb ..................... | G08B 29/20 |
| | | | 340/547 |
| 2016/0111878 A1 | 4/2016 | Qureshi et al. | |
| 2017/0109984 A1 | 4/2017 | Child et al. | |
| 2017/0236402 A1 | 8/2017 | McGee | |
| 2018/0365943 A1 | 12/2018 | DiPoala | |
| 2021/0272431 A1 | 9/2021 | Chavady | |
| 2021/0327230 A1 | 10/2021 | Wang et al. | |

FOREIGN PATENT DOCUMENTS

| | | | | |
|---|---|---|---|---|
| DE | 20017433 U1 | 3/2001 | | |
| DE | 202014000574 U1 | 2/2014 | | |
| DE | 102013217366 A1 | 11/2014 | | |
| EP | 1860624 A1 | 11/2007 | | |
| GB | 2356077 A | 5/2001 | | |
| GB | 2461815 A * | 1/2010 | ............. | E05F 15/70 |
| NL | 1000644 C2 | 12/1996 | | |
| WO | 2003046855 A1 | 6/2003 | | |
| WO | 2016011564 A1 | 1/2016 | | |

OTHER PUBLICATIONS

WIPO, International Searching Authority, International Search Report dated Nov. 5, 2015 in International Patent Application No. PCT/CA2015/050711.
European Search Report dated Feb. 1, 2018 for EP 15 82 4924.
WIPO, International Searching Authority, International Search Report dated Jul. 23, 2019 in International Patent Application No. PCT/CA2019/000071.
Extended Supplementary European Search Report dated May 14, 2021 for European Patent Application No. EP 19 80 3339.
WIPO, International Searching Authority, International Search Report dated Aug. 9, 2021 in International Patent Application No. PCT/CA2020/051582.

\* cited by examiner

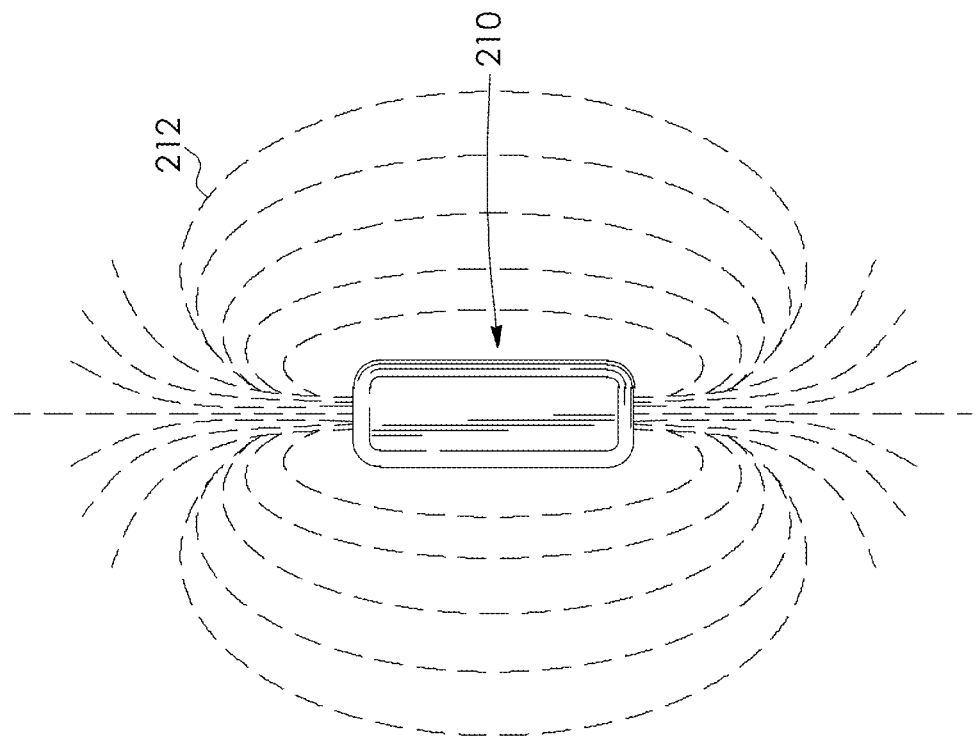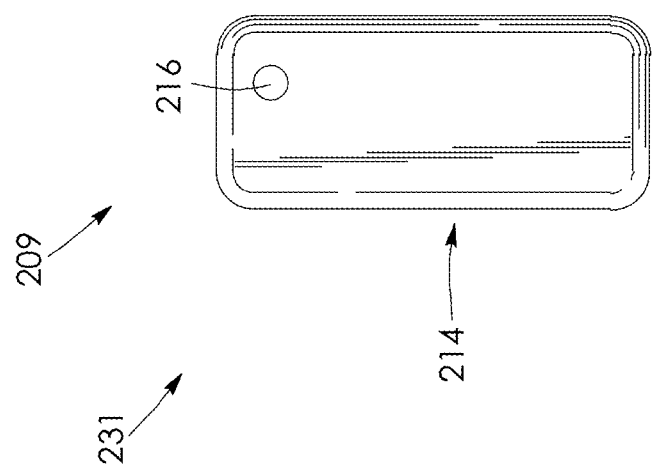
FIG. 32

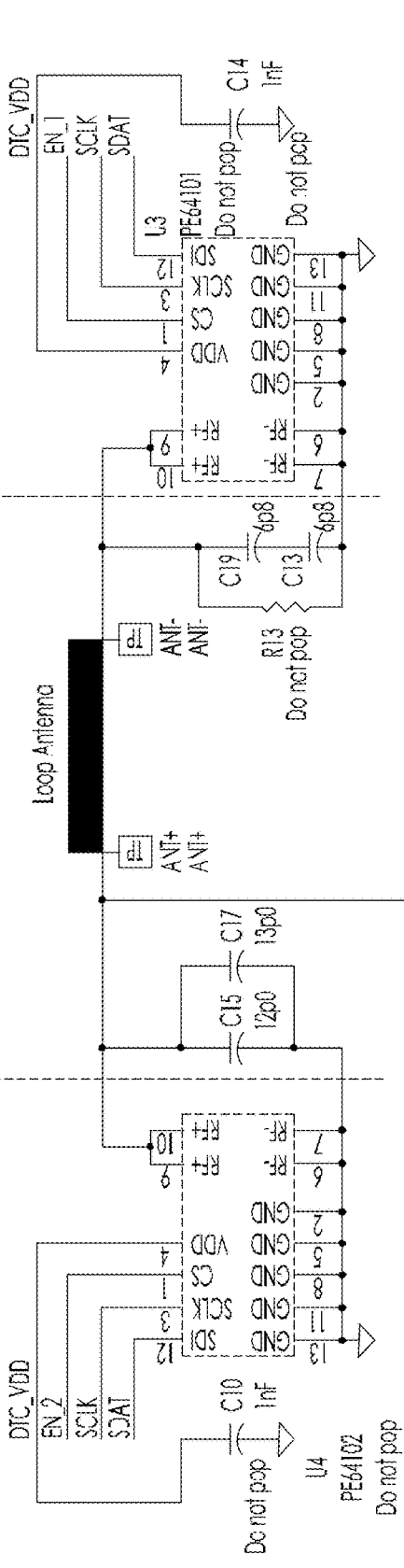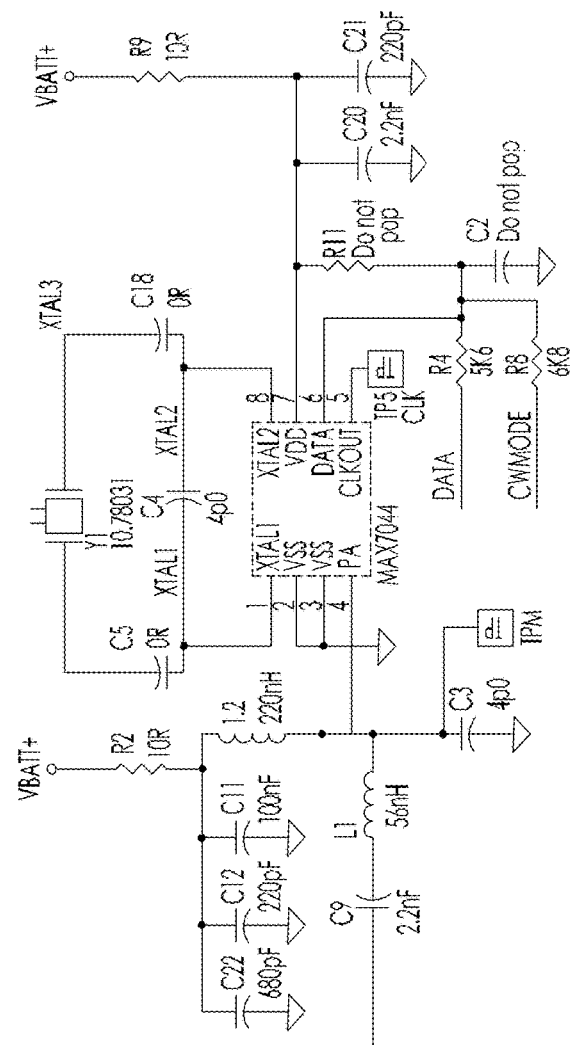
FIG. 36A

METHOD OF ARRANGING A SECURITY ALARM SYSTEM ON A WINDOW/DOOR AND FRAMING, AND COMBINATION COMPRISING THE WINDOW/DOOR, FRAMING AND SECURITY ALARM SYSTEM THEREOF

BACKGROUND OF THE INVENTION

Field of the Invention

The present invention relates to a method of arranging a security alarm system and, in particular, a method of arranging a security alarm system on a window/door and framing, as well as a combination comprising the window/door, framing and security alarm system thereof.

Description of the Related Art

U.S. Pat. No. 4,296,410, which issued on Oct. 20, 1981 to Higgs et al., discloses an integrated circuit including a Hall element and a threshold detector. The threshold detector is encased in a plastic housing with the plane of the Hall element parallel with a face of the housing to provide a two-state Hall element proximity sensor. A light-emitting diode is mounted in the housing and is connected to the output of the detector. This provides visual indication of the state of the sensor. A kit includes the sensor and a compatible magnet which may be used as a proximity sensor in a security alarm system.

International Patent Application Publication No. WO/2003/046855 which was published on Jun. 5, 2013, in the name of Carlson discloses a security sensor system. The security sensor system includes a window frame defining a window opening, a window sash movable relative to the window frame between open and closed positions, and a sensor unit embedded in the window frame. The sensor unit includes a housing having an inner end within the window frame, an outer end at a surface of the window frame, and a flexible ¼ wave wire antenna extending e.g. longitudinally of the window frame from the housing. The housing contains a sensor switch, a microprocessor, an RF transmitter and a battery for emitting signals to a master station or controller. The security sensor system also includes a magnet mounted in the window sash for actuating the sensor switch.

U.S. Pat. No. 6,577,238 to Whitesmith et al. discloses a system for monitoring the position of one or more RFID tags. The system has a detector incorporating circuitry for detecting changes in the range of an RFID tag from the detector. An alarm is triggered if a detected change in range of an RFID tag exceeds a predetermined threshold or if the RFID radio tag cannot be detected by the detector. Range may be detected by measuring the time of a returned radio signal from a tag, by measuring the strength of a returned radio signal from a tag, or by detecting changes in a periodic interval at which energy is transmitted by a tag.

SUMMARY OF THE INVENTION

There is accordingly provided a method of installing a security alarm system on a window/door and framing. The security alarm system includes an object and a sensor which is capable of detecting the object within a predetermined range. The method includes coupling a first of the sensor and the object to a first of the window/door and the framing. The method includes opening the window/door to a threshold distance which facilitates ventilation and inhibits an intruder from passing through the window/door. The method includes positioning a second of the sensor and the object along a second of the window/door and the framing such that the sensor is able to detect the object as the window/door is opened up to but not past the threshold distance. The method includes coupling the second of the sensor and the object so positioned to the second of the window/door and the framing.

There is also provided a method of arranging a security alarm system on a window/door and framing. The security alarm system includes an object and a sensor which is capable of detecting the object within a predetermined range. The method includes positioning a first of the sensor and the object on a first of the window/door and the framing. The method includes opening the window/door to a threshold distance which facilitates ventilation and inhibits an intruder from passing through the window/door. The method includes positioning a second of the sensor and the object along a second of the window/door and the framing such that the sensor is able to detect the object as the window/door is opened up to but not past the threshold distance.

There is further provided, in combination, a window/door, framing extending about the window/door, and a security alarm system. The system includes an object coupled to a first of the window/door and the framing. The system includes a sensor which is capable of detecting the object within a predetermined range. Positioning of the sensor along a second of the window/door and the framing is determined by first opening the window/door to a threshold distance which facilitates ventilation and inhibits an intruder from passing through the window/door. The sensor is next positioned along the second of the window/door and the framing such that the sensor is able to detect the object as the window/door is opened up to but not past the threshold distance. The sensor couples to the second of the window/door and the framing so positioned.

It is emphasized that the invention relates to all combinations of the above features, even if these are recited in different claims.

Further aspects and example embodiments are illustrated in the accompanying drawings and/or described in the following description.

BRIEF DESCRIPTIONS OF DRAWINGS

The accompanying drawings illustrate non-limiting example embodiments of the invention.

FIG. 30 is a front elevation view of a sensor assembly according to another aspect, the sensor assembly comprising a first magnetic field sensor and a magnet adjacent thereto, the magnetic field sensor including an indicator light that is turned on;

FIG. 31 is a front elevation view of the magnetic field sensor and magnet of FIG. 30, with the magnet being spaced-apart from but still within range of the magnetic field sensor and the indicator light thus being turned on;

FIG. 32 is a front elevation view of the magnetic field sensor and magnet of FIG. 30, with the magnet being spaced out of range of the magnetic field sensor and the indicator light not being turned on;

FIGS. 36A to 36E are circuit diagrams of the magnetic field sensor of FIG. 30;

DESCRIPTIONS OF THE PREFERRED EMBODIMENTS

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive sense.

Figure 1:
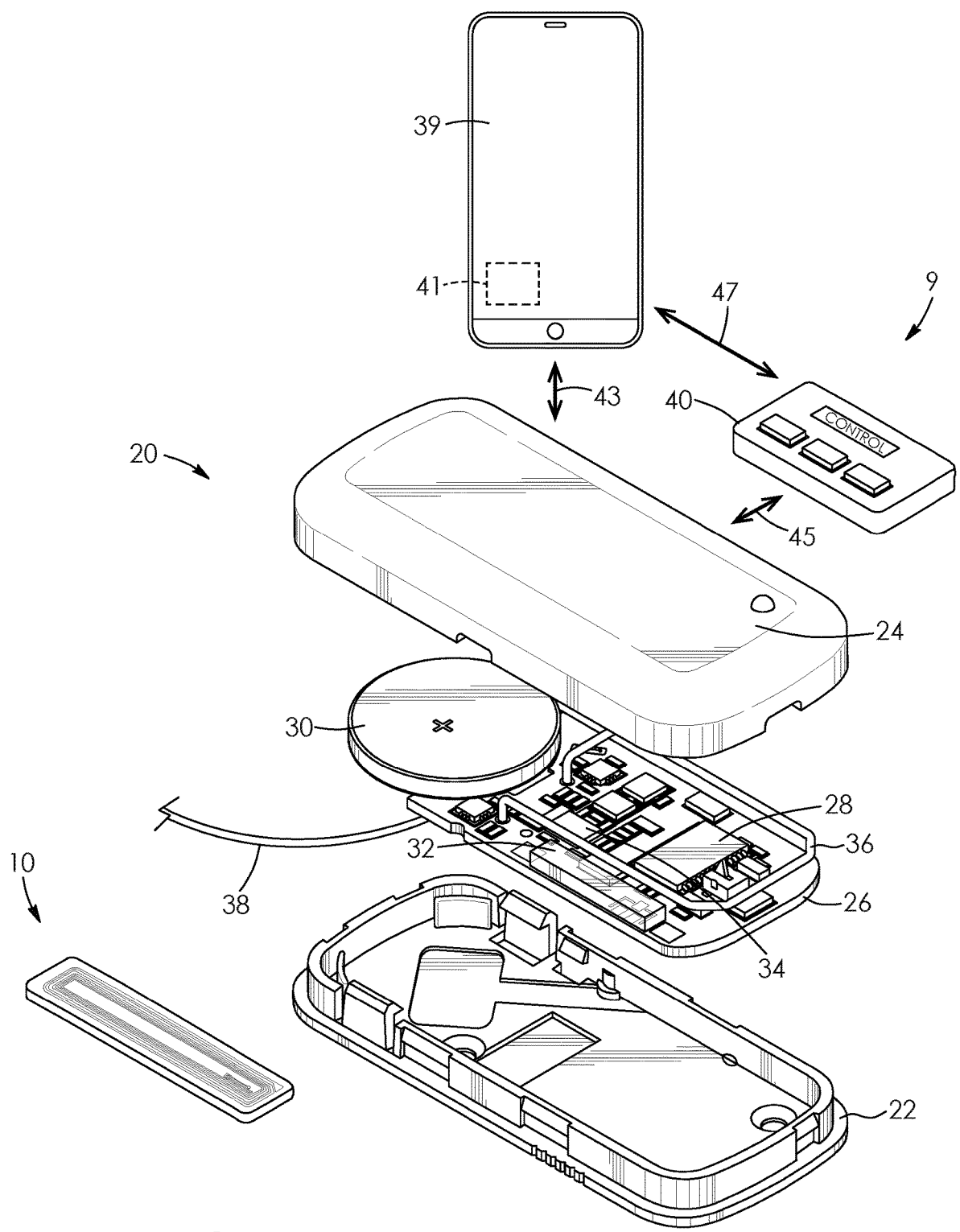
FIG. 1 is a front, bottom, right side perspective view of an RFID tag and a perspective, exploded view of a sensor for a security alarm system.

Referring to the drawings and first to FIG. 1 there is shown a security alarm system 9. The system includes a RFID tag 10 and a sensor 20. The sensor includes a housing 22 having a cover 24. There is a circuit board 26 disposed within housing 22. A microprocessor 28, a power source which may be in the form of a coin cell battery 30, and an RFID reader 32 are each mounted on the circuit board 26. A radio 34 and an antenna 36 are also mounted on circuit board 26 and allow the sensor 20 to transmit and receive radio signals. There is a wire 38 which may be electrically and releasably connected to sensor 20.

The security alarm system 9 may be a wireless and include an electronic device that includes a processor, in this case a mobile electronic device in the form of a smartphone 39 including a processor 41. Radio 34 and antenna 36 enable sensor 20 to communication with the smartphone as shown by arrow 43. The sensor may communicate with smartphone 39 to convey a status thereof, trigger a notification to the user and/or trigger an alarm thereon.

In addition or alternatively, security alarm system 9 may include a controller or control panel 40 that is part of the wireless security alarm system. Sensor 20 may be in communication with the control panel. In this case the sensor may communicate directly with control panel 40 (as seen by arrow 45) or communicate with smartphone 39 (as seen by arrow 43) which in turn communicates with the control panel to trigger an alarm (as seen by arrow 47) when one or more threshold conditions have been met, exceeded or triggered. Wire 38 allows sensor 20 communicate with control panel 40 as part of a wired said security alarm system 9.

Figure 2:
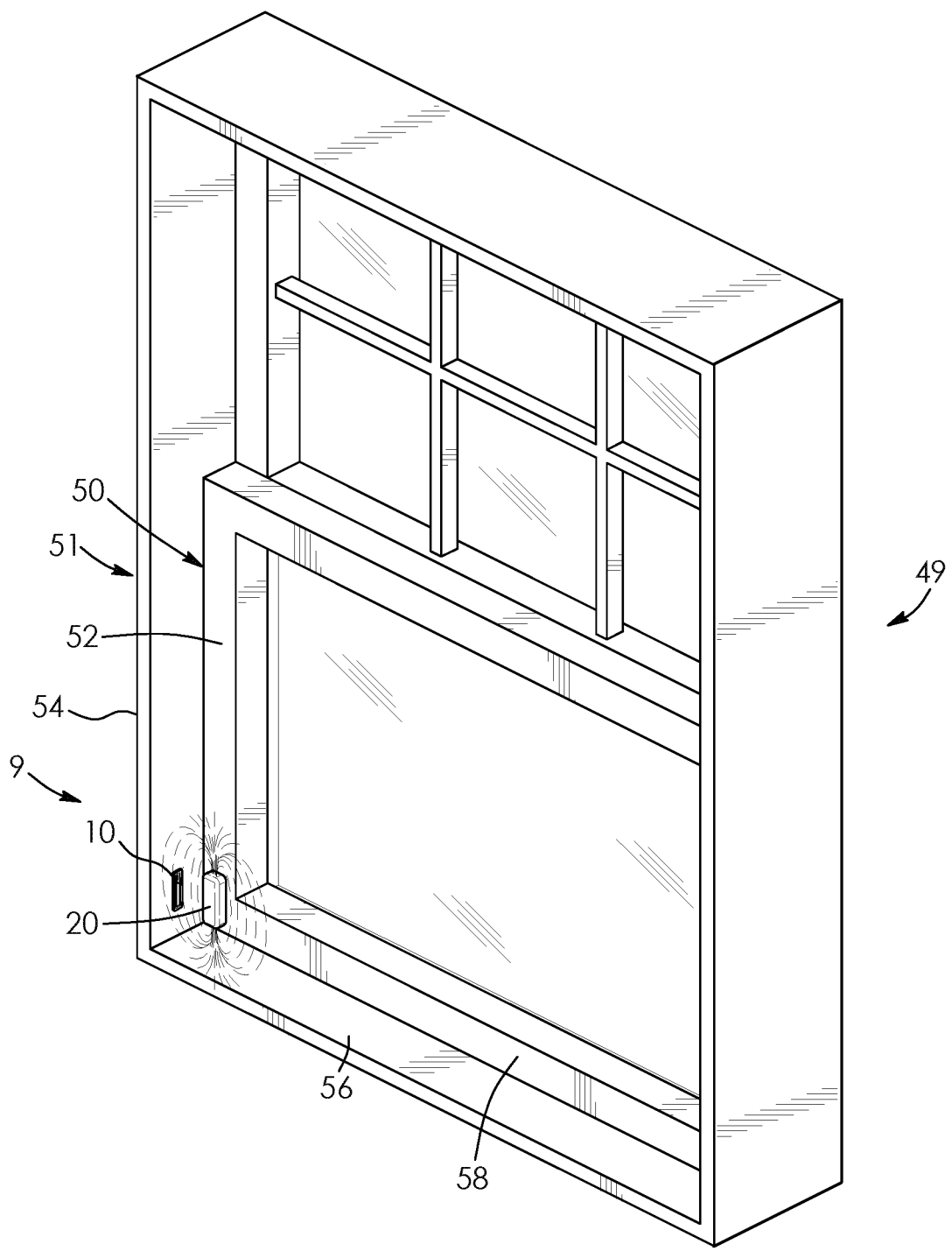
FIG. 2 is a front, top, left side perspective view showing the RFID tag and the sensor being used as the window sensor in a first configuration of a security alarm system with the window closed.
Figure 3:
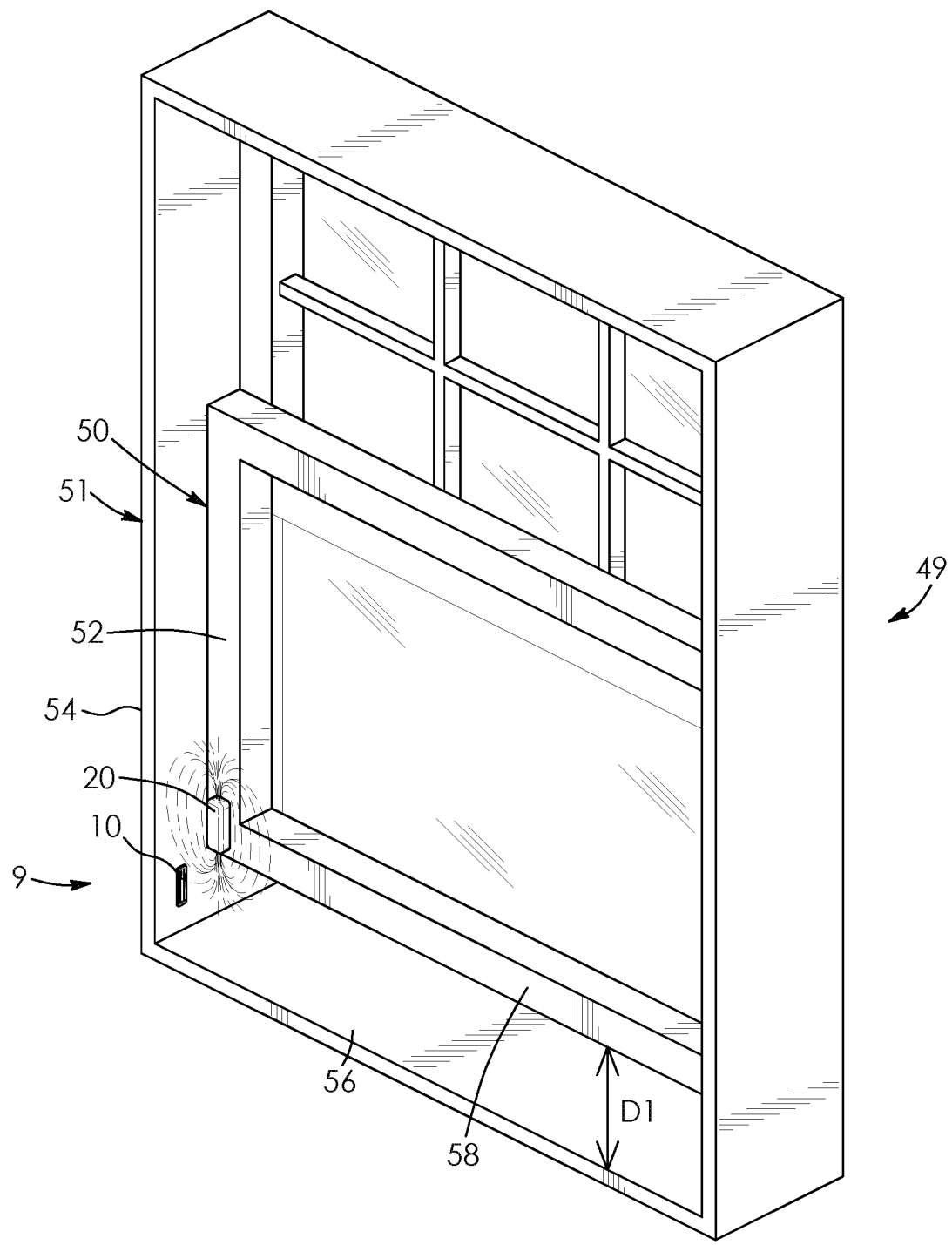
FIG. 3 is a front, top, left side perspective view showing the RFID tag and the sensor being used as a window sensor in the first configuration of the security alarm system with the window being open a distance D1.
Figure 4:
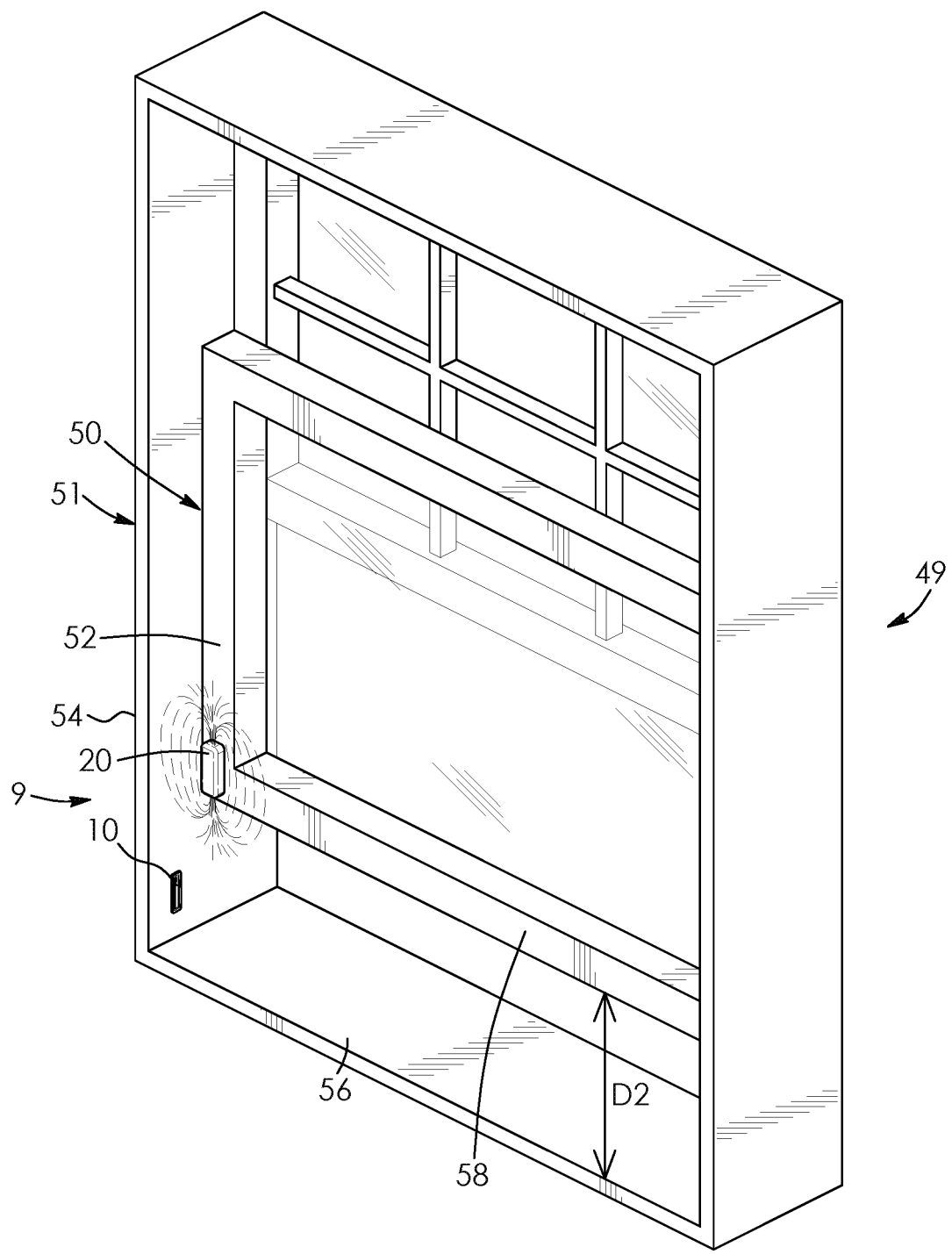
FIG. 4 is a front, top, left side perspective view showing the RFID tag and the sensor being used as the window sensor in the first configuration of the security alarm system with the window being open a distance D2.

FIGS. 2 to 4 show RFID tag 10 and sensor 20 being used as a window sensor for a window assembly 49 comprising a window 50 and framing 51 thereof, in a first configuration of security alarm system 9. The first configuration of the security alarm system is a wireless security alarm system in which sensor 20 is mounted on both a stile 52 and bottom rail 58 of window 50 and RFID tag 10 is mounted on a side jamb 54 of framing 51 adjacent a sill 56 of the framing. The window is fully closed in FIG. 2 with bottom rail 58 of the window abutting sill 56 of the framing. Sensor 20 is able to read RFID tag 10 when window 50 is fully closed and thus signals to the smartphone 39 and/or control panel 40 seen in FIG. 1 that the window is closed. Likewise, as shown in FIG. 3, the sensor is able to read RFID tag 10 when the window is open up to a threshold distance D1 and may signal to the smartphone and/or control panel that the window is open up to the threshold distance.

Referring to FIG. 3, it is desirable to allow window 50 to be partially opened for ventilation but not opened enough to allow an intruder to enter through the window. Sensor 20 will accordingly not trigger an alarm when the sensor is able to read RFID tag 10. However, and with reference to FIG. 4, when window 50 is open to distance D2, which is greater than threshold distance D1, the sensor is no longer able to read RFID tag 10. In this case sensor 20 sends a signal or notification to smartphone 39 and/or control panel 40 seen in FIG. 1 indicating that the window is open greater than threshold distance D1, and this signal or notification may also trigger an alarm via the smartphone or the control panel.

Referring back to FIG. 2, sensor 20 may be solely mounted on bottom rail 58 of the window in other configurations.

Figure 5:
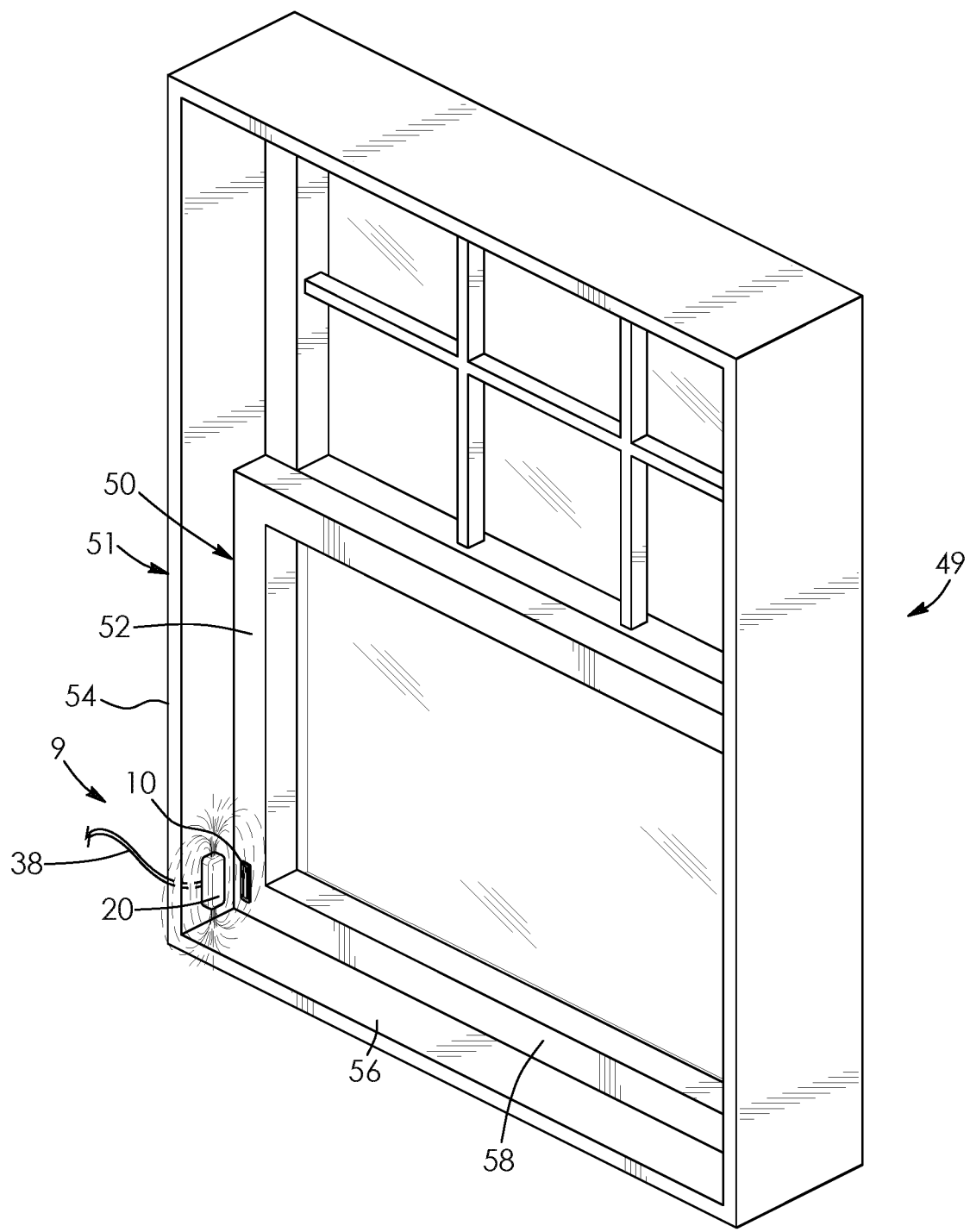
FIG. 5 is a front, top, left side perspective view showing the RFID tag and the sensor being used as a window sensor in a second configuration of a security alarm system with the window closed.
Figure 6:
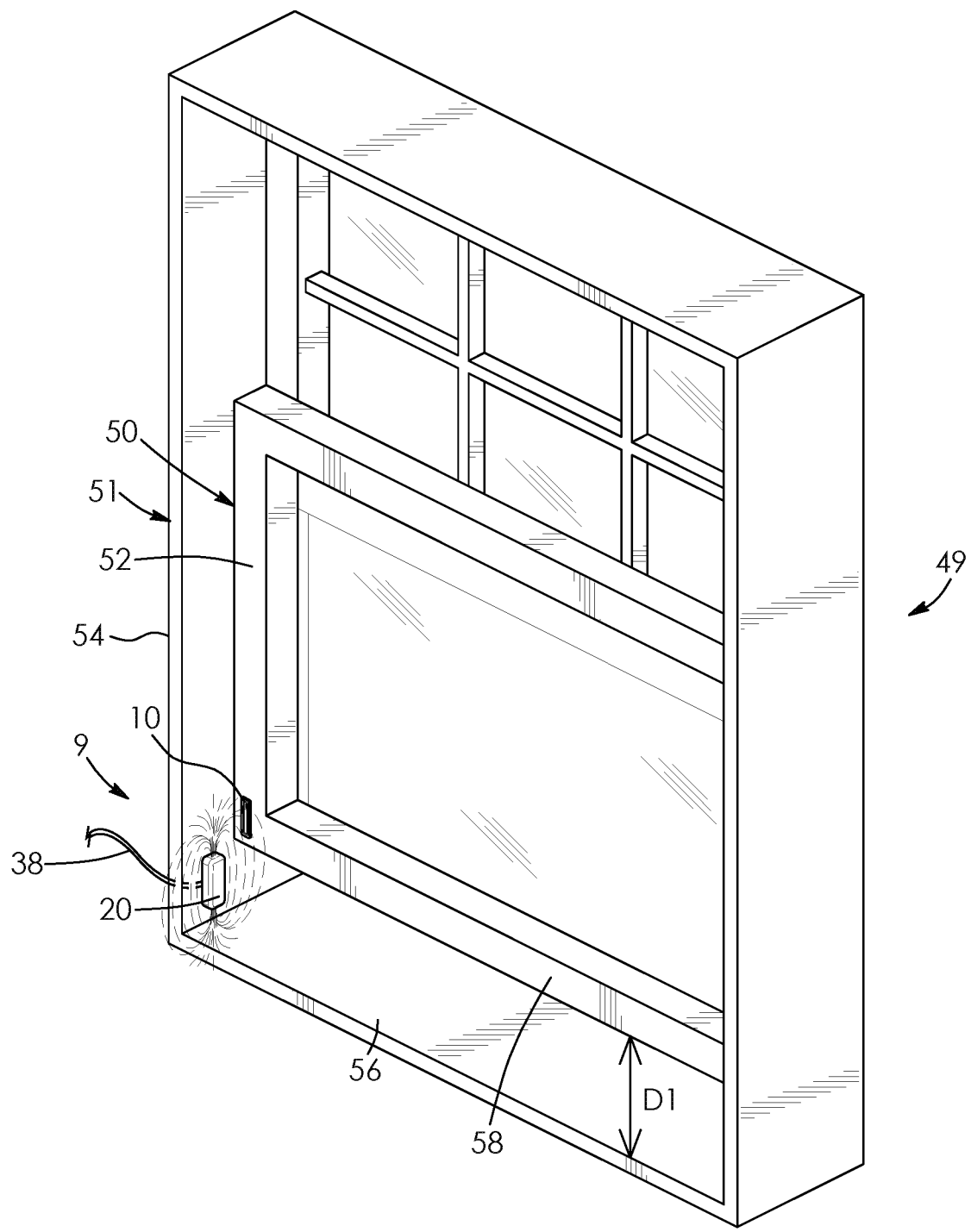
FIG. 6 is a front, top, left side perspective view showing the RFID tag and the sensor being used as the window sensor in the second configuration of the security alarm system with the window being open distance D1.
Figure 7:
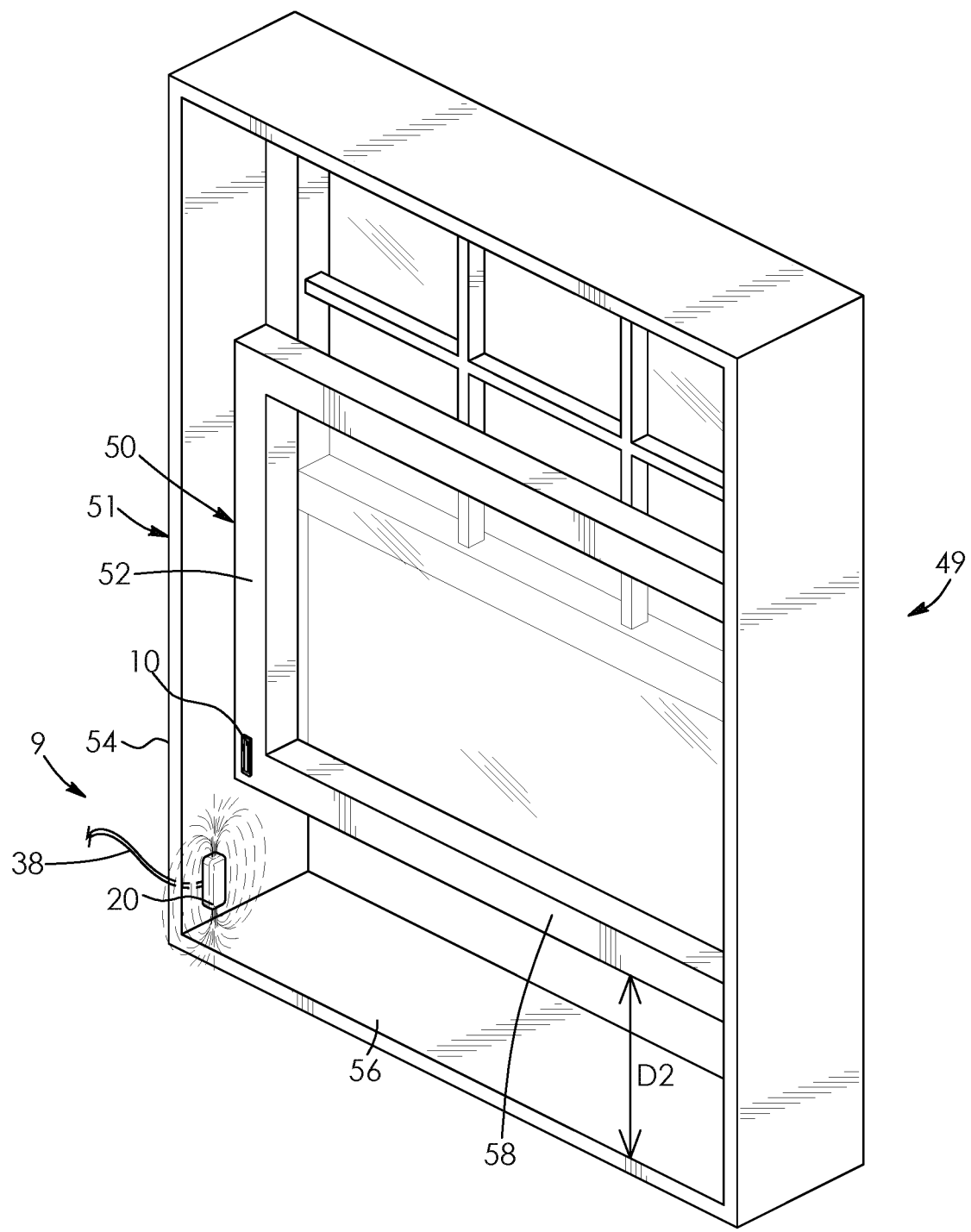
FIG. 7 is a front, top, left side perspective view showing the RFID tag and the sensor being used as the window sensor in the second configuration of the security alarm system with the window being open distance D2.
Figure 8:
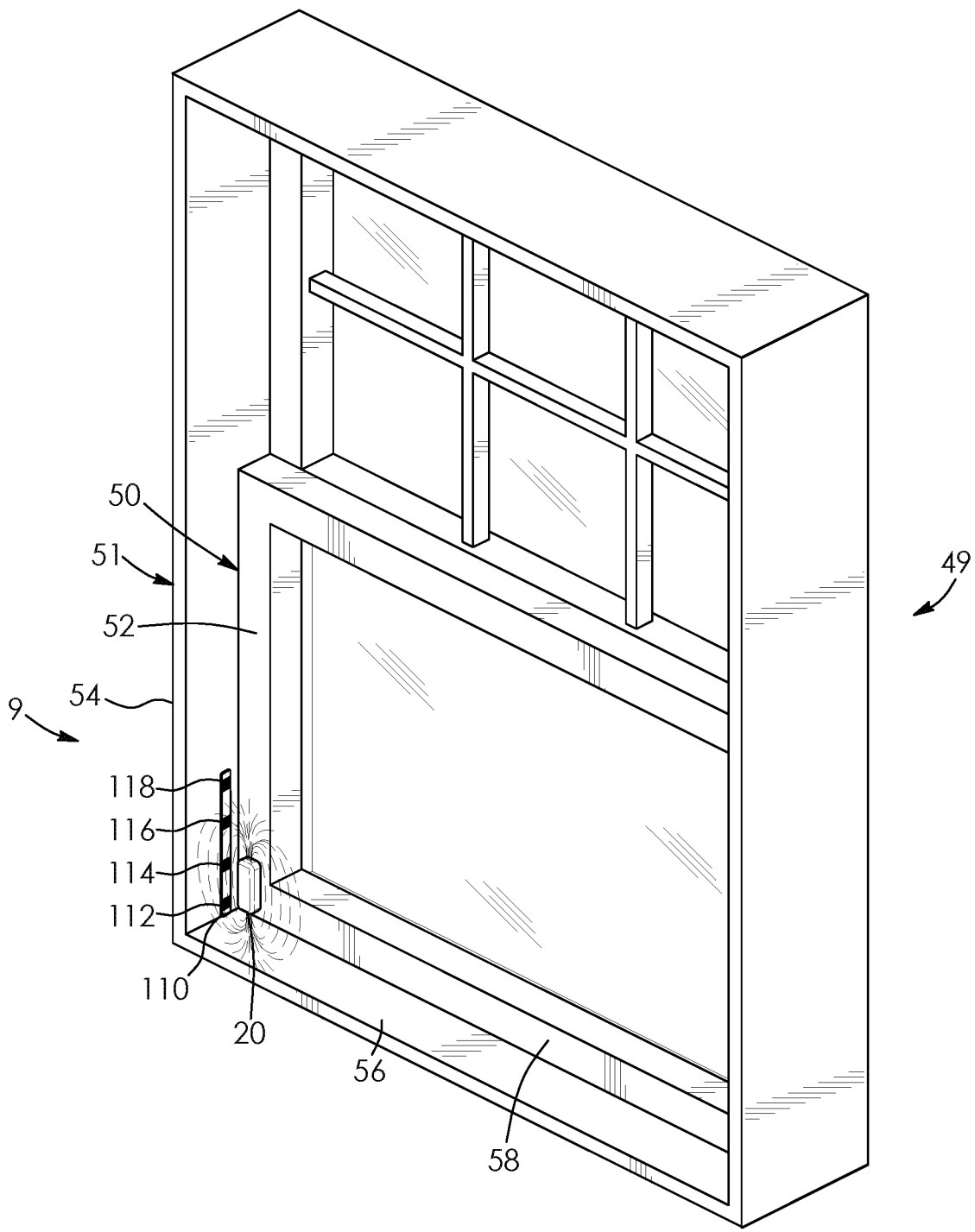
FIG. 8 is a front, top, left side perspective view showing an RFID strip and the sensor being used as a window sensor in a third configuration of a security alarm system with the window closed.

FIGS. 5 to 7 show RFID tag 10 and sensor 20 being used as a window sensor for window assembly 49 in a second configuration of security alarm system 9. The second configuration of the security alarm system is a wired security alarm system in which RFID tag 10 is mounted on stile 52 and bottom rail 58 of window 50 and sensor 20 is mounted on side jamb 54 of framing 51 adjacent sill 56 of the framing. This allows the sensor to be wired in the second configuration of security alarm system 9. Window 50 is fully closed in FIG. 5 with bottom rail 58 of the window abutting sill 56 of the framing.

Sensor 20 is able to read RFID tag 10 when the window is fully closed and thus signals to the smartphone 39 and/or control panel 40 seen in FIG. 1 that the window is closed. Likewise, as shown in FIG. 6, the sensor is able to read the RFID tag when window 50 is open up to threshold distance D1 and may signal to the smartphone and/or control panel that the window is open up to the threshold distance.

Referring to FIG. 6, it is desirable to allow the window to be partially opened for ventilation but not opened enough to allow an intruder to enter through the window. Sensor 20 will accordingly not trigger an alarm when the sensor is able to read RFID tag 10. However, and with reference to FIG. 7, when window 50 is open to distance D2, which is greater than threshold distance D1, sensor 20 is no longer able to read RFID tag 10. In this case the sensor sends a signal or notification to smartphone 39 and/or control panel 40 seen in FIG. 1 indicating that the window is open greater than threshold distance D1, and this signal or notification may also trigger an alarm via the smartphone or the control panel.

FIGS. 8 to 11 show a substrate strip 110 with a plurality of RFID tags, namely a first RFID tag 112, a second RFID tag 114, a third RFID tag 116, and a fourth RFID tag 118. The substrate strip and sensor 20 are used as a window sensor for window assembly 49 in a third configuration of security alarm system 9. The third configuration of the security alarm system is a wireless security alarm system in which the sensor is mounted on stile 52 and bottom rail 58 of window 50 and substrate strip 110 is mounted on side jamb 54 of framing 51 adjacent sill 56 of the framing. Window 50 is fully closed in FIG. 8 with bottom rail 58 of the window abutting the sill of the framing. Sensor 20 is able to read first RFID tag 112 when the window is fully closed and thus signals to the smartphone 39 and/or control panel 40 seen in FIG. 1 that the window is closed.

Figure 9:
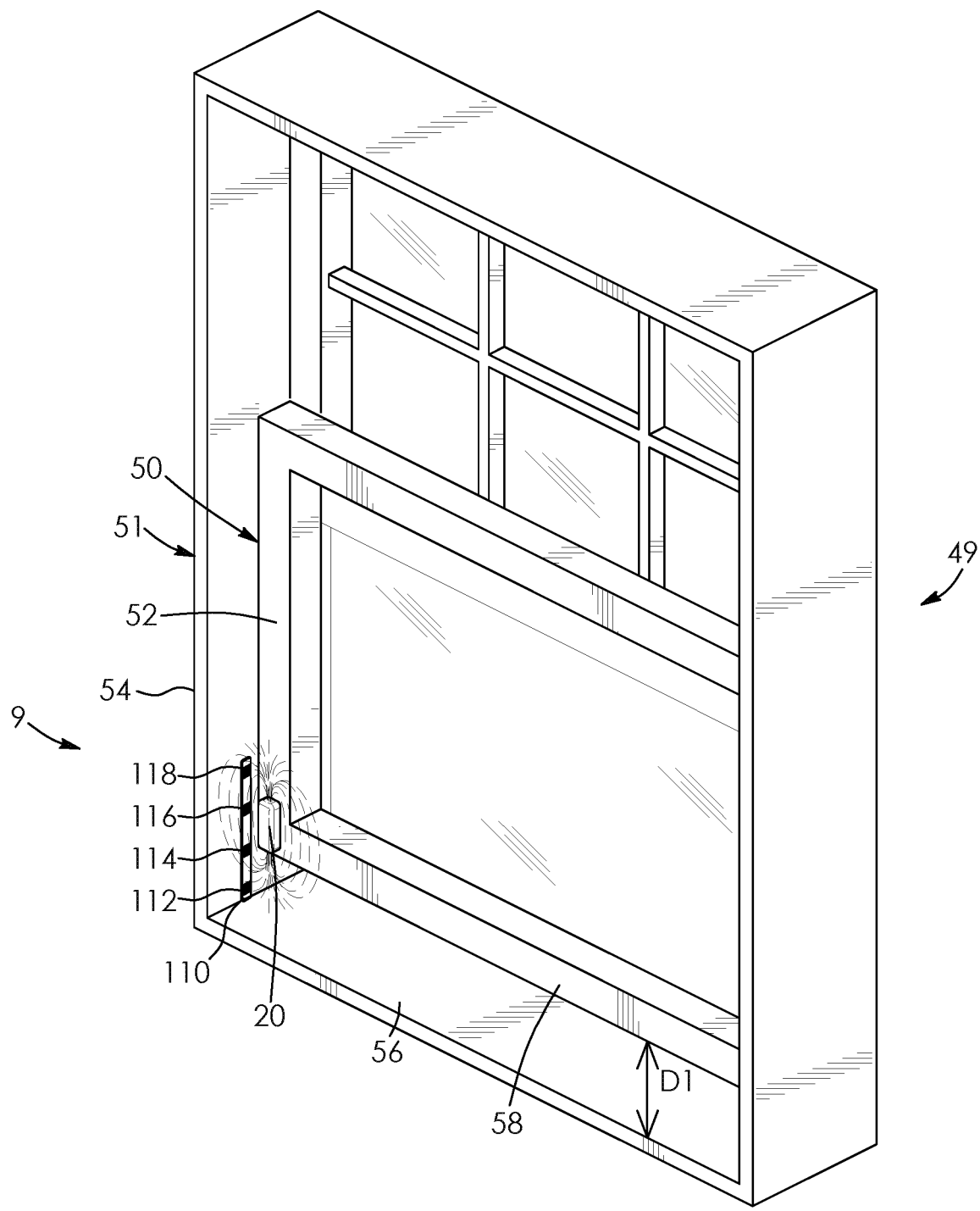
FIG. 9 is a front, top, left side perspective view showing the RFID strip and the sensor being used as the window sensor in the third configuration of the security alarm system with the window being open distance D1.

However, as shown in FIG. 9, sensor 20 is no longer able to read the first RFID tag when window 50 is open to threshold distance D1. The sensor is able though to read second RFID tag 114 when the window is open to threshold distance D1 and thus signals to the smartphone 39 and/or control panel 40 seen in FIG. 1 that the window is open to threshold distance D1. Referring back to FIG. 9, it is desirable to allow window 50 to be partially opened for ventilation but not opened enough to allow an intruder to enter through the window. Sensor 20 will accordingly not trigger an alarm as the sensor is able to read second RFID tag 114 and determine that the window 50 is open up to threshold distance D1.

Figure 10:
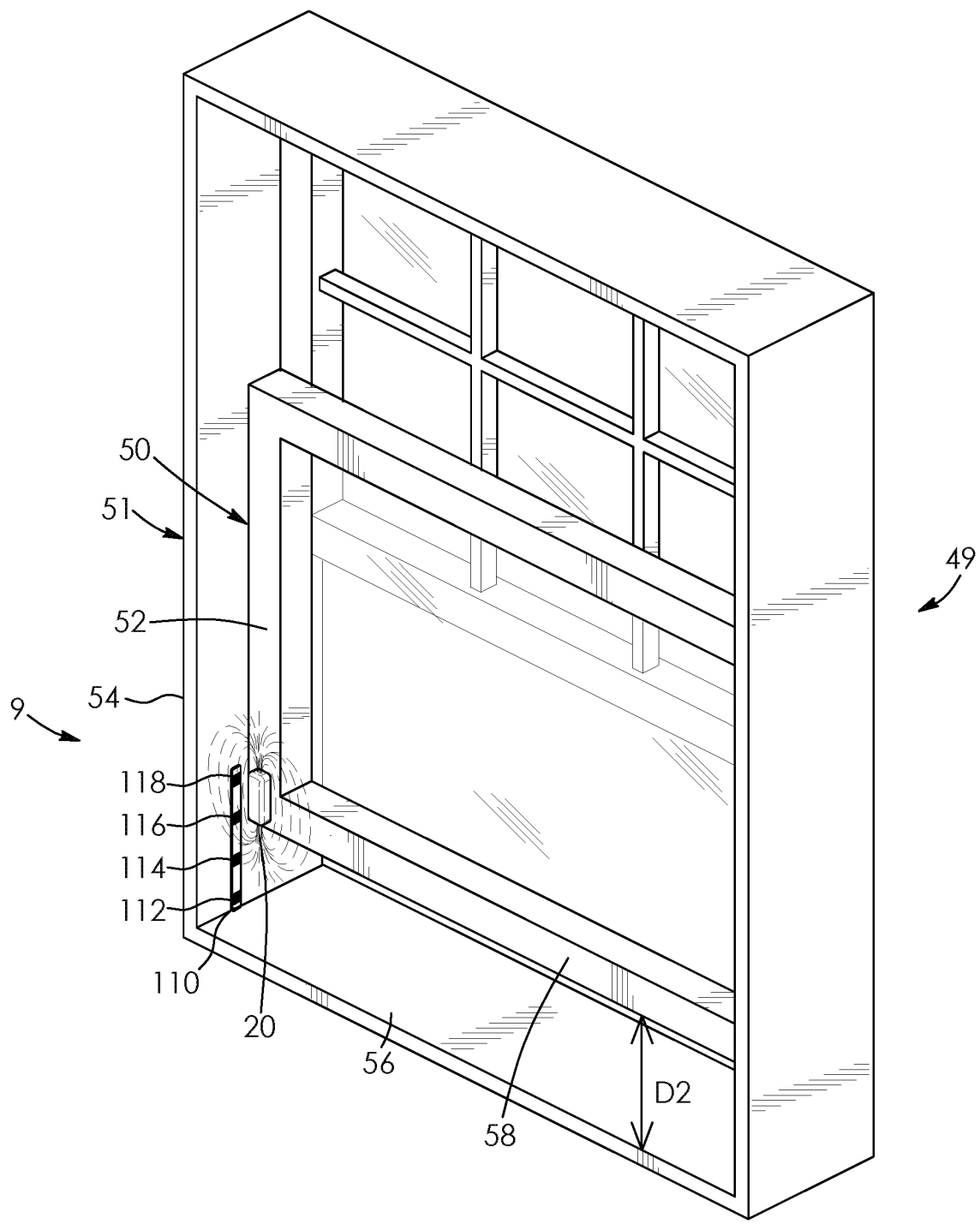
FIG. 10 is a front, top, left side perspective view showing the RFID strip and the sensor being used the window sensor in the third configuration of the security alarm system with the window being open distance D2.
Figure 11:
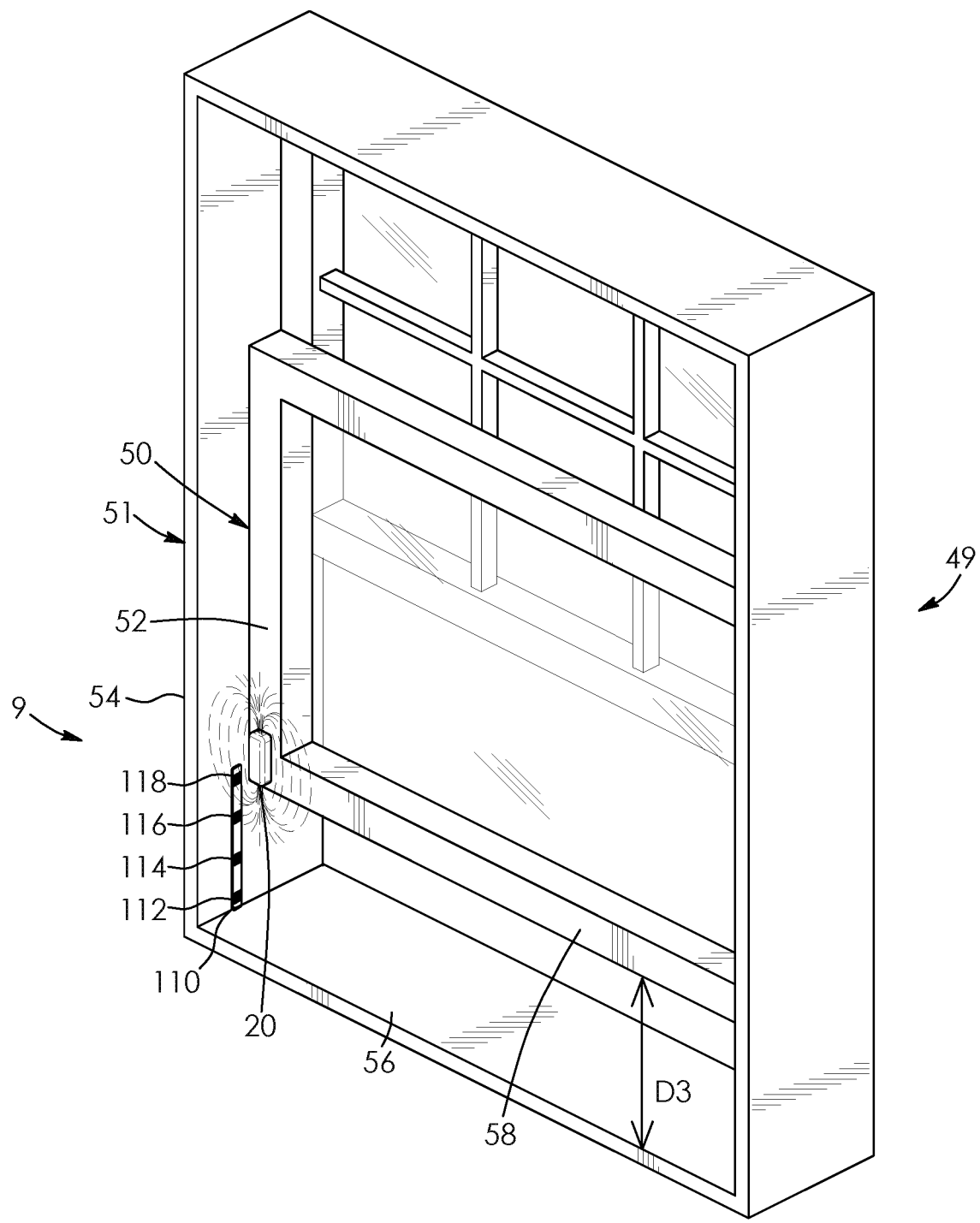
FIG. 11 is a front, top, left side perspective view showing the RFID strip and the sensor being used as the window sensor in the third configuration of the security alarm system with the window being open a distance D3.
Figure 12:
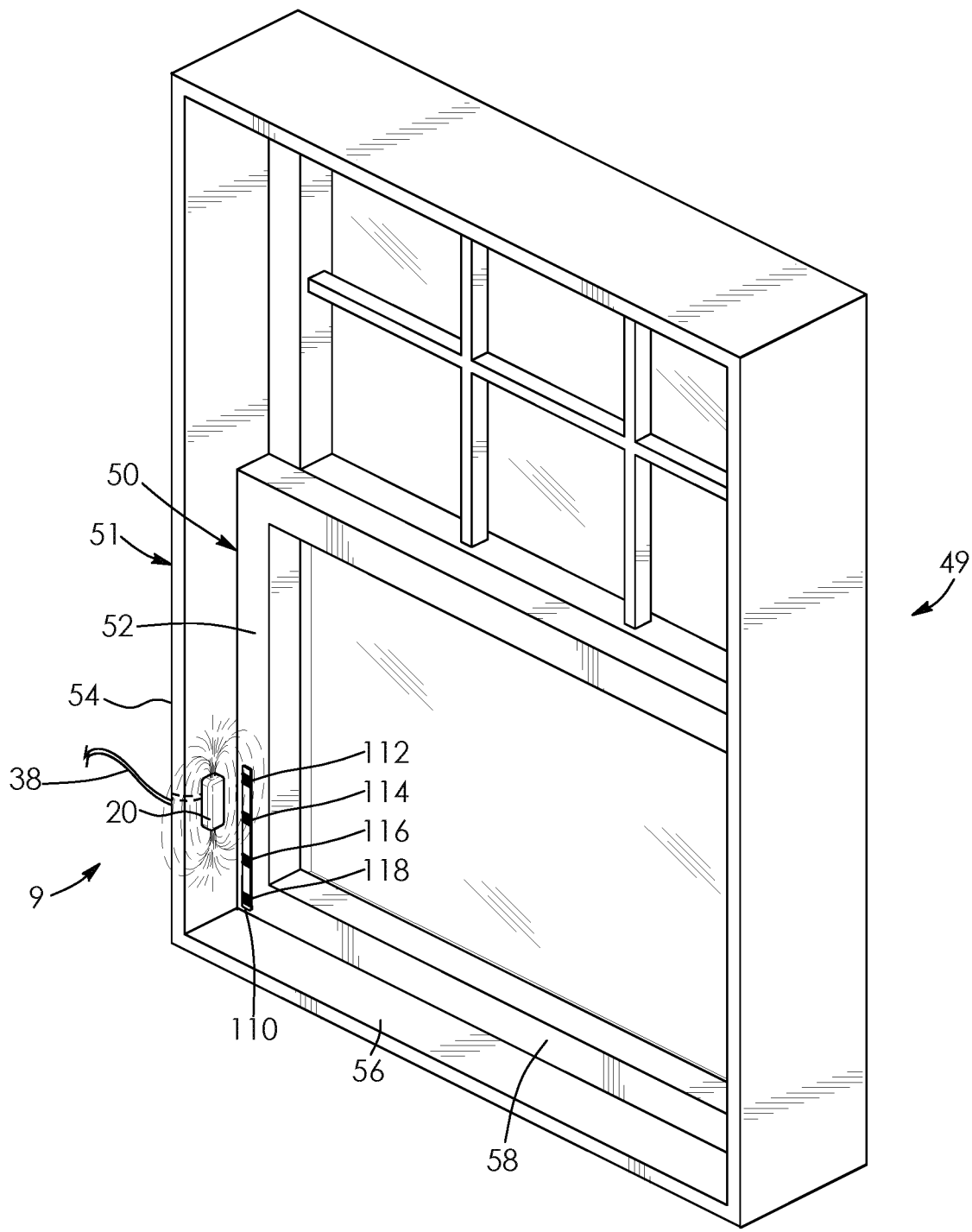
FIG. 12 is a front, top, left side perspective view showing the RFID strip and the sensor being used as a window sensor in a fourth configuration of a security alarm system with the window closed.

Referring now to FIGS. 10 and 11, when the window is open to distance D2 or distance D3, which is greater than threshold distance D1, the sensor is no longer able to read second RFID. Because distance D2 or distance D3 is greater than threshold distance D1, sensor 20 sends a signal or notification to smartphone 39 and/or control panel 40 seen in FIG. 1 that the window is open greater than threshold distance D1. In this case sensor 20 sends a signal or notification to smartphone 39 and/or control panel 40 seen in FIG. 1 indicating that the window is open greater than threshold distance D1, and this signal or notification may also trigger an alarm via the smartphone or the control panel.

Alternatively, if the user wants the window to be opened to a greater extent without triggering an alarm, in this case sensor 20, smartphone 39 and/or control panel 40 seen in FIG. 1 may be selectively programmed to only trigger an alarm when the window is open threshold distance D3 seen in FIG. 11, which is greater than distance D2. As a further alternative, the sensor, smartphone and/or control panel seen in FIG. 1 may be selectively programmed to trigger an alarm only when the window is open a distance greater than distance D3 seen in FIG. 11.

Sensor 20 is able to read third RFID tag 116 when window 50 is open to distance D2, as shown in FIG. 10, and thus signals to the smartphone 39 and/or control panel 40 seen in FIG. 1 that the window is open to distance D2. Likewise, as shown in FIG. 11, the sensor is able to read fourth RFID tag 118 when window 50 is open to distance D3 signals to the smartphone 39 and/or control panel 40 seen in FIG. 1 that the window is open to distance D3. Referring back to FIG. 11, the third embodiment of the security alarm system is thereby able to determine how much the window is open based on whether the sensor is able to read one or more of first RFID tag 112, second RFID tag 114, third RFID tag 116, fourth RFID tag 118.

FIGS. 12 to 15 show substrate strip 110 and sensor 20 being used as a window sensor for window assembly 49 in a fourth configuration of security alarm system 9. The fourth configuration of the security alarm system is a wired security alarm system in which the substrate strip is mounted on stile 52 of window 50 and in part on bottom rail 58 of the window. The sensor is mounted on side jamb 54 of framing 51 near and spaced upwards from sill 56 of the framing in this example and from the perspective of FIG. 12. This allows sensor 20 to be wired in the fourth configuration of the security alarm system. Window 50 is fully closed in FIG. 12 with bottom rail 58 of the window abutting sill 56 of framing 51. Sensor 20 is able to read first RFID tag 112 when the window is fully closed and thus signals to the smartphone 39 and/or control panel 40 seen in FIG. 1 that the window is closed.

Figure 13:
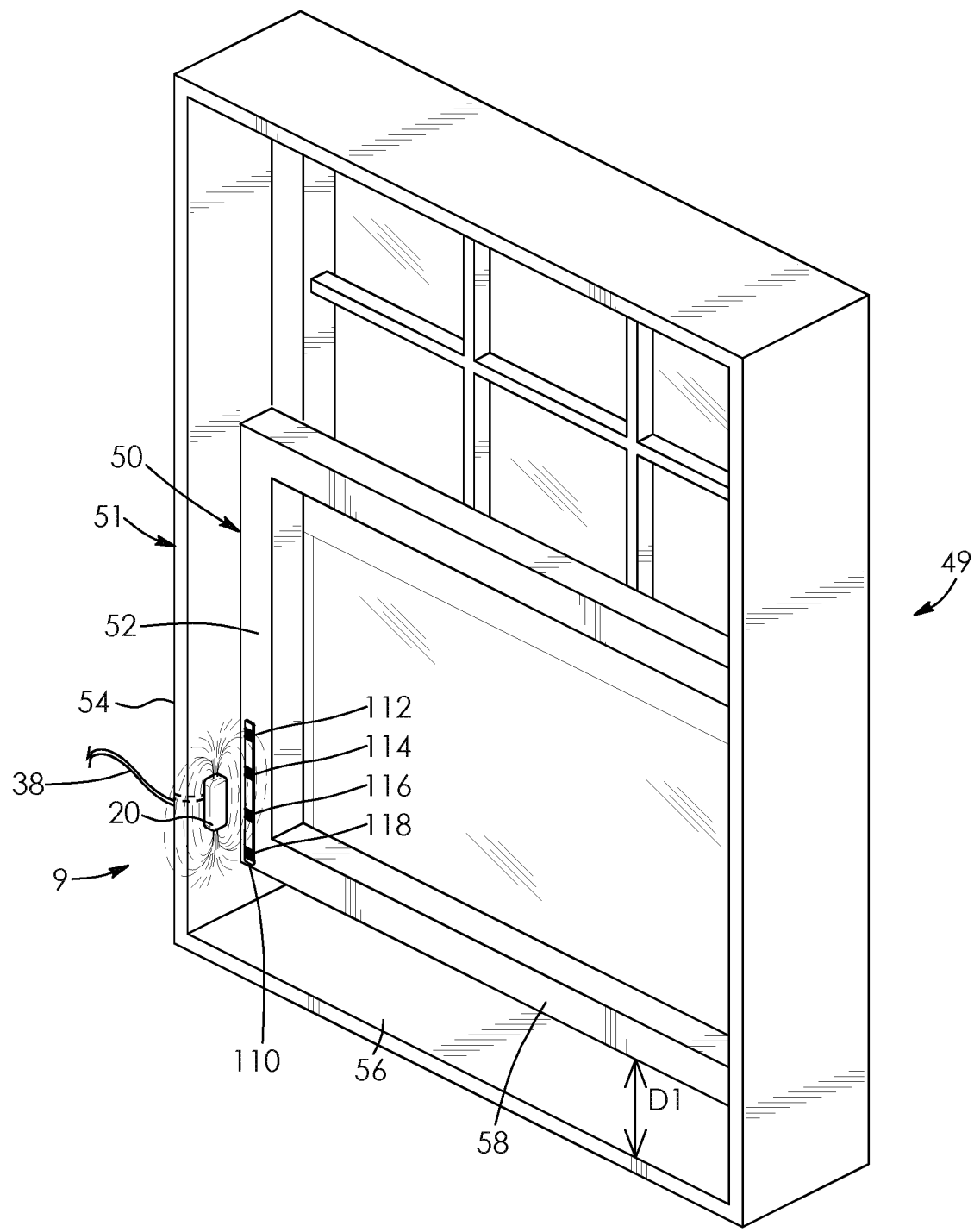
FIG. 13 is a front, top, left side perspective view showing the RFID strip and the sensor being used as the window sensor in the fourth configuration of the security alarm system with the window being open distance D1.

However, as show in FIG. 13, the sensor is also no longer able to read the first RFID tag when window 50 is open to threshold distance D1. Sensor 20 is able though to read second RFID tag 114 when the window is open to threshold distance D1 and thus signals to the smartphone 39 and/or control panel 40 seen in FIG. 1 that the window is open to threshold distance D1. Referring back to FIG. 13, it is desirable to allow window 50 to be partially opened for ventilation but not opened enough to allow an intruder to enter through the window. Sensor 20 will accordingly not trigger an alarm as the sensor is able to read second RFID tag 114 and determine that the window is open up to threshold distance D1.

Figure 14:
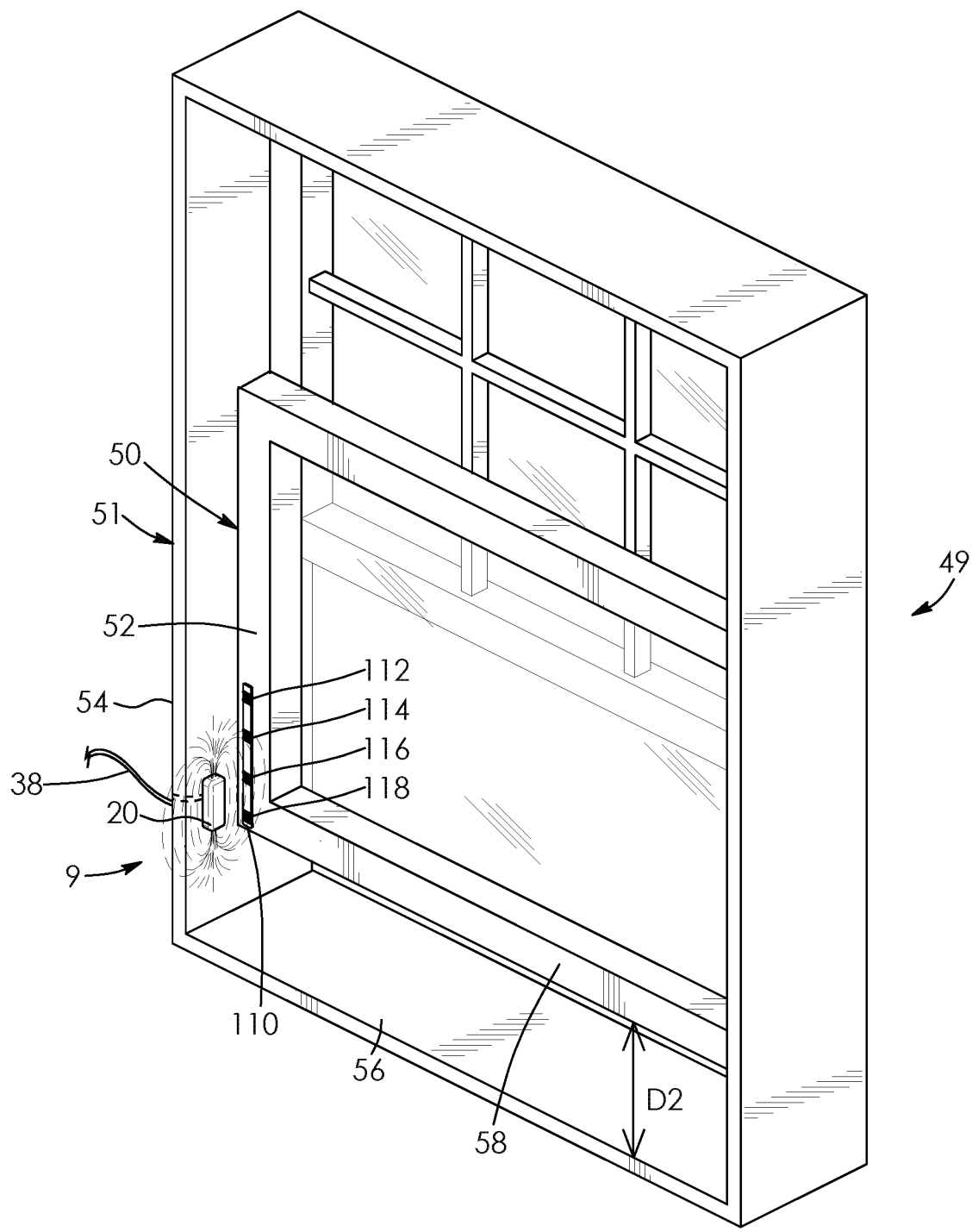
FIG. 14 is a front, top, left side perspective view showing the RFID strip and the sensor being used as the window sensor in the fourth configuration of the security alarm system with the window being open distance D2.
Figure 15:
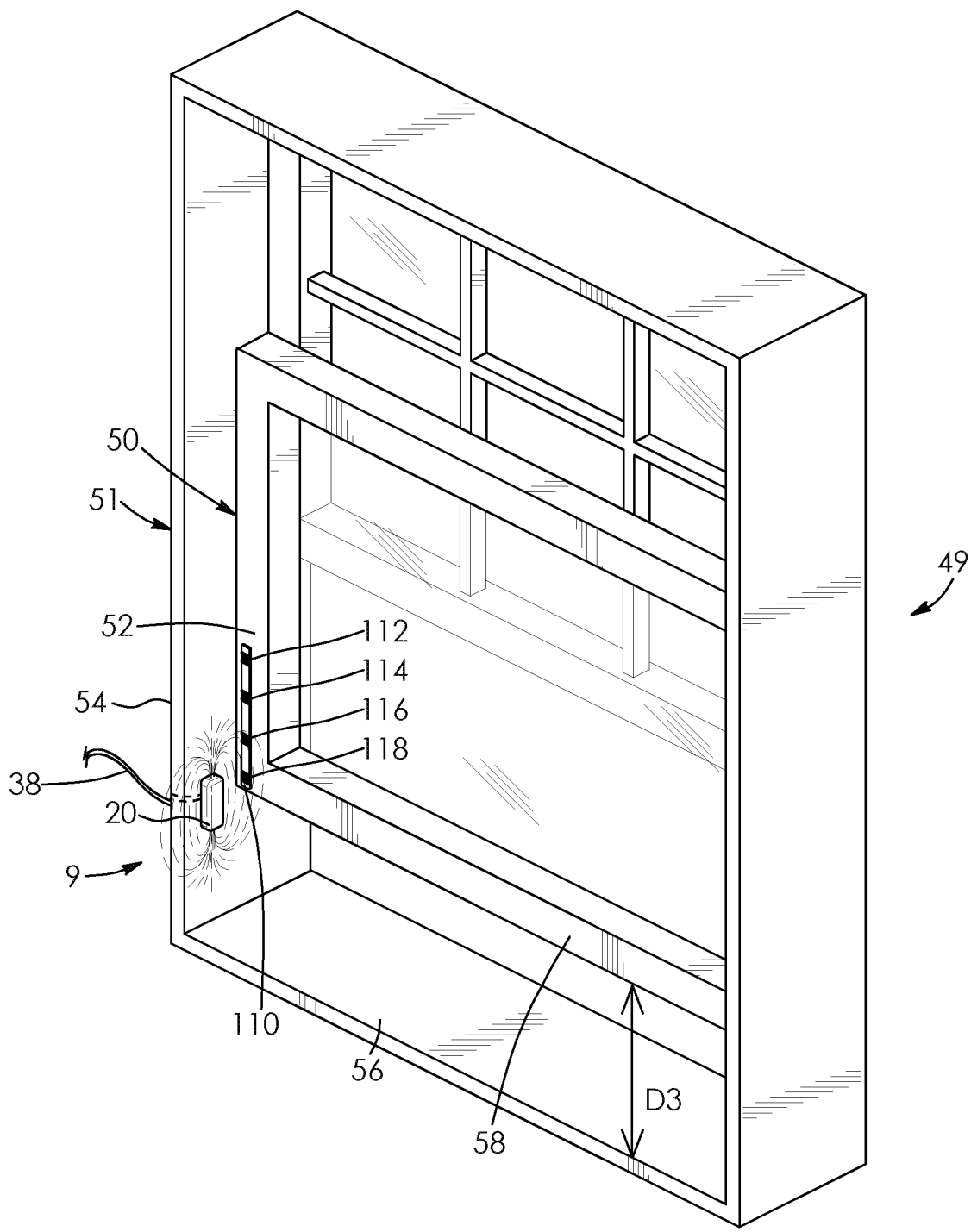
FIG. 15 is a front, top, left side perspective view showing the RFID strip and sensor being used as the window sensor in the fourth configuration of the security alarm system with the window being open distance D3.

Referring now to FIGS. 14 and 15, when window 50 is open to distance D2 or distance D3, which is greater than threshold distance D1, the sensor is no longer able to read the second RFID tag. Because distance D2 is greater than threshold distance D1, the sensor sends a signal or notification to smartphone 39 and/or control panel 40 seen in FIG. 1 indicating that the window is open greater than threshold distance D1, and this signal or notification may also trigger an alarm via the smartphone or the control panel.

Alternatively, if the user wants the window to be opened to a greater extent without triggering an alarm, in this case sensor 20, smartphone 39 and/or control panel 40 seen in FIG. 1 may be selectively programmed to only trigger an alarm when the window is open threshold distance D3 seen in FIG. 15, which is greater than distance D2. As a further alternative, the sensor, smartphone and/or control panel seen in FIG. 1 may be selectively programmed to trigger an alarm only when the window is open a distance greater than distance D3 seen in FIG. 15.

Sensor 20 is able to read third RFID tag 116 when window 50 is open to distance D2, as shown in FIG. 14, and thus signals to the smartphone 39 and/or control panel 40 seen in FIG. 1 that the window is open to distance D2. Likewise, as shown in FIG. 15, the sensor is able to read fourth RFID tag 118 when the window is open to distance D3 signals to the smartphone 39 and/or control panel 40 seen in FIG. 1 that the window is open to distance D3. Referring back to FIG. 15, the fourth embodiment of the security alarm system is thereby able to determine how much window 50 is open based on whether sensor 20 is able to read one or more first RFID tag 112, second RFID tag 114, third RFID tag 116, fourth RFID tag 118.

Figure 16:
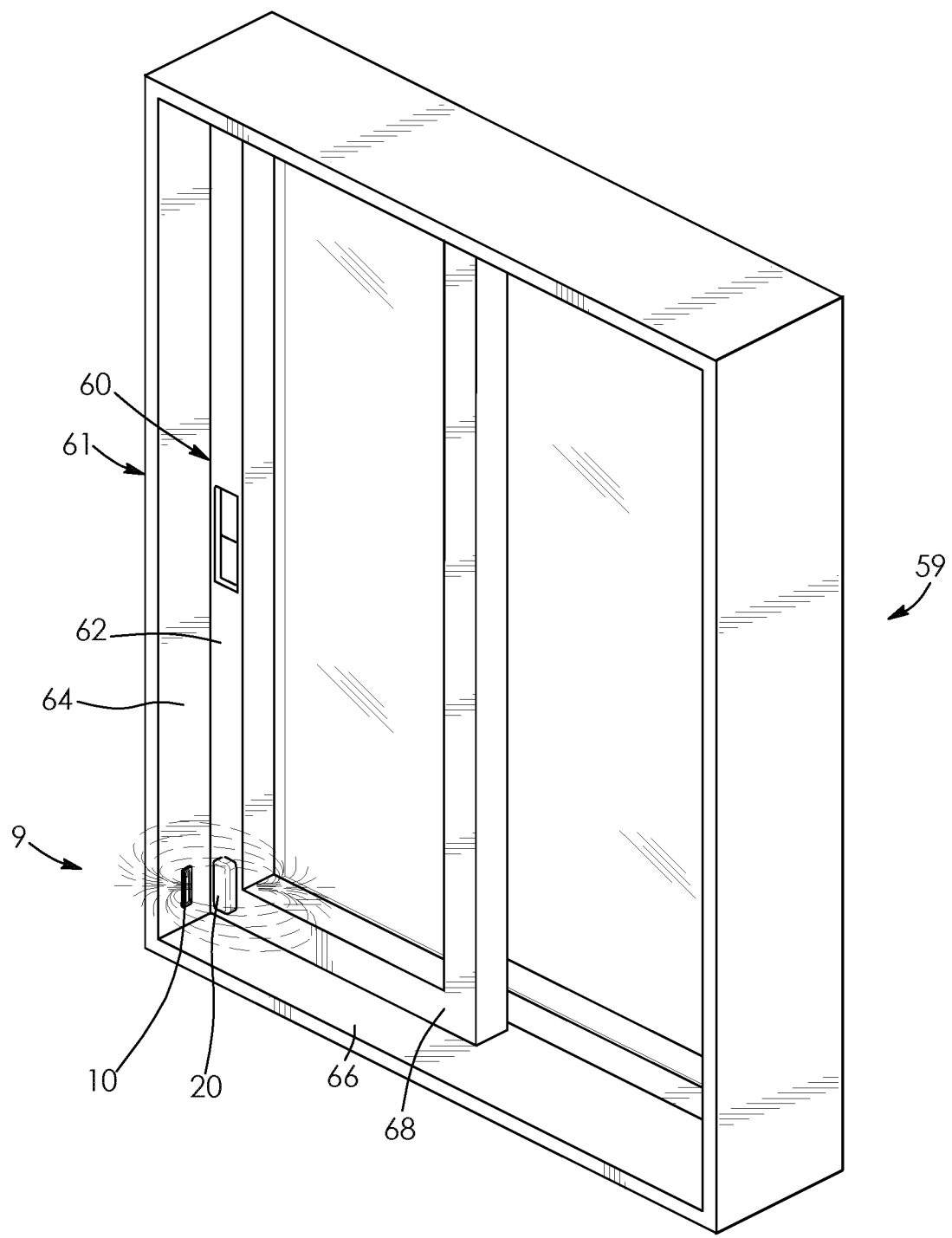
FIG. 16 is a front, top, left side perspective view showing the RFID tag and the sensor being used as a door sensor in a fifth configuration of a security alarm system with the door closed.
Figure 17:
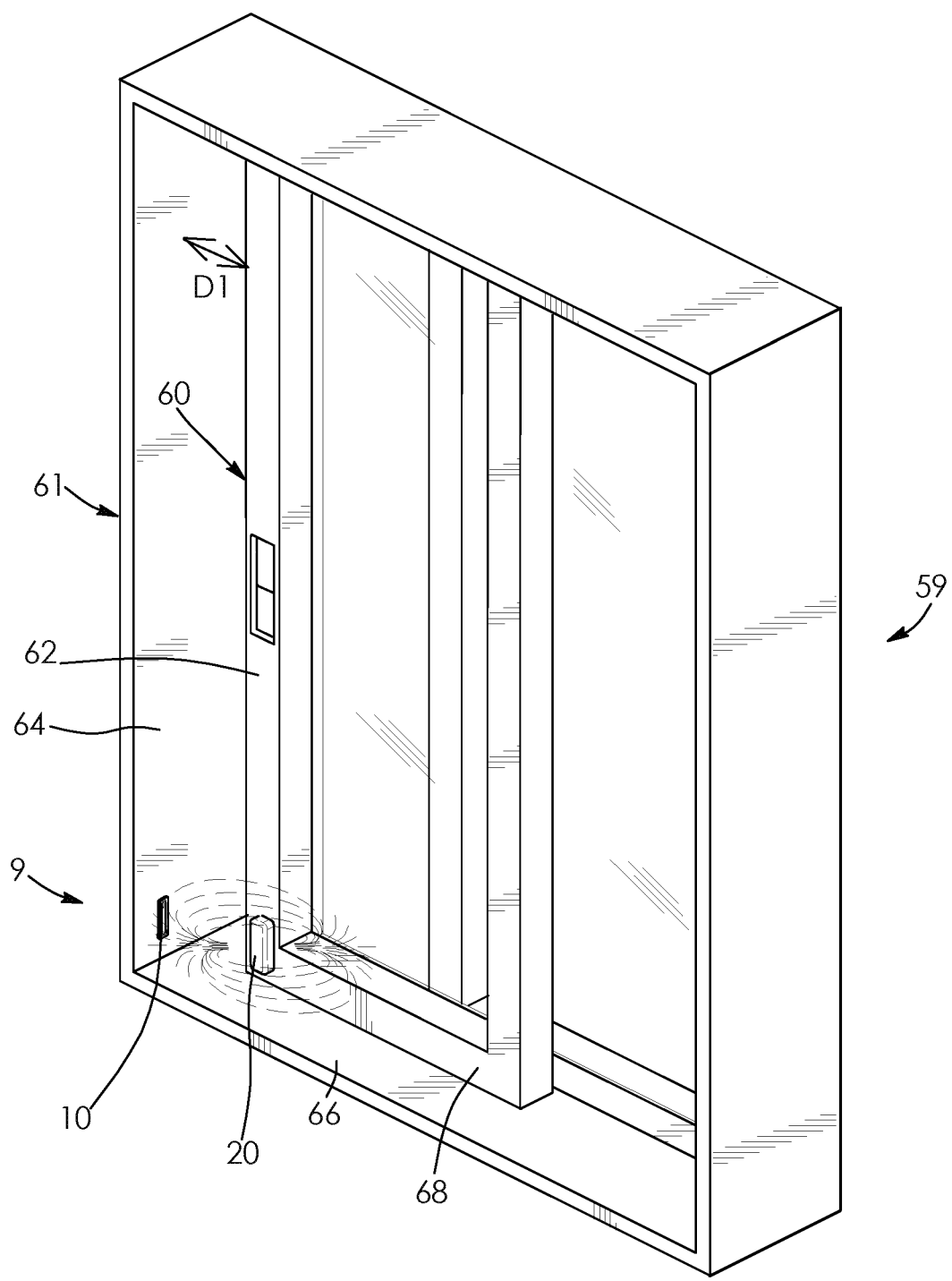
FIG. 17 is a front, top, left side perspective view showing the RFID tag and the sensor being used as the door sensor in the fifth configuration of the security alarm system with the door being open distance D1.
Figure 18:
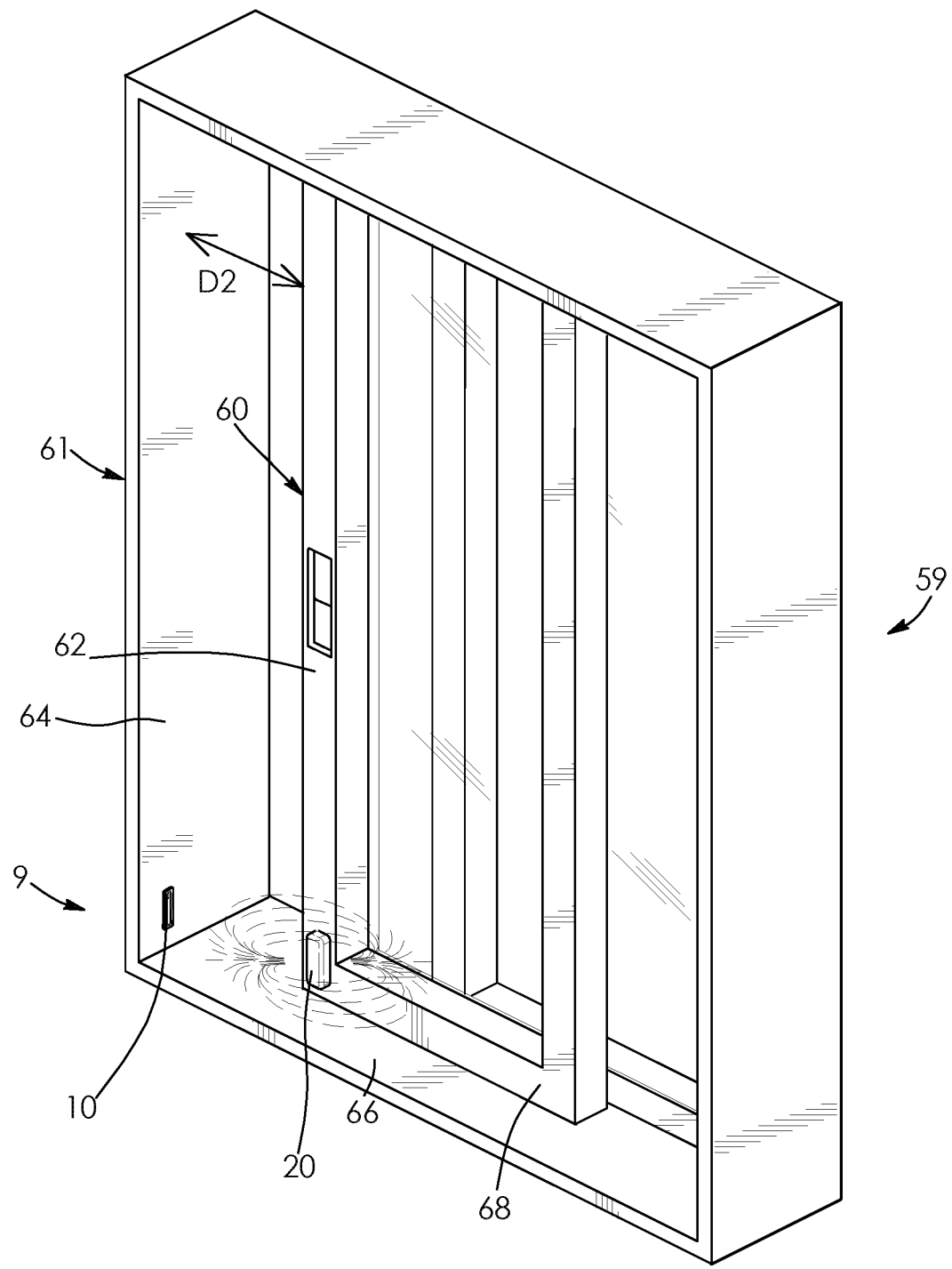
FIG. 18 is a front, top, left side perspective view showing the RFID tag and the sensor being used as the door sensor in the fifth configuration of the security alarm system with the door being open distance D2.

FIGS. 16 to 18 show RFID tag 10 and sensor 20 being used as a door sensor for a door assembly 59 comprising a door 60 and framing 61 thereof, in a fifth configuration of security alarm system 9. The fifth configuration of the security alarm system is a wireless security alarm system in which the sensor is mounted on a stile 62 and bottom rail 68 of the door and the RFID tag is mounted on a side jamb 64 of the framing adjacent a sill 66 of the framing. Door 60 is fully closed in FIG. 16 with the stile of the door abutting the side jamb of framing 61. Sensor 20 is able to read RFID tag 10 when the door is fully closed and thus signals to the smartphone 39 and/or control panel 40 seen in FIG. 1 that the door is closed. Likewise, as shown in FIG. 17, the sensor is also able to read the RFID tag when door 60 is open up to threshold distance D1 and may signal to the smartphone and/or control panel that the door is open up to the threshold distance.

Referring to FIG. 17, it is desirable to allow the door to be partially opened for ventilation but not opened enough to allow an intruder to enter through the door. Sensor 20 will accordingly not trigger an alarm when the sensor is able to read RFID tag 10. However, and with reference to FIG. 18, when door 60 is open to distance D2, which is greater than threshold distance D1, the sensor is no longer able to read the RFID tag. In this case sensor 20 sends a signal or notification to smartphone 39 and/or control panel 40 seen in FIG. 1 indicating that the door is open greater than threshold distance D1, and this signal or notification may also trigger an alarm via the smartphone or the control panel.

Referring back to FIG. 18, sensor 20 may be mounted to bottom rail 68 of the door 60 in other configurations.

Figure 19:
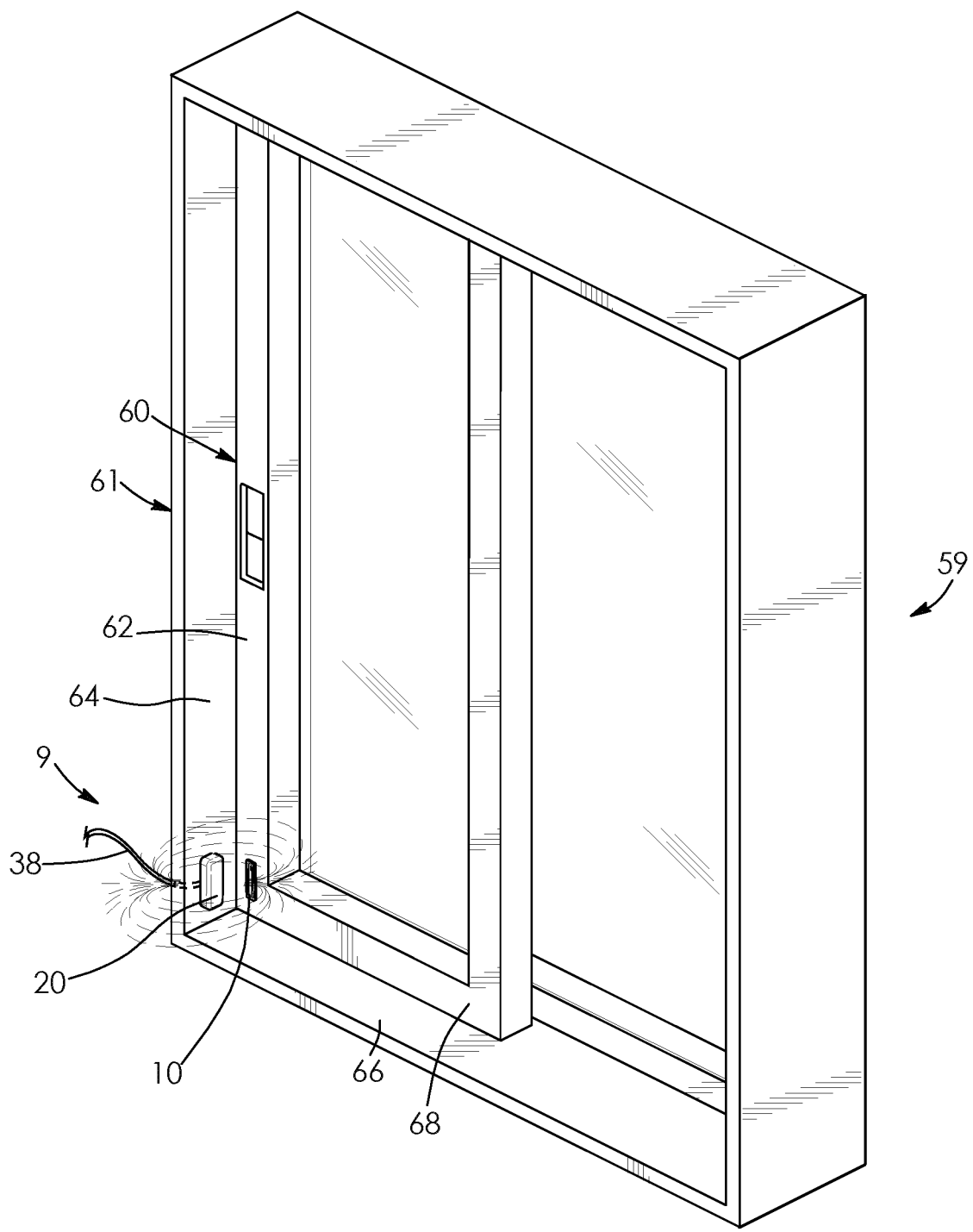
FIG. 19 is a front, top, left side perspective view showing the RFID tag and the sensor being used as the door sensor in a sixth configuration of a security alarm system with the door closed.
Figure 20:
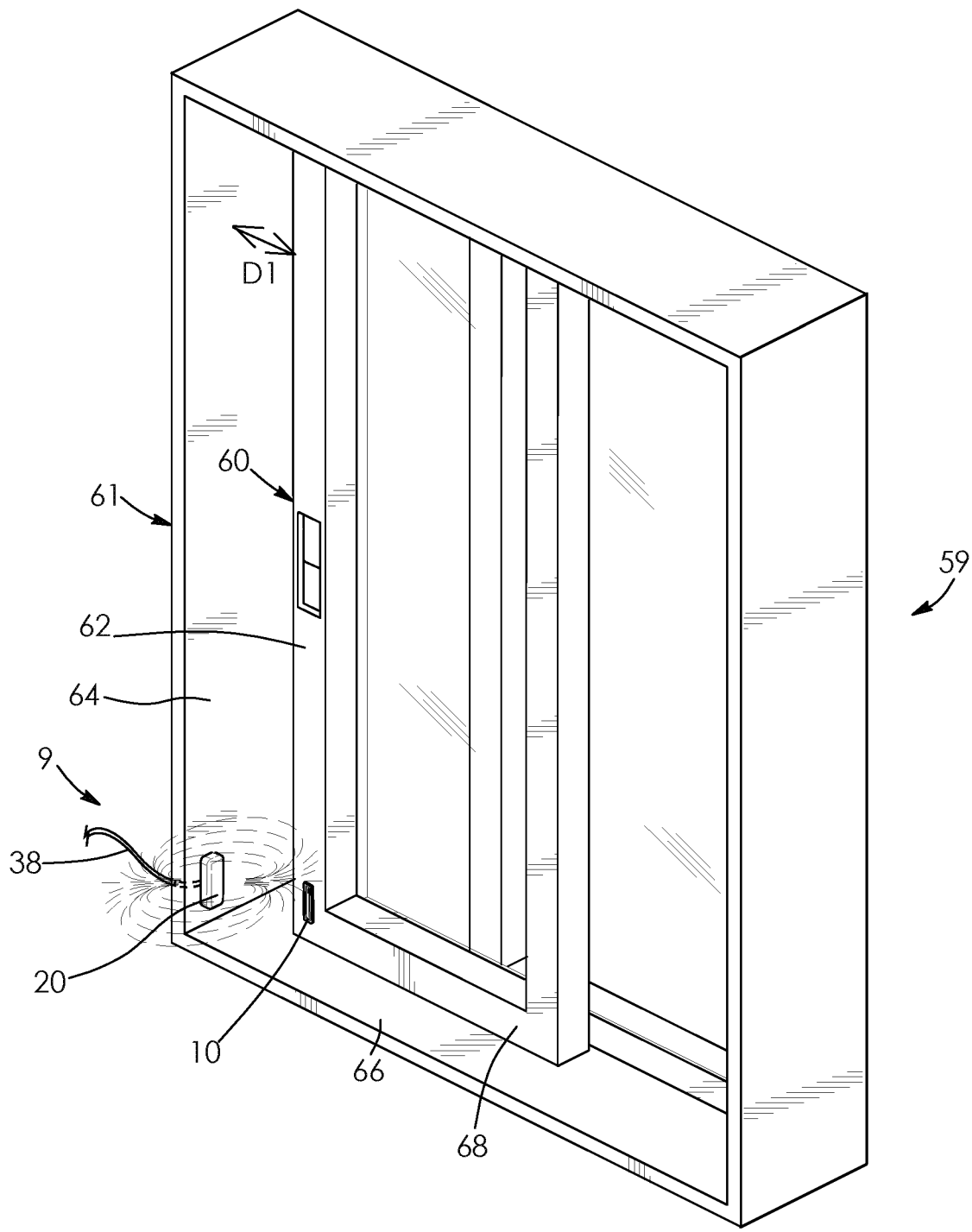
FIG. 20 is a front, top, left side perspective view showing the RFID tag and the sensor being used as the door sensor in the sixth configuration of the security alarm system with the door being open distance D1.
Figure 21:
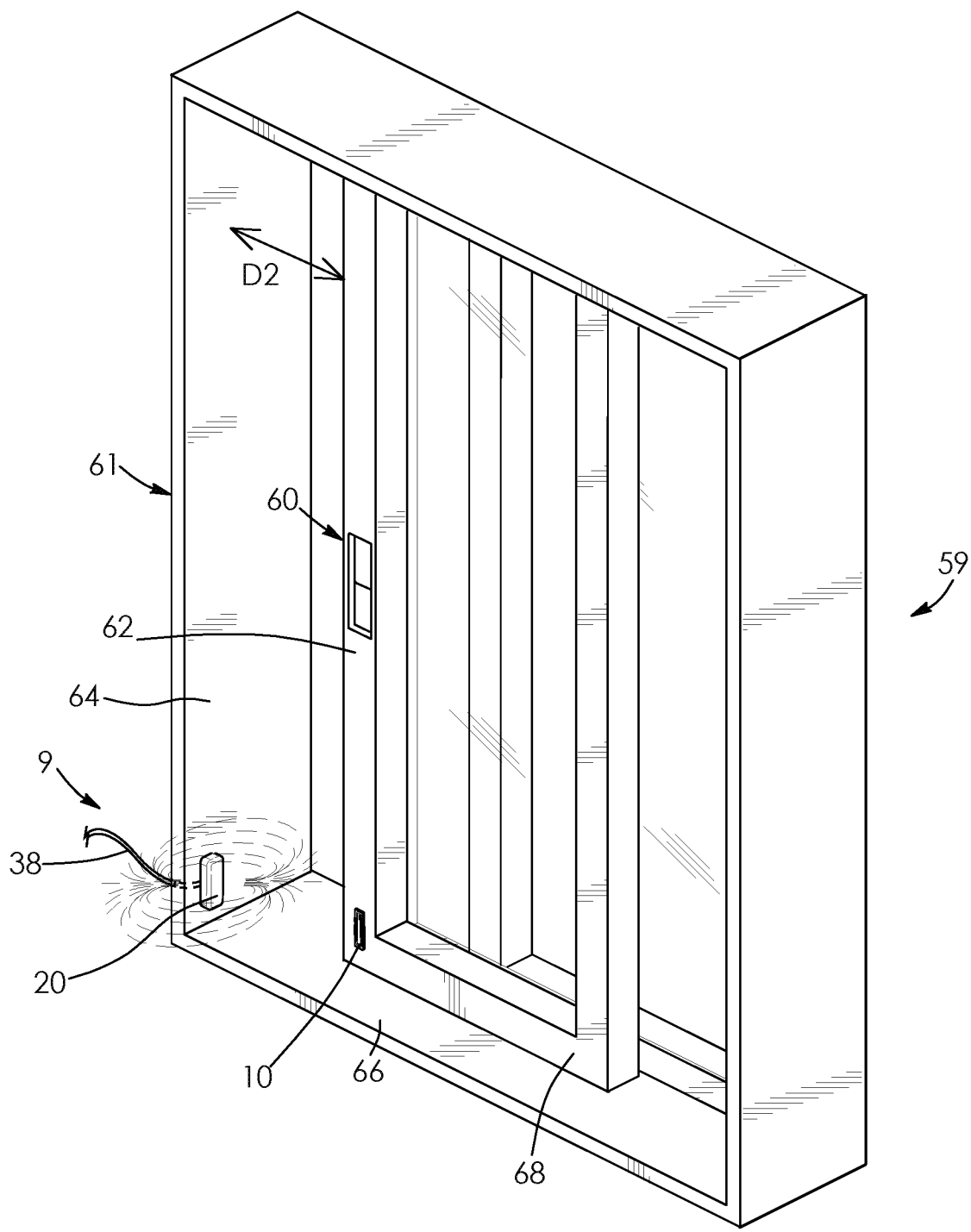
FIG. 21 is a front, top, left side perspective view showing the RFID tag and the sensor being used as the door sensor in the sixth configuration of the security alarm system with the door being open distance D2.
Figure 22:
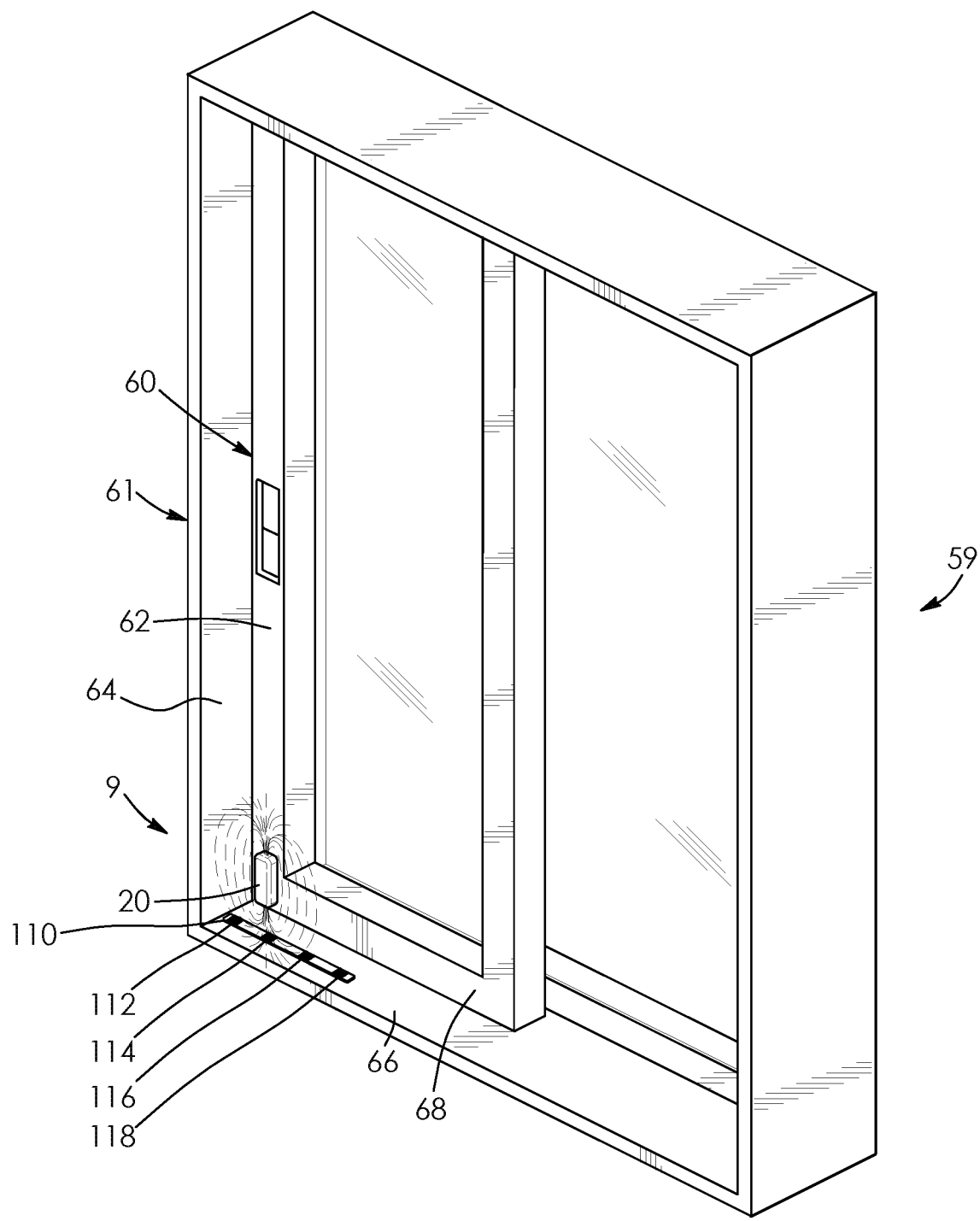
FIG. 22 is a front, top, left side perspective view showing the RFID strip and the sensor being used as a door sensor in a seventh configuration of a security alarm system with the door closed.

FIGS. 19 to 21 show RFID tag 10 and sensor 20 being used as a door sensor for door assembly 59 in a sixth configuration of security alarm system 9. The sixth configuration of the security alarm system is a wired security alarm system in which the RFID tag is mounted on stile 62 and bottom rail 68 of door 60 and the sensor is mounted on side jamb 64 of framing 61 adjacent sill 66 of the framing. This allows sensor 20 to be wired in the sixth configuration of the security alarm system. Door 60 is fully closed in FIG. 19 with the stile of the door abutting side jamb 64 of framing 61. Sensor 20 is able to read RFID tag 10 when the door is fully closed and thus signals to the smartphone 39 and/or control panel 40 seen in FIG. 1 that the door is closed. Likewise, as shown in FIG. 20, the sensor is able to read the RFID tag when door 60 is open up to threshold distance D1 and may signal to the smartphone and/or control panel that the door is open up to the threshold distance.

It is desirable to allow the door to be partially opened for ventilation but not opened enough to allow an intruder to enter through the door. Sensor 20 will accordingly not trigger an alarm when the sensor is able to read RFID tag 10. However, and with reference to FIG. 21, when door 60 is open to distance D2, which is greater than threshold distance D1, the door is no longer able to read the RFID tag. In this case sensor 20 sends a signal or notification to smartphone 39 and/or control panel 40 seen in FIG. 1 indicating that the window is open greater than threshold distance D1, and this signal or notification may also trigger an alarm via the smartphone or the control panel.

FIGS. 22 to 25 show substrate strip 110 and sensor 20 being used as a door sensor for door assembly 59 in a seventh configuration of security alarm system 9. The seventh configuration of the security alarm system is a wireless security alarm system in which the sensor is mounted on both stile 62 and bottom rail 68 of door 60. The substrate strip is mounted on sill 66 of framing 61 and in part adjacent to side jamb 64 of the framing. Door 60 is fully closed in FIG. 22 with the stile of the door abutting side jamb 64 of the framing. Sensor 20 is able to read first RFID tag 112 when the door is fully closed and thus signals to the smartphone 39 and/or control panel 40 seen in FIG. 1 that the door is closed.

Figure 23:
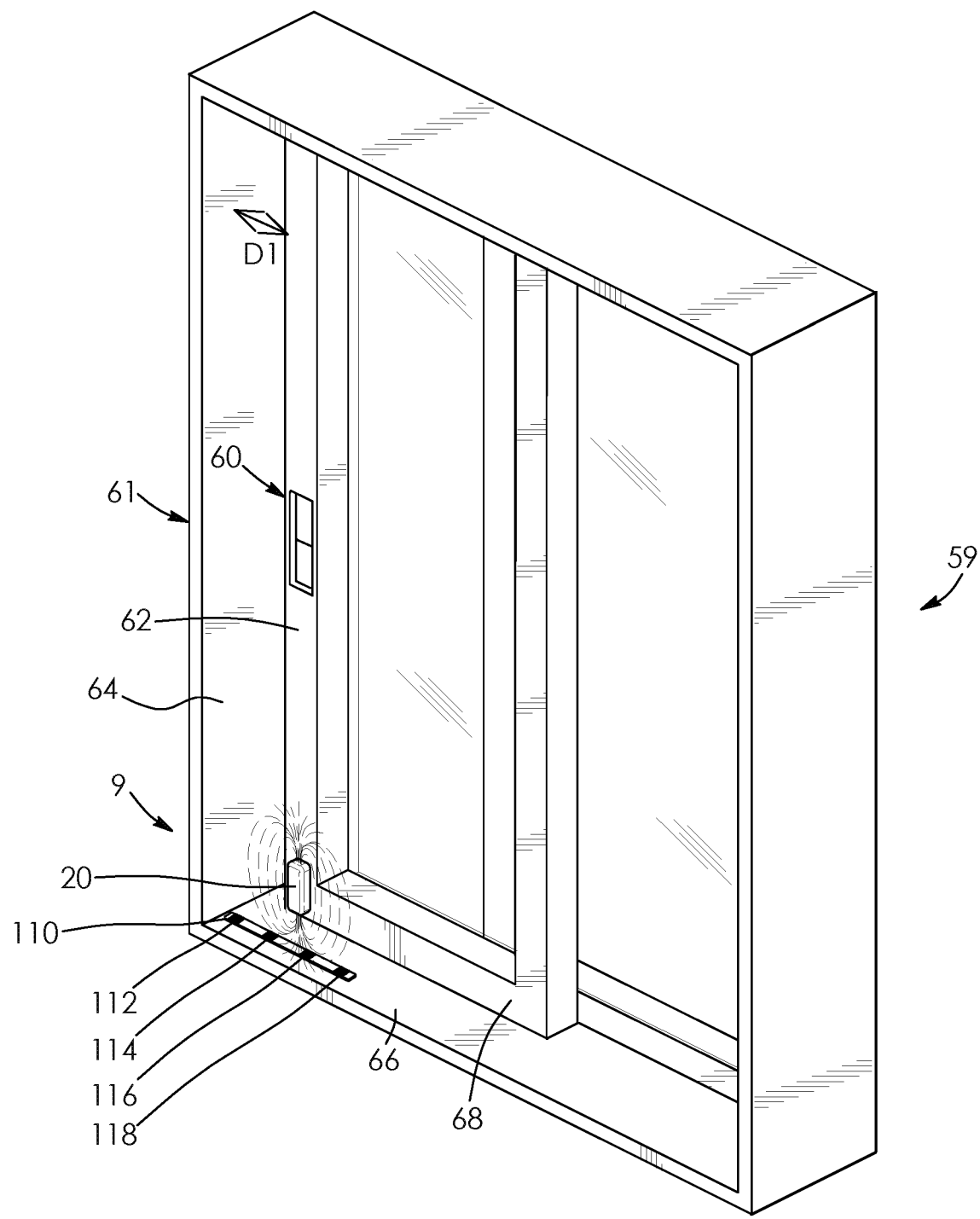
FIG. 23 is a front, top, left side perspective view showing the RFID strip and the sensor being used as the door sensor in the seventh configuration of the security alarm system with the door being open distance D1.

However, as shown in FIG. 23, the sensor is no longer able to read first RFID tag 112 when door 60 is open to threshold distance D1. Sensor 20 is able though to read second RFID tag 114 when the door is open to threshold distance D1 and thus signals to the smartphone 39 and/or control panel 40 seen in FIG. 1 that the door is open to threshold distance D1. Referring back to FIG. 23, it is desirable to allow door 60 to be partially opened for ventilation but not opened enough to allow an intruder to enter through the door. Sensor 20 will accordingly not trigger an alarm as the sensor is able to read second RFID tag 114 and determine that the door is open up to threshold distance D1.

Figure 24:
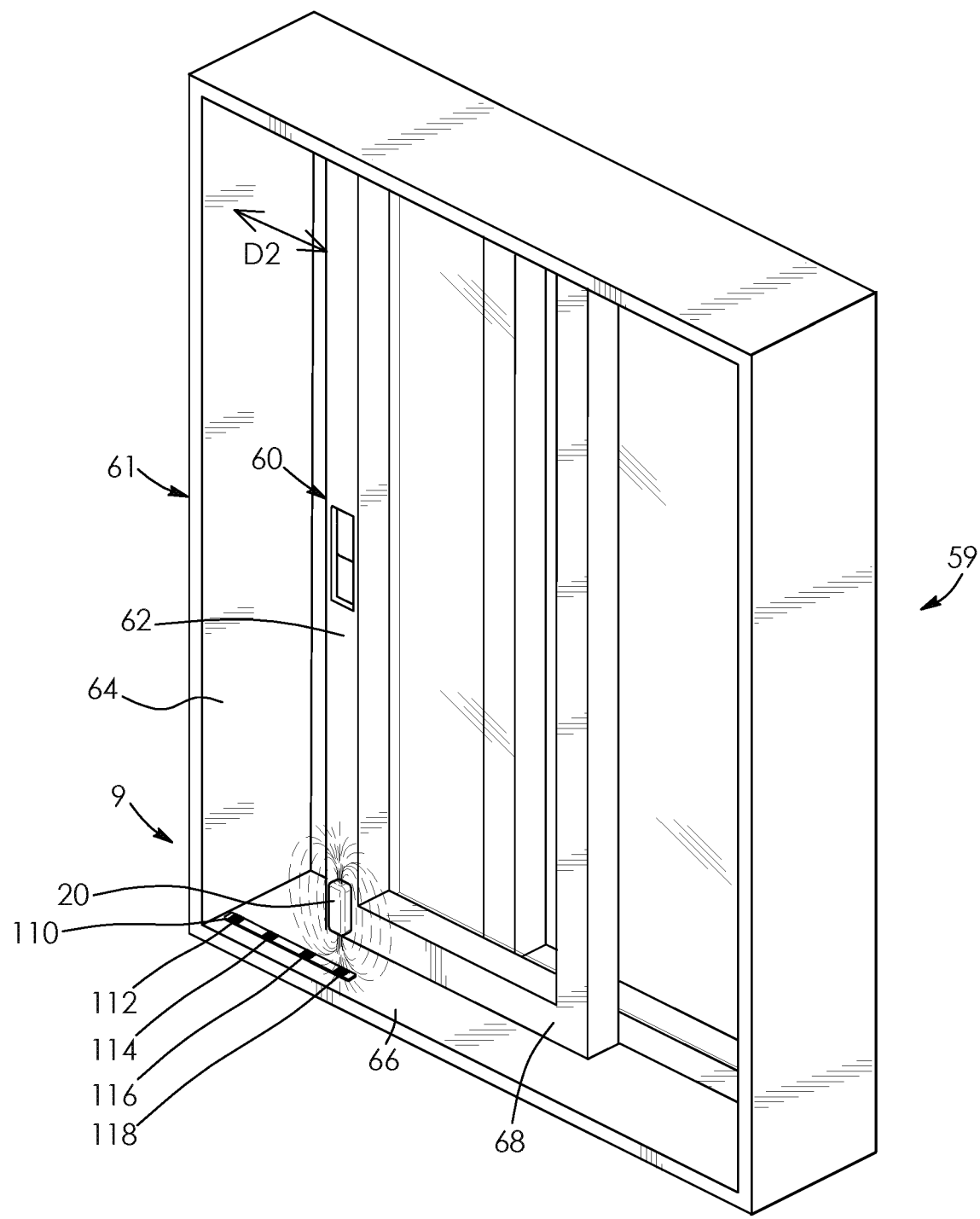
FIG. 24 is a front, top, left side perspective view showing the RFID strip and the sensor being used as the door sensor in the seventh configuration of the security alarm system with the door being open distance D2.
Figure 25:
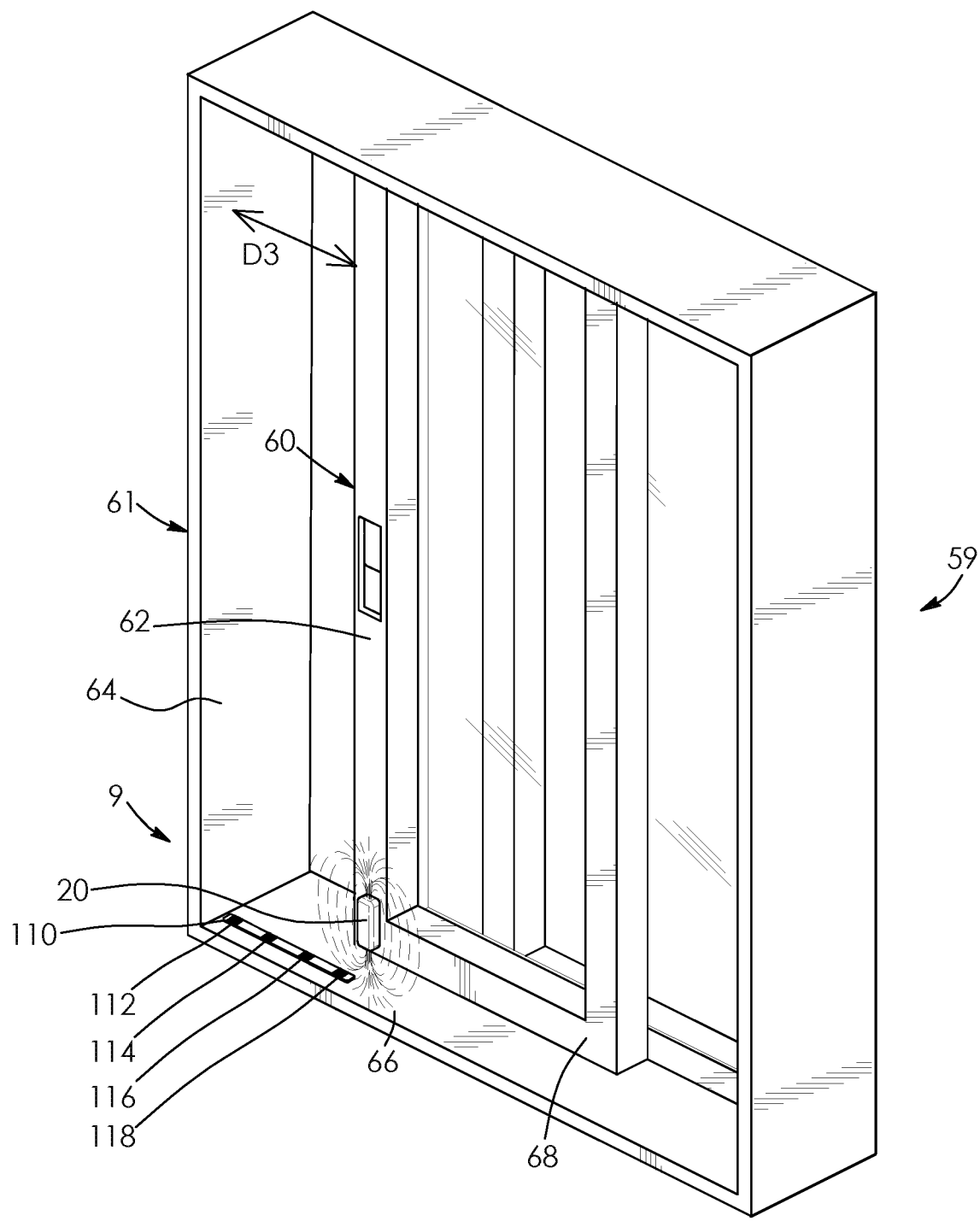
FIG. 25 is a front, top, left side perspective view showing the RFID strip and the sensor being used as the door sensor in the seventh configuration of the security alarm system with the door being open distance D3.
Figure 26:
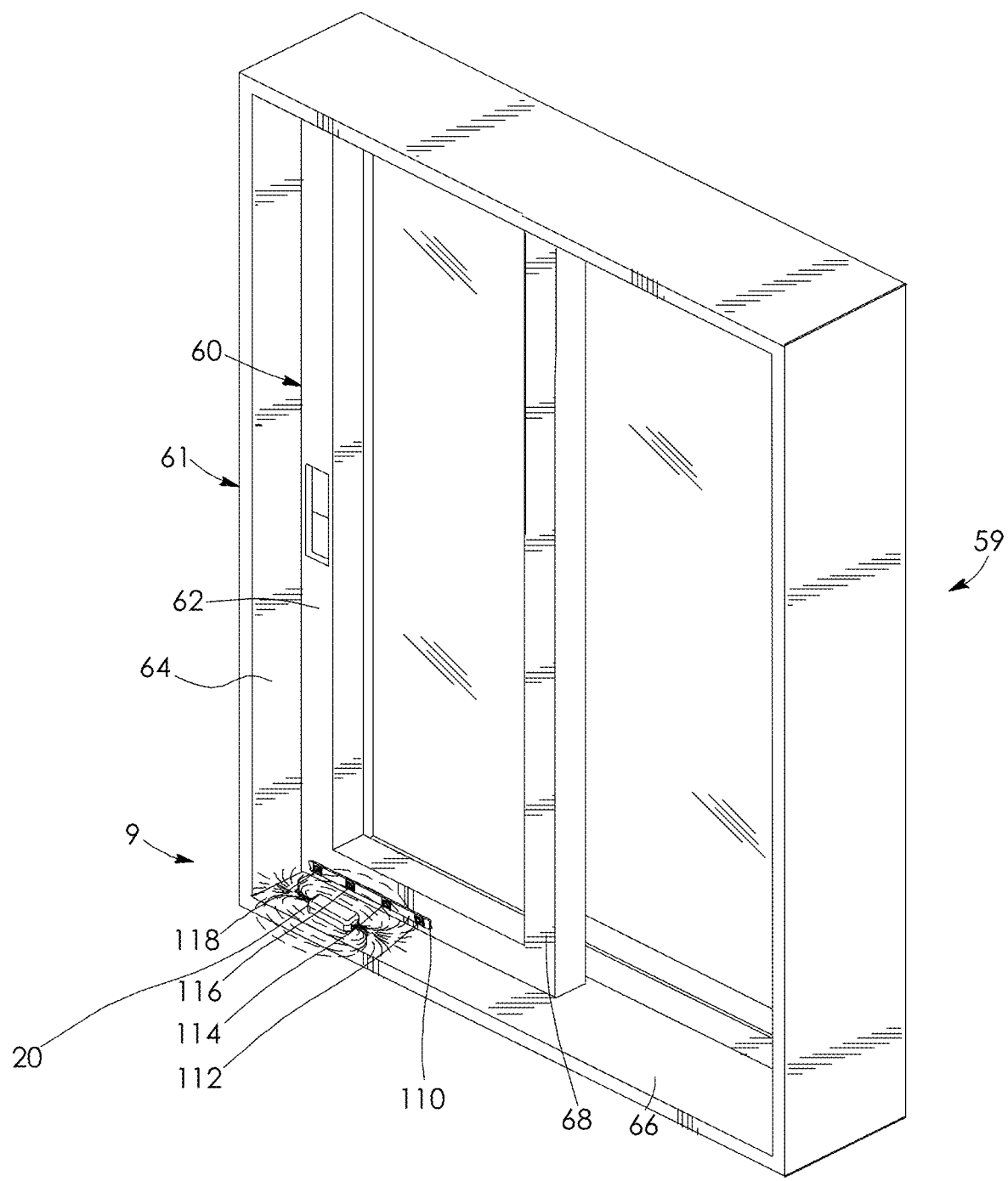
FIG. 26 is a front, top, left side perspective view showing the RFID strip and the sensor being used as a door sensor in an eighth configuration of a security alarm system with the door closed.

Referring now to FIGS. 24 and 25, when door 60 is open to distance D2 or distance D3, which is greater than threshold distance D1, the sensor is no longer able to read second RFID tag 114. Because distance D2 or distance D3 is greater than threshold distance D1, sensor 20 sends a signal or notification to smartphone 39 and/or control panel 40 seen in FIG. 1 indicating that the window is open greater than threshold distance D1, and this signal or notification may also trigger an alarm via the smartphone or the control panel.

Alternatively, if the user wants the window to be opened to a greater extent without triggering an alarm, in this case sensor 20, smartphone 39 and/or control panel 40 seen in FIG. 1 may be selectively programmed to only trigger an alarm when the window is open threshold distance D3 seen in FIG. 25, which is greater than distance D2. As a further alternative, the sensor, smartphone and/or control panel seen in FIG. 1 may be selectively programmed to trigger an alarm only when the window is open a distance greater than distance D3 seen in FIG. 25.

Sensor 20 is able to read third RFID tag 116 when the door is open to distance D2, as shown in FIG. 24, and thus signals to the smartphone 39 and/or control panel 40 seen in FIG. 1 that the door is open to distance D2. Likewise, as shown in FIG. 25, the sensor is able to read fourth RFID tag 118 when door 60 is open to distance D3 signals to the smartphone 39 and/or control panel 40 seen in FIG. 1 that the door is open to distance D3. Referring back to FIG. 25, the seventh embodiment of the security alarm system is thereby able to determine how much the door is open based on whether the sensor is able to read one or more of first RFID tag 112, second RFID tag 114, third RFID tag 116, fourth RFID tag 118.

FIGS. 26 to 29 show substrate strip 110 and sensor 20 being used as a door sensor for door assembly 59 in an eighth configuration of security alarm system 9. The eighth configuration of the security alarm system is a wired security alarm system in which the sensor is mounted on sill 66 of framing 61, with the sensor in this example being near and spaced to the right of side jamb 64 of the framing from the perspective of FIG. 26. Substrate strip 110 is mounted on bottom rail 68 of door 60 and in part adjacent to stile 62 of the door. This allows sensor 20 to be wired in the eighth configuration of the security alarm system. Door 60 is fully closed in FIG. 26 with stile 62 of the door abutting side jamb 64 of framing 61. Sensor 20 is able to read first RFID tag 112 when the door is fully closed and thus signals to the smartphone 39 and/or control panel 40 seen in FIG. 1 that the door is closed.

Figure 27:
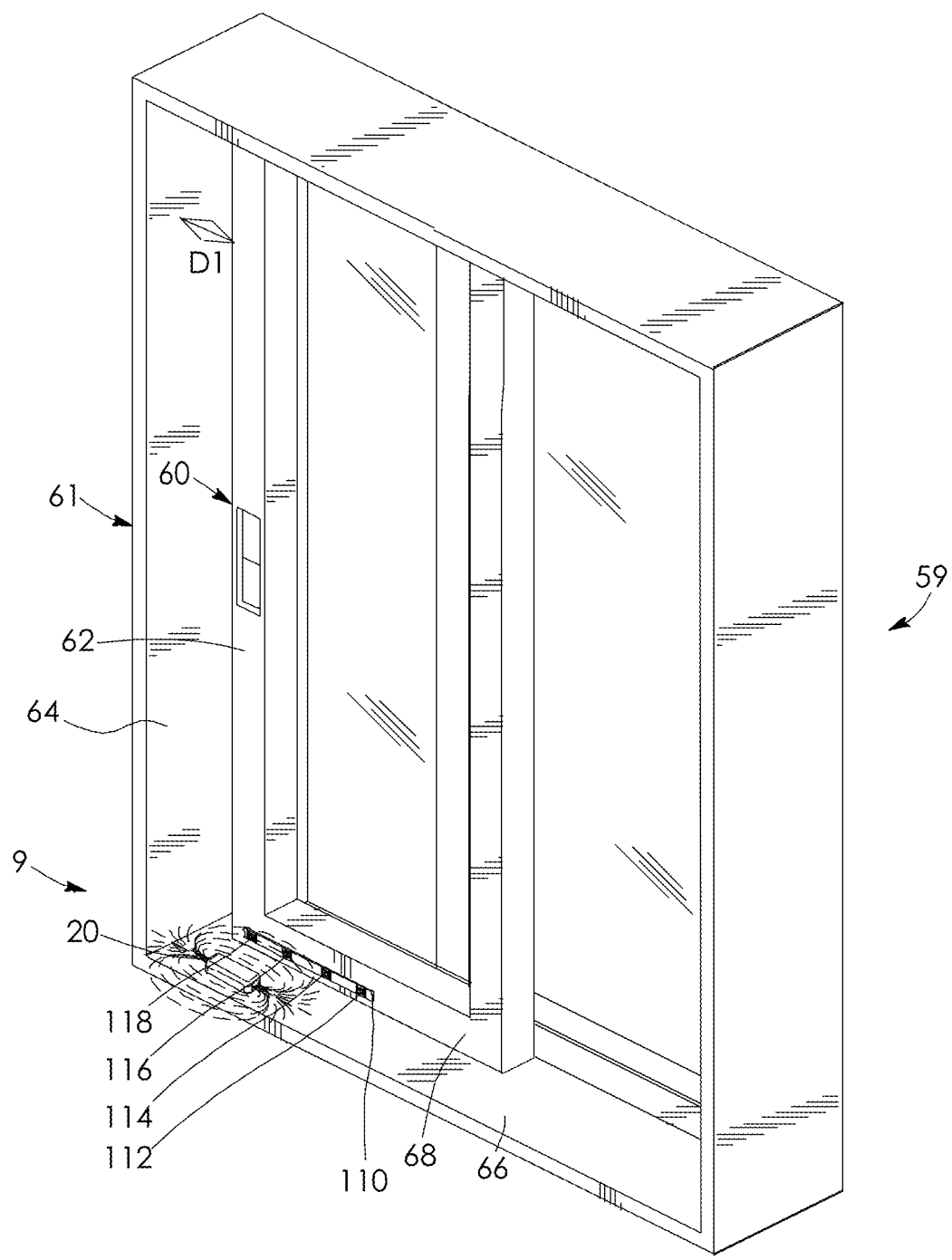
FIG. 27 is a front, top, left side perspective view showing the RFID strip and the sensor being used as the door sensor in the eighth configuration of the security alarm system with the door being open distance D1.
Figure 28:
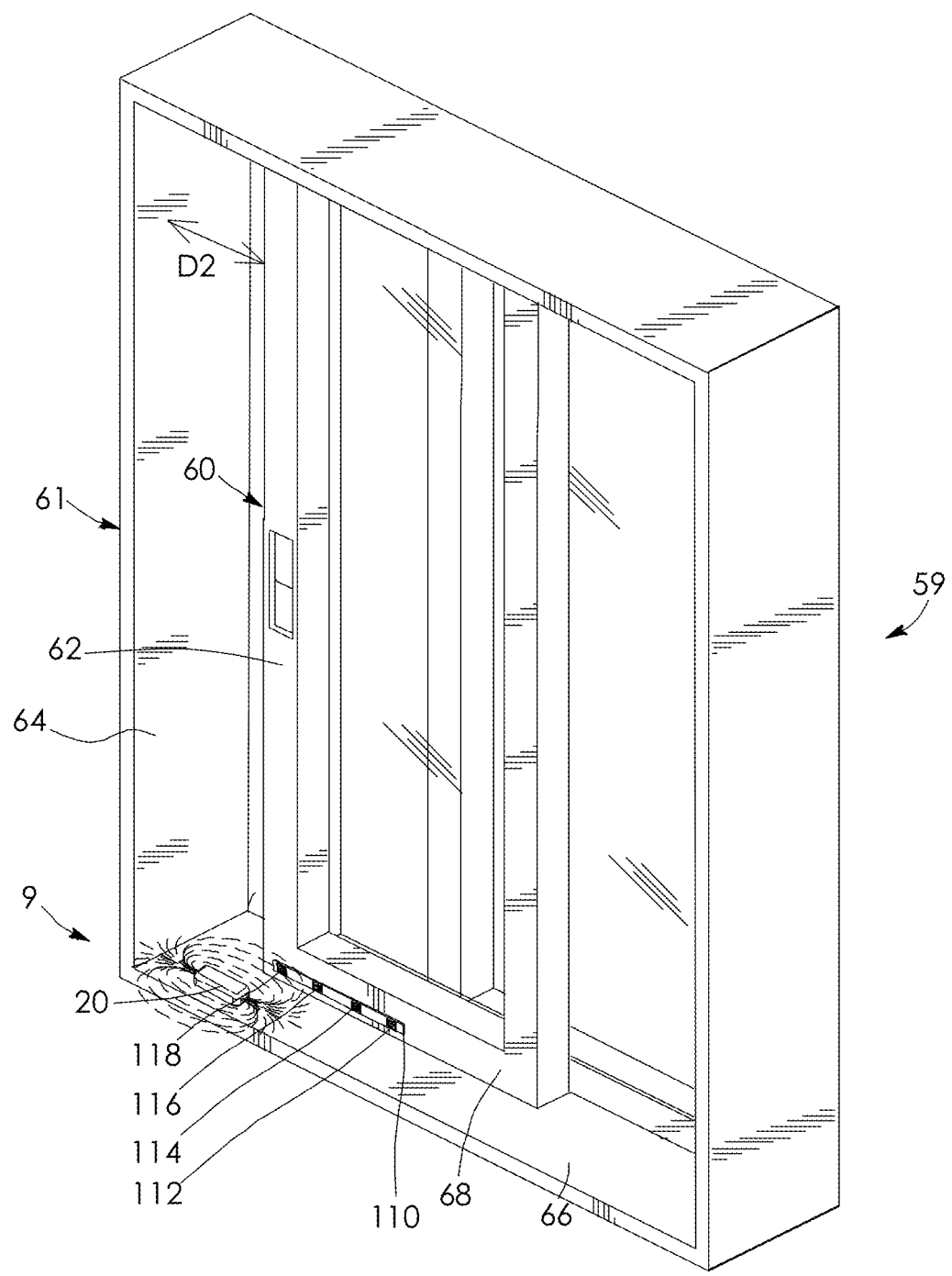
FIG. 28 is a front, top, left side perspective view showing the RFID strip and the sensor being used as the door sensor in the eighth configuration of the security alarm system with the door being open distance D2.
Figure 29:
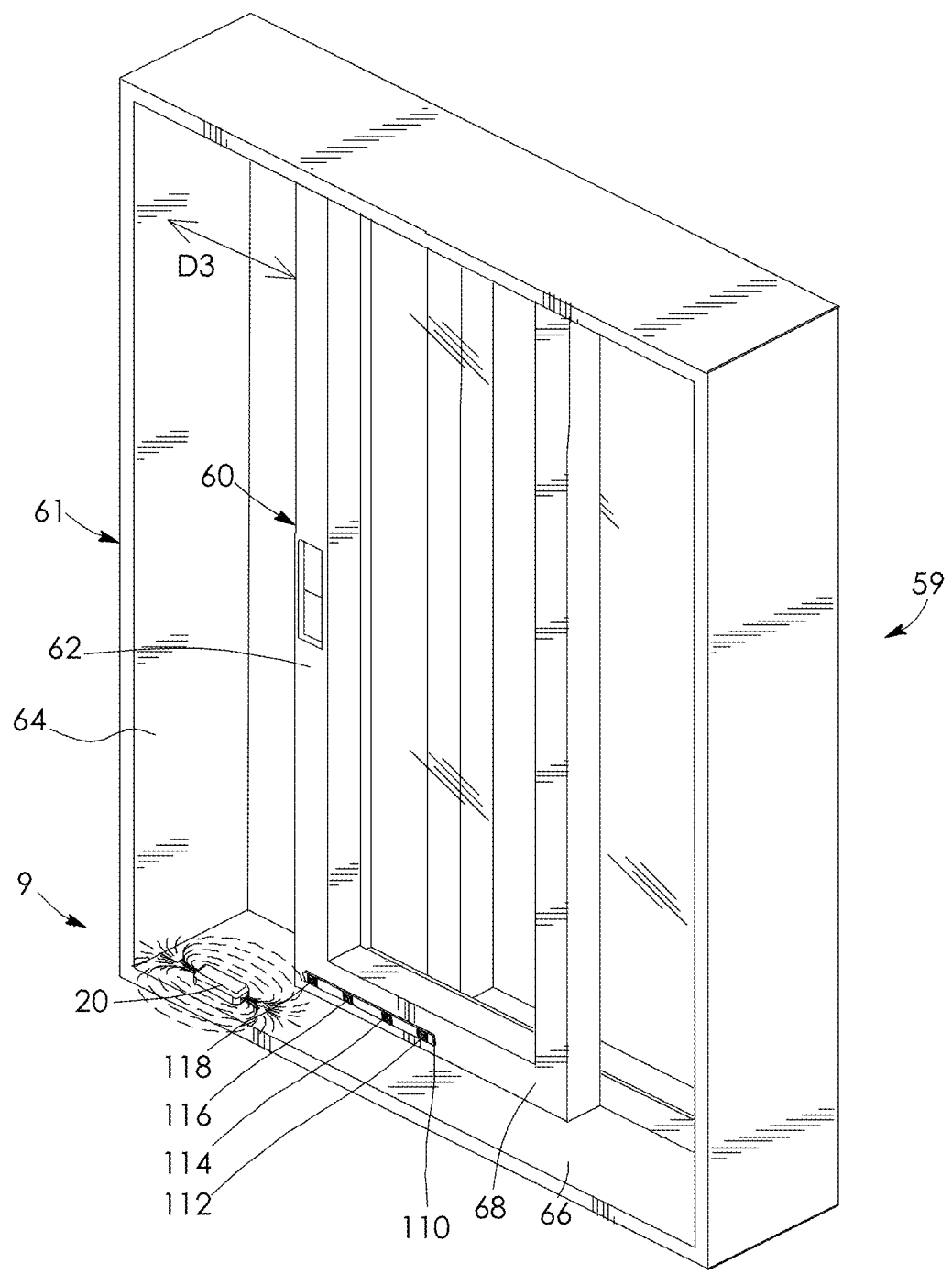
FIG. 29 is a front, top, left side perspective view showing the RFID tag and sensor of FIG. 1 being used as the door sensor in the eighth configuration of the security alarm system with the door being open distance D3.

However, as show in FIG. 27, the sensor is also no longer able to read first RFID tag 112 when door 60 is open to threshold distance D1. Sensor 20 is able though to read second RFID tag 114 when the door is open to threshold distance D1 and thus signals to the smartphone 39 and/or control panel 40 seen in FIG. 1 that the door is open to threshold distance D1. Referring back to FIG. 27, it is desirable to allow door 60 to be partially opened for ventilation but not opened enough to allow an intruder to enter through the door. Sensor 20 will accordingly not trigger an alarm as the sensor is able to read second RFID tag 114 and determine that the door is open up to threshold distance D1. Referring now to FIGS. 28 and 29, when door 60 is open to distance D2 or distance D3, which is greater than threshold distance D1, the sensor is no longer able to read second RFID tag 114. Because distance D2 is greater than threshold distance D1, sensor 20 sends a signal or notification to smartphone 39 and/or control panel 40 seen in FIG. 1 indicating that the window is open greater than threshold distance D1, and this signal or notification may also trigger an alarm via the smartphone or the control panel.

Alternatively, if the user wants the window to be opened to a greater extent without triggering an alarm, in this case the sensor, smartphone 39 and/or control panel 40 seen in FIG. 1 may be selectively programmed to only trigger an alarm when the window is open threshold distance D3 seen in FIG. 29, which is greater than distance D2. As a further alternative, the sensor, smartphone and/or control panel seen in FIG. 1 may be selectively programmed to trigger an alarm only when the window is open a distance greater than distance D3 seen in FIG. 29.

Sensor 20 is able to read third RFID tag 116 when the door is open to distance D2, as shown in FIG. 28, and thus signals to the smartphone 39 and/or control panel 40 seen in FIG. 1 that the door is open to distance D2. Likewise, as shown in FIG. 29, the sensor is able to read fourth RFID tag 118 when door 60 is open to distance D3 signals to the smartphone 39 and/or control panel 40 seen in FIG. 1 that the door is open to distance D3. Referring back to FIG. 28, the eighth embodiment of the security alarm system is thereby able to determine how much the door is open based on whether the sensor is able to read one or more of first RFID tag 112, second RFID tag 114, third RFID tag 116, fourth RFID tag 118.

It will be understood by a person skilled in the art that, although the embodiments of the security alarm system shown in FIGS. 8 to 15 and 22 to 29 employ a strip with a plurality of RFID tags, in other embodiments of the security alarm system an elongate RFID tag with a plurality of subsections may be employed to determine how much the window or door is open.

Figure 30:
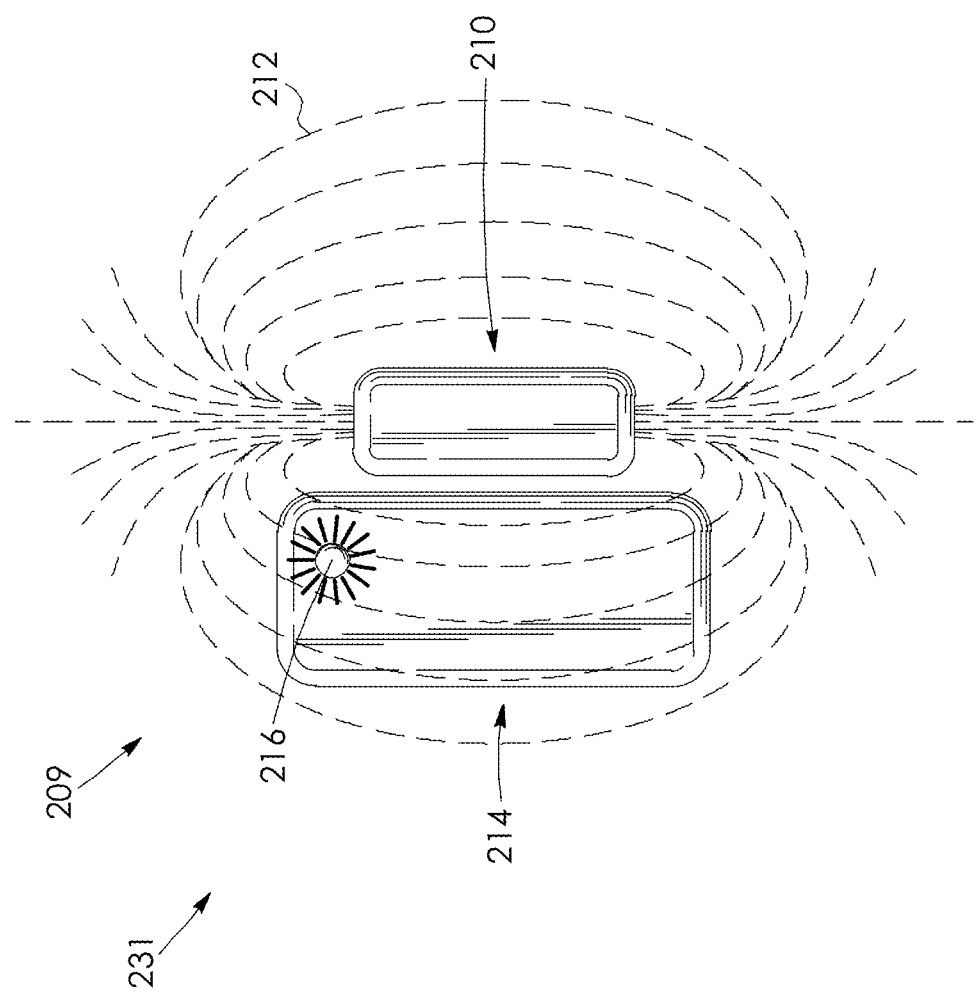
Figure 33:
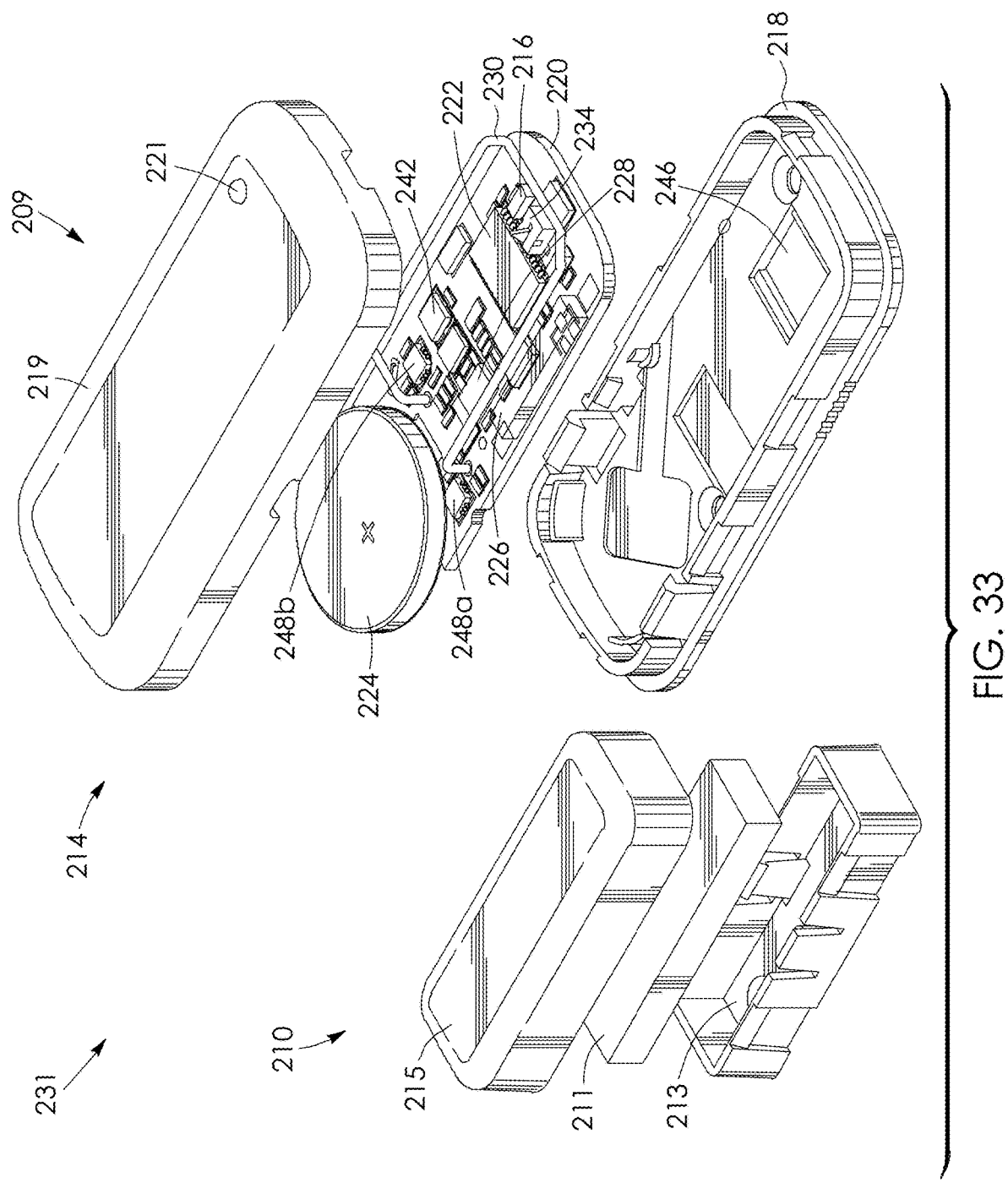
FIG. 33 is an exploded, front, bottom, right side perspective view of the magnetic field sensor and magnet of FIG. 30.

Referring to the drawings and first to FIGS. 30 to 37, there is a provided a security alarm system 231 according to another aspect. As seen in FIG. 33, the security alarm system includes a sensor assembly 209 with a first subassembly, in this embodiment in the form of a magnet 210. The sensor assembly includes a second subassembly, in this embodiment a sensor, in this example a magnetic field sensor 214. As seen in FIG. 30, a field, in this example a magnetic field 212, is generated by magnet 210 and the magnetic field is sensed by the magnetic field sensor.

Figure 31:
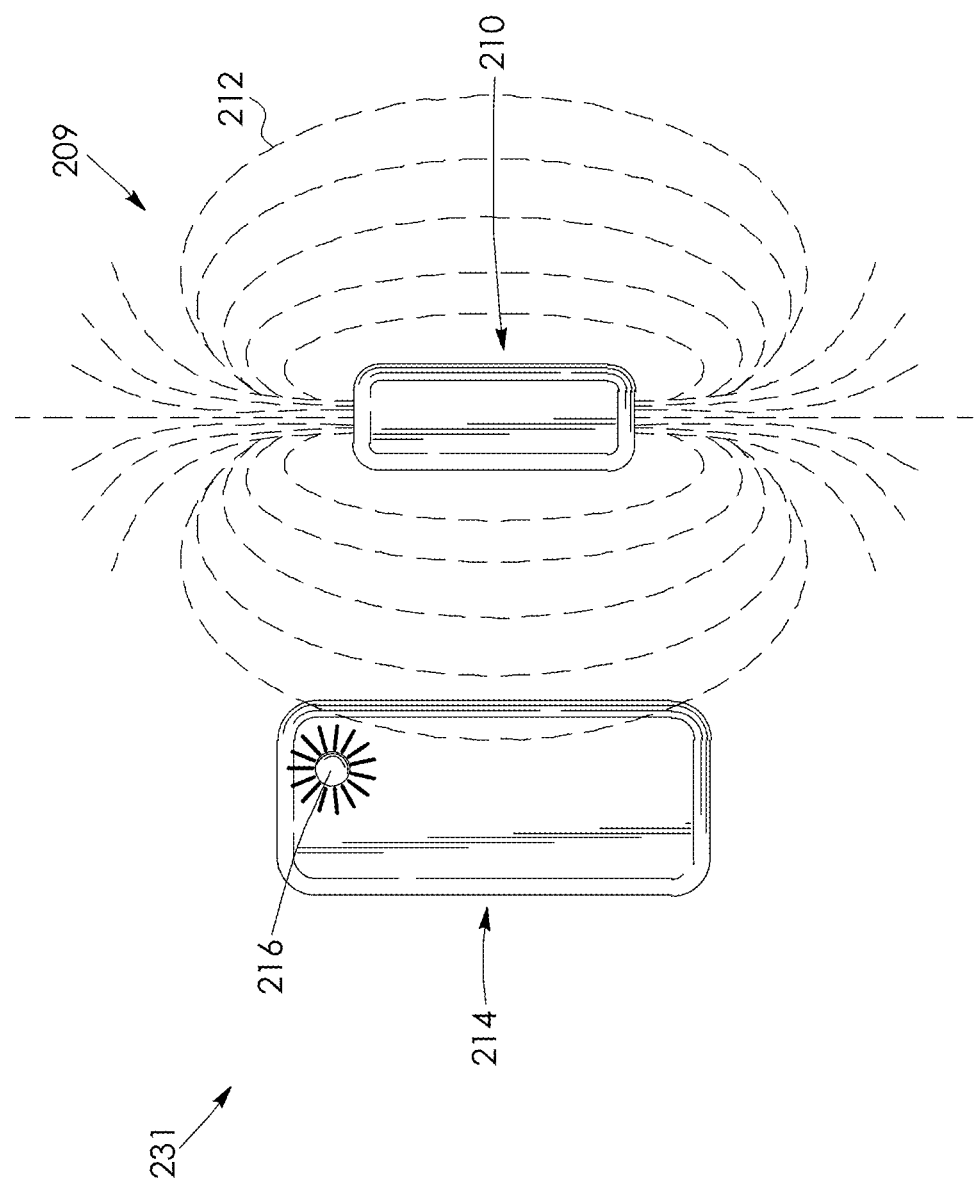

Magnetic field sensor 214 includes an indicator which, in this example, is a visual indicator in the form of an indicator light 216. The indicator light turns on when magnetic field sensor 214 is within magnetic field 212 as shown in FIGS. 30 and 31. Indicator light 216 turns off when magnetic field sensor 214 is outside magnetic field 212 as shown in FIG. 32. The indicator light may accordingly provide a visual indication as to the presence or absence of a magnetic field. Magnetic field sensor 214, together with magnet 210, may be used as a magnetic proximity sensor.

The magnet is shown in greater detail in FIG. 33 and, in this example, is a bar magnet 211 which is disposed in a housing 213 provided with a cover 215. Magnetic field sensor 214 is also shown in greater detail in FIG. 32 and, in this example, is a substantially rectangular parallelepiped with rounded corners but may be other shapes. The magnetic field sensor includes a housing 218 and a circuit board 220 disposed within the housing. Housing 218 is provided with a lid 219 that has a window 221 to facilitate viewing of the indicator light 216 that is mounted on the circuit board in this example. The window may be an aperture in the lid or a translucent portion of the lid.

Magnetic field sensor 214 includes microprocessor 222, a power source that is in the form of a coin cell battery 224 in this example, and a device which senses a magnetic field and which is in the form of a reed switch 226 in this example. The microprocessor, battery and reed switch are mounted on the circuit board 220 in this example. It will however be understood by a person skilled in the art that any AC or DC power source may be used. Likewise any device which senses a magnetic field, such as a magnetoresistive sensor or Hall Effect sensor or MAGNASPHERE™, may be used in place of reed switch 226.

In this example, indicator light 216 is a light-emitting diode package and includes a blue light-emitting diode, a green light-emitting diode, and a red light-emitting diode. Reed switch 226 is actuated by a magnetic field and microprocessor 222 monitors the change of state of the reed switch by periodically sampling the reed switch to sense a magnetic field. If a magnetic field is sensed then the microprocessor turns on indicator light 216. In the absence of a magnetic field, microprocessor 222 turns the indicator light off. The sampling of reed switch 226 by the microprocessor may be done, for example, four times per second or as many times per second as required. The sensitivity of magnetic field sensor 214 may be adjusted by selecting different types of reed switches. This may be used to set a maximum or minimum distance at which the magnetic field sensor is able to sense magnet 210. If another device which senses a magnetic field is used in the magnetic sensor, such as a magnetoresistive sensor or Hall Effect sensor or MAGNASPHERE™, then the sensitivity of the magnetic field sensor may be adjusted based on measured analog and/or digital output.

Figure 34:
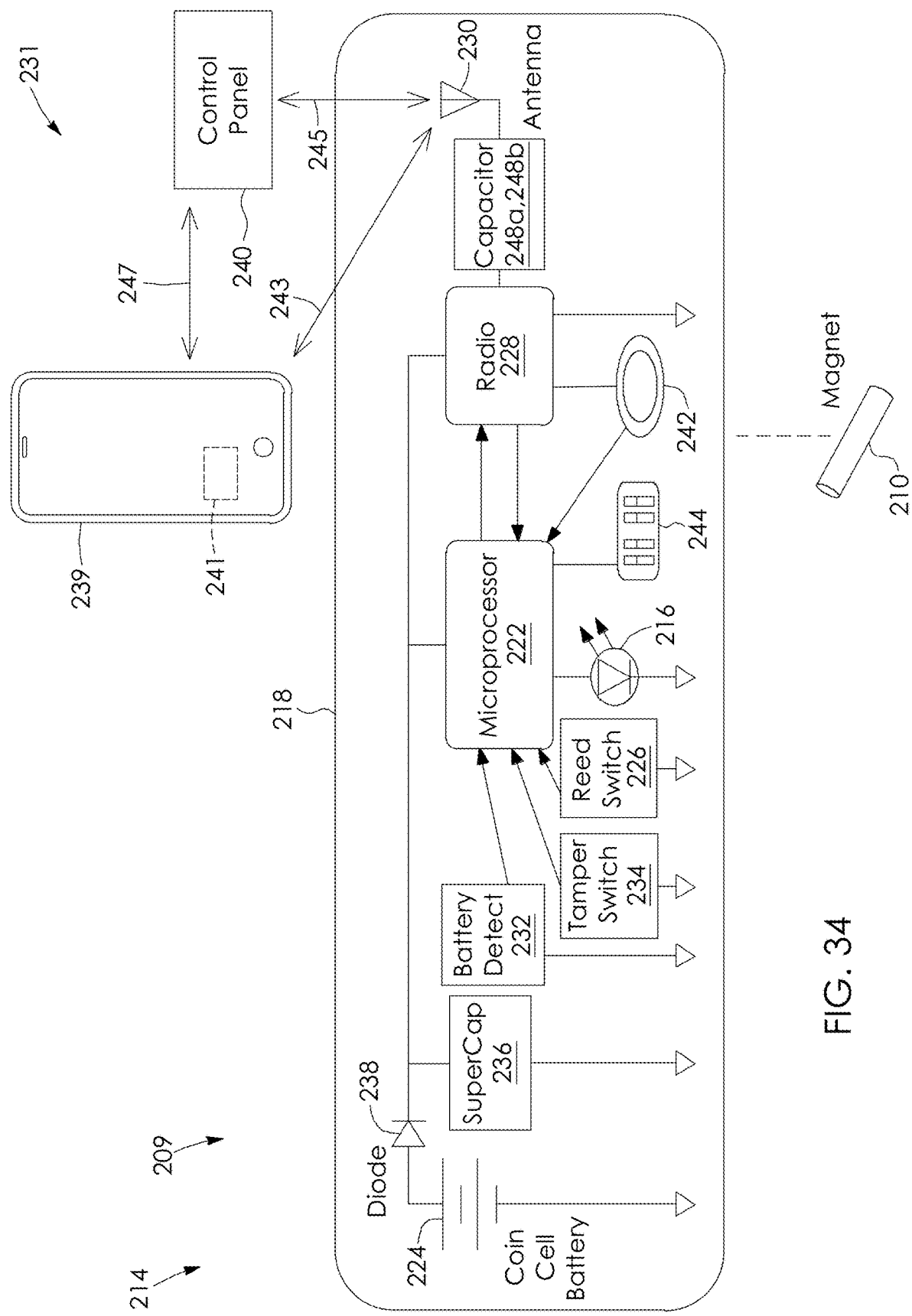
FIG. 34 is a schematic diagram of the magnetic field sensor and magnet of FIG. 30, together with a control panel in communication with the magnetic field sensor and a smartphone in communication with the magnetic field sensor and control panel.

Referring now to FIG. 34, in this example, magnetic field sensor 214 includes a radio, which is in the form of a radio chip 228 in this example, and an antenna 230 that allows the magnetic field sensor to transmit and receive radio signals 243 and 245.

Still referring to FIG. 34, security alarm system 231 may be a wireless and includes a remote electronic device with a processor, in this case a mobile electronic device in the form of a smartphone 239 including a processor 241. Radio 228 and antenna 230 enable sensor 214 to communication with the smartphone as shown by arrow 243. The sensor may communicate with smartphone 239 to convey a status thereof, trigger a notification to the user and/or trigger an alarm thereon.

In addition or alternatively, security alarm system 231 may include a controller or control panel 240 that is part of the wireless security alarm system. Sensor 214 may be in communication with the control panel. In this case the sensor may communicate directly with control panel 240 (as seen by arrow 245) or communicate with smartphone 239 (as seen by arrow 243) which in turn communicates with the control panel to trigger an alarm (as seen by arrow 247) when one or more threshold conditions have been met, exceeded or triggered.

As seen in FIG. 34, magnetic field sensor 214 includes a battery detection circuit 232, a tamper switch 234, and a supercapacitor 236. The battery detection circuit and tamper switch are both conventional and in communication with microprocessor 222. Supercapacitor 236 may be used to assist coin cell battery 224 as the power source. Without the supercapacitor, the coin cell battery may not be able to provide the surge current required when radio chip 228 and antenna 230 transmit and receive radio signals. This is due to the internal resistance of a coin cell battery. A coin cell battery generally cannot be used in applications requiring current in excess of about 20 to 30 milliamperes. The internal resistance of the coin cell battery causes a voltage drop when larger currents are required. This may cause the terminal voltage to drop below a minimum acceptable level of, for example, 2.2 volts.

Supercapacitor 236 may have a low profile which, in combination with use of coin cell battery 224, enables magnetic field sensor 214 to be relatively small. The supercapacitor enables for high short term current draws while still providing a terminal voltage of, for example, 3.0 volts. Without supercapacitor 236, a larger battery may have to be used as a power source. The supercapacitor may have a sufficient residual charge to prevent microprocessor 222 from properly detecting the removal of coin cell battery 224 during battery replacement. However, battery detection circuit 232 enables microprocessor 222 to shut down properly when the coin cell battery 224 is removed.

Magnetic field sensor 214 may also include a reverse voltage protection circuit 238, which may be a diode or P-channel MOSFET, connected in series between coin cell battery 224 and supercapacitor 236. This ensures that the coin cell battery is not reverse charged if the supercapacitor has a higher voltage. Tamper switch 234 may be internal or external of housing 218 and detects when lid 219 (seen in FIG. 33) of the housing is removed and sends a signal to microprocessor 222 that the lid of the housing has been removed and someone is tampering with magnetic field sensor 214. Referring back to FIG. 34, the tamper switch also sends a signal to microprocessor 222 to restart an algorithm related to the sensing of a magnetic field when the tamper switch detects that the lid of the housing has been removed. In other examples, magnetic field sensor 214 may not have a tamper switch and the microprocessor may be signalled to restart the algorithm related to the sensing of a magnetic field when coin cell battery 224 is inserted. The microprocessor may alternatively be signalled to restart the algorithm related to the sensing of a magnetic field when an—ON/OFF switch is actuated. Such an ON/OFF switch may be used turn indicator light 216 on and off.

Magnetic field sensor 214 is further provided in this example with a MEMS oscillator 242. The MEMS oscillator may be programmed to a plurality of discrete frequencies and, in this case, to at least four discrete frequencies which are feed to radio chip 228 to generate an output frequency ranging between 250 MHz and 1 GHz. MEMS oscillator 242 is able to provide the at least four discrete frequencies to the radio chip without an additional phase locked loop being required to generate the output frequency, or output signal, because the radio chip is provided with a single phase-locked loop for example, a x32 multiplier to generate the output frequency.

Figure 35:
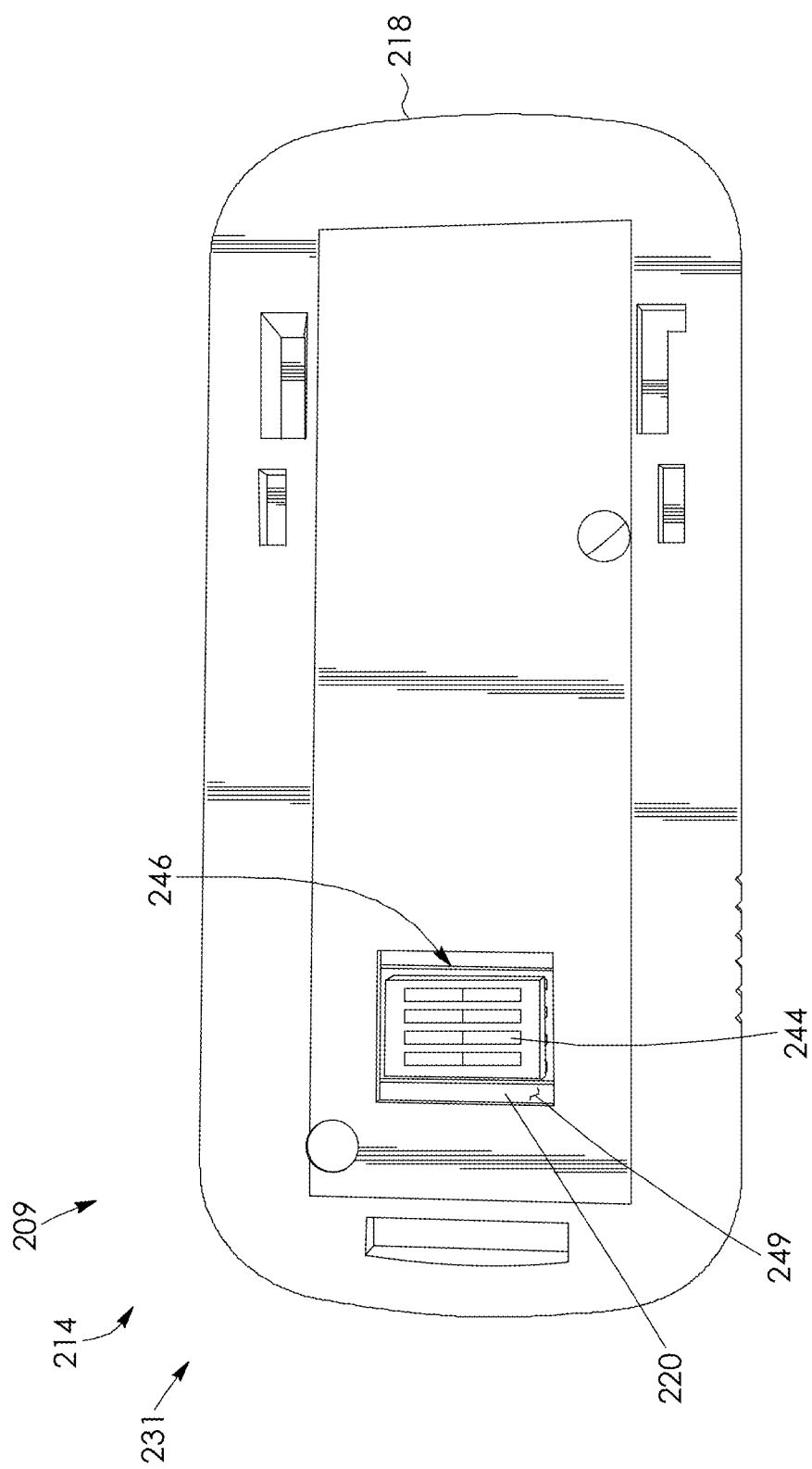
FIG. 35 is a rear elevation view of the magnetic field sensor of FIG. 30.
Figure 36B:
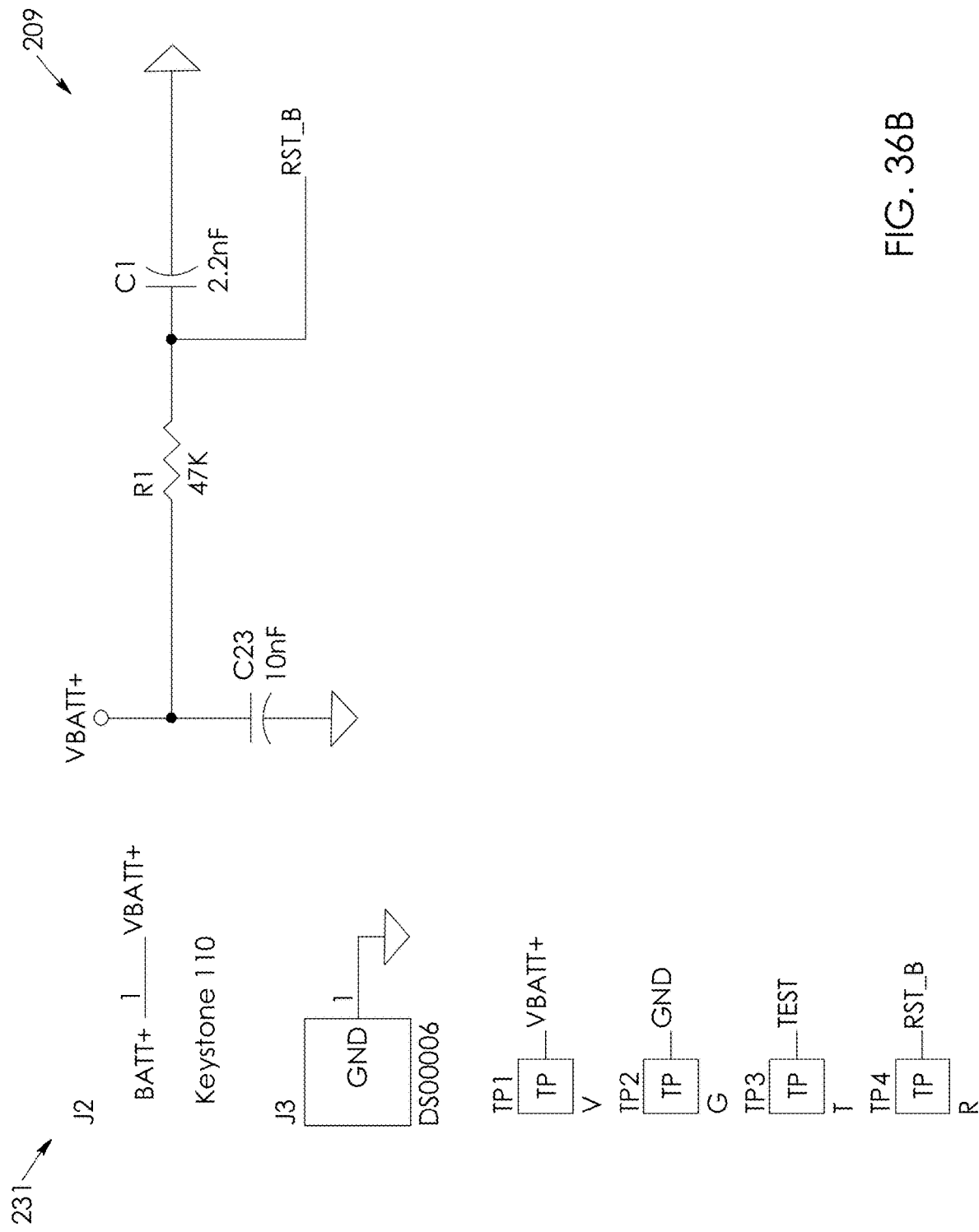
Figure 36C:
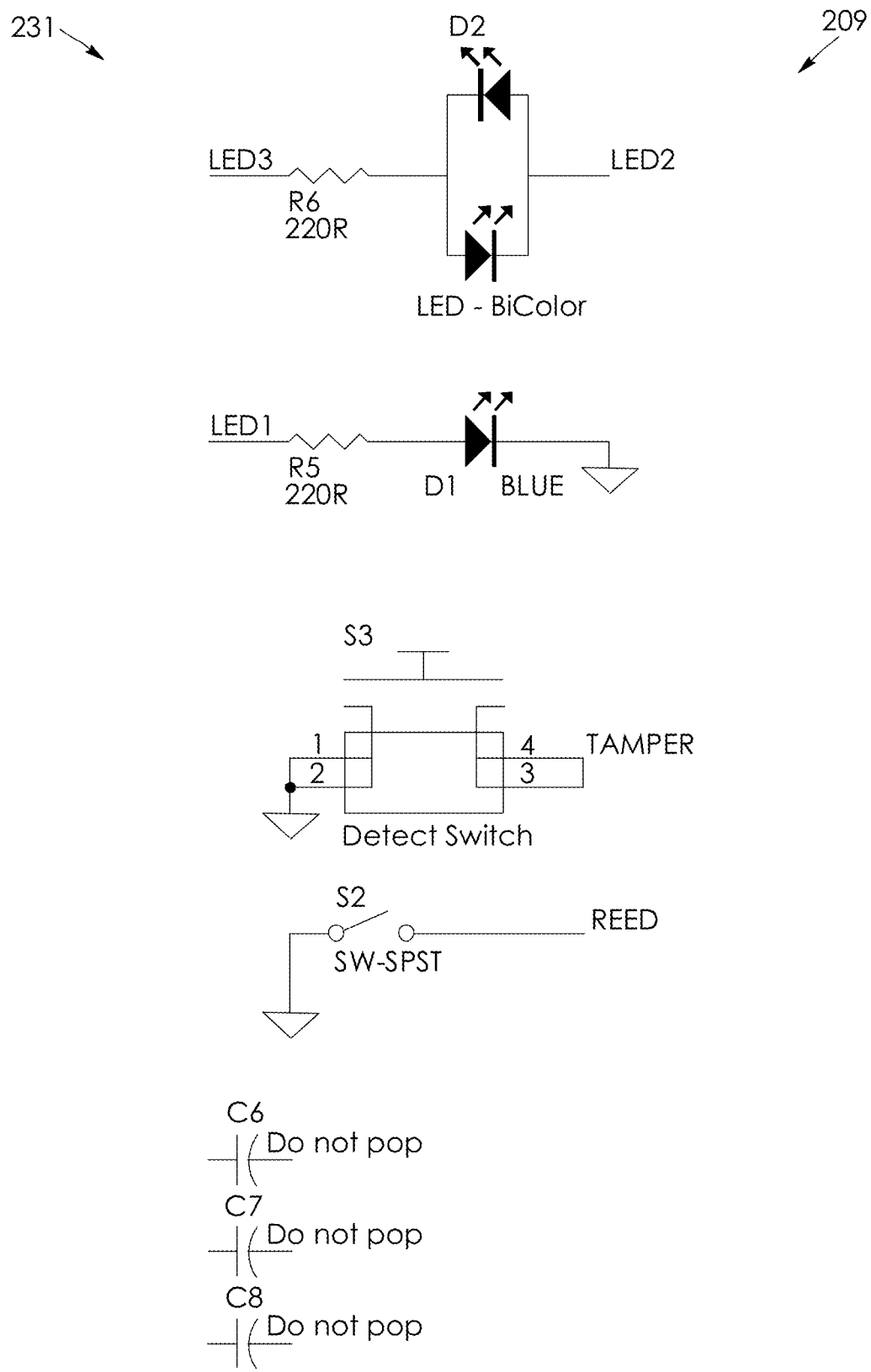
Figure 36D:
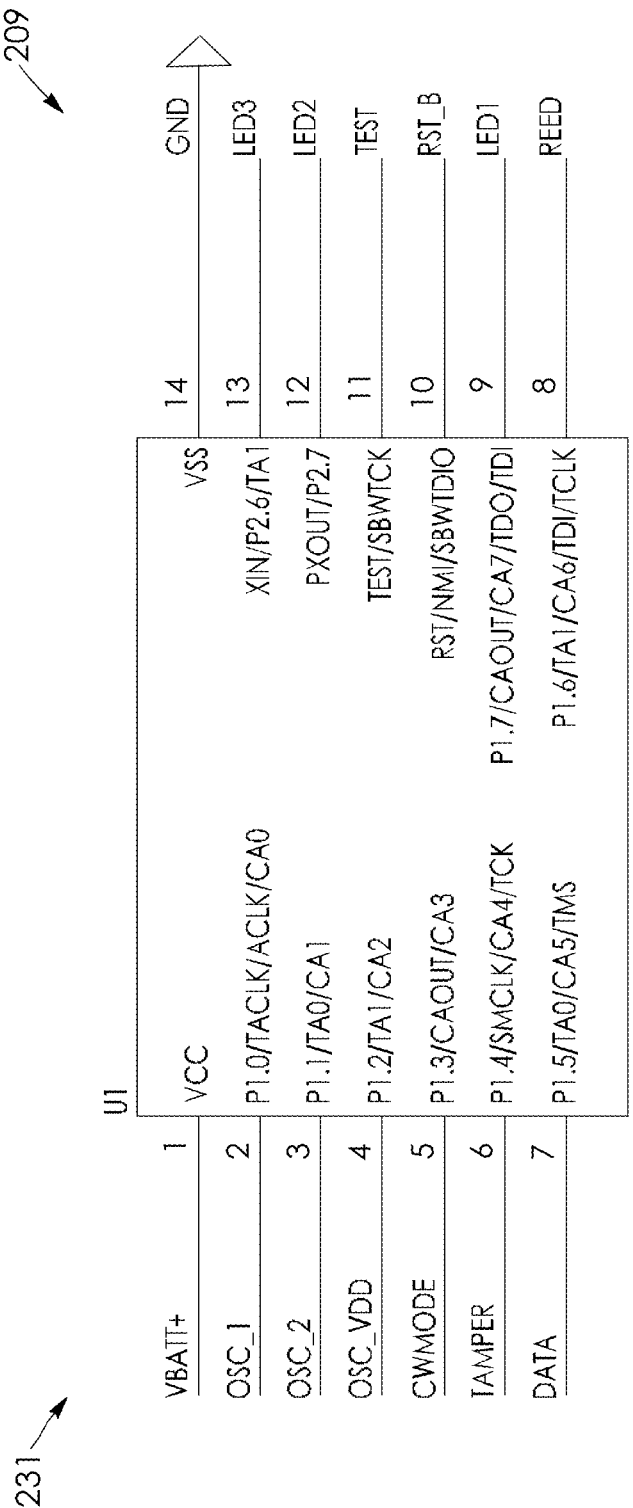
Figure 36E:
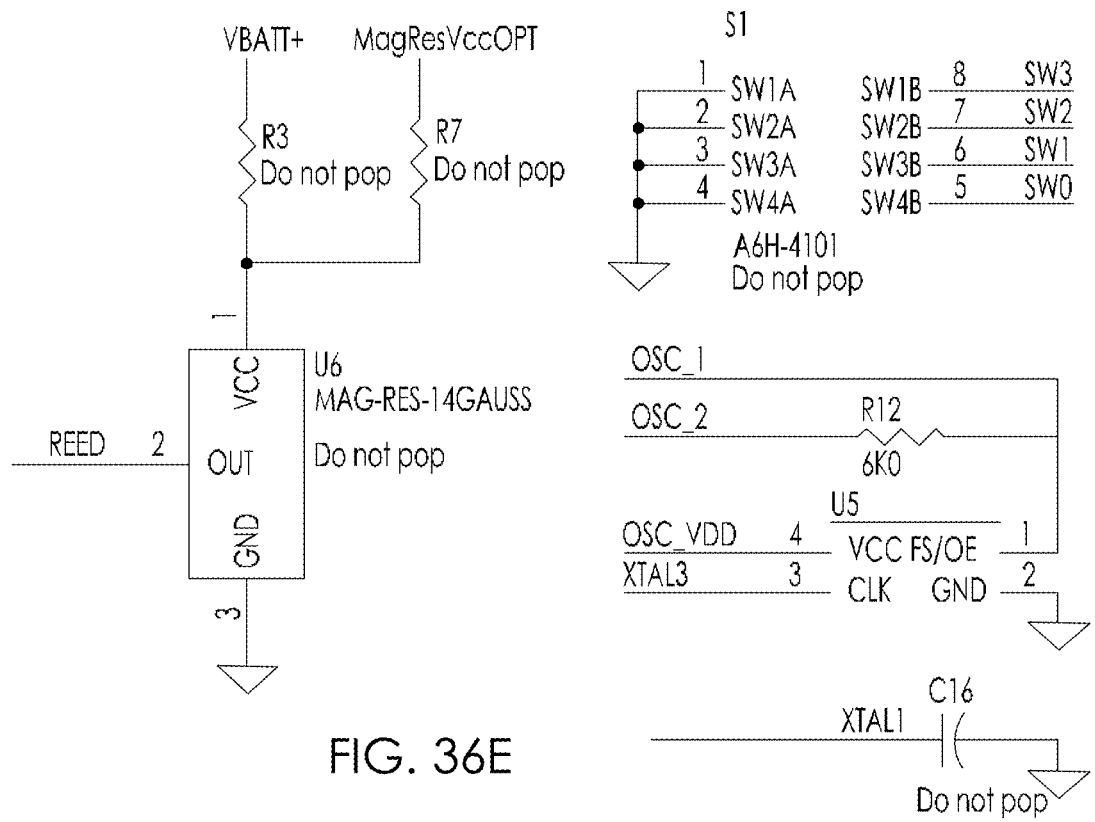

Magnetic field sensor 214 further includes in this example a dip switch, in this case, is a four-position dip switch 244. However, the dip switch and MEMS oscillator 242 are not strictly required and the magnetic field sensor may not have such components in other embodiments. Referring now to FIG. 35, dip switch 244 is mounted on a side 249 of the circuit board 220 opposite of indicator light 216 seen in FIG. 34. This allows dip switch 244 seen in FIG. 35 to be accessed through an aperture 246 in housing 218.

As seen in FIG. 34, microprocessor 222 is programmed with a plurality of data protocols and each output frequency may operate on at least one of the data protocols. Dip switch 244 is actuated to provide a code to the microprocessor and a data protocol is implemented by the microprocessor based on the code. MEMS oscillator 242 is programmed to a discrete frequency based on the data protocol implemented by the microprocessor. The MEMS oscillator then provides the discrete frequency to radio chip 228 which an output signal based on the discrete frequency. This allows an installer to select a discrete frequency to match the protocol of a given alarm system. Respective ones of digitally tuned capacitor chips 248a and 248b are disposed at each terminal of antenna 230. The capacitor chips are used in a shunt mode rather than a series mode to prevent a degradation of antenna performance resulting due to stray capacitance issues when the capacitor chips are used in series. Using capacitor chips 248a and 248b in a shunt configuration may allow antenna 230 to be tuned. Supercapacitor 236 may maintain a maximum output signal by maintaining the voltage at its maximum value during transmission of the output signal. A circuit diagram of the magnetic field sensor is shown in FIGS. 36A to 36E.

Figure 37:
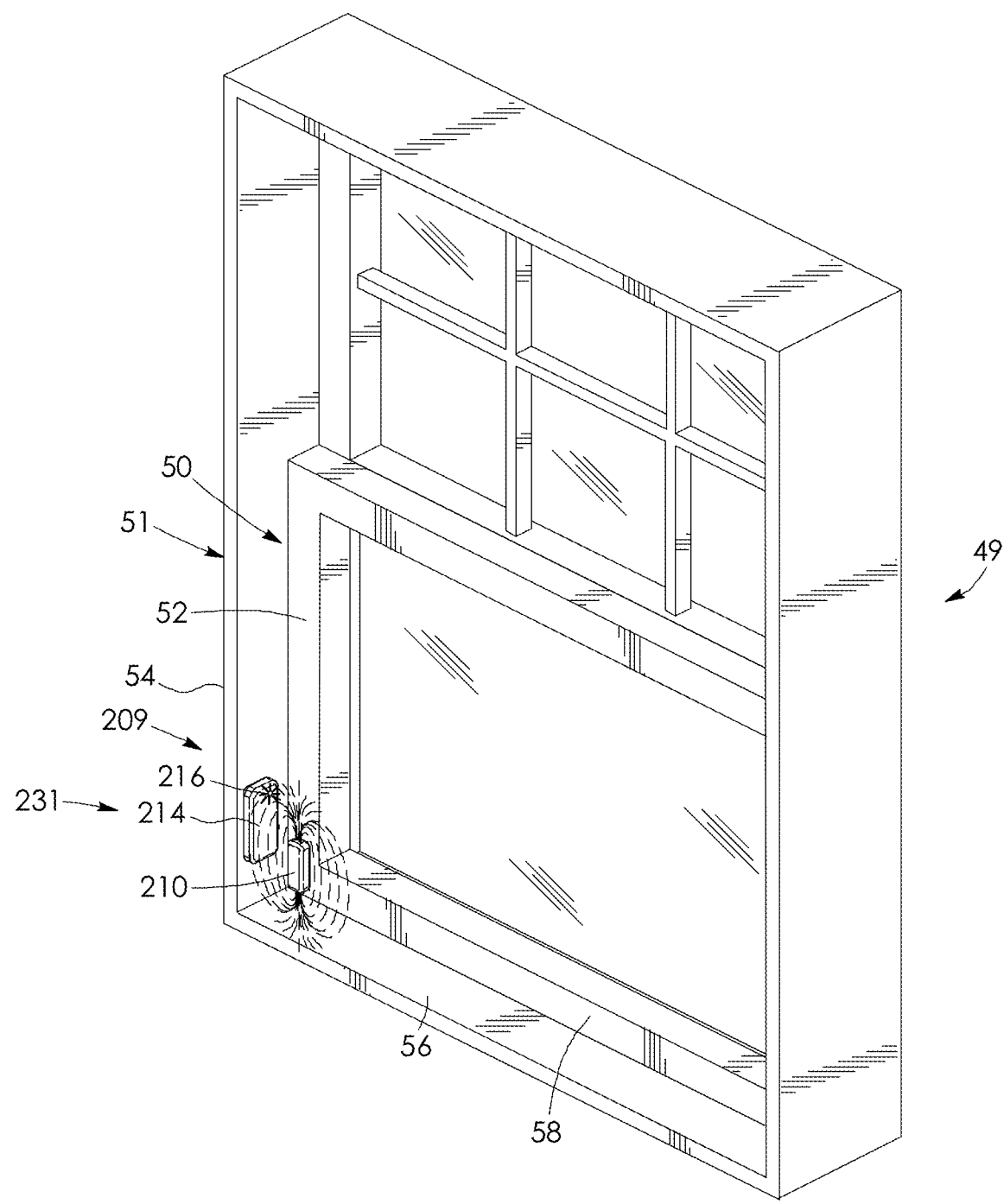
FIG. 37 is a front, top, left side perspective view showing the magnetic field sensor and magnet of FIG. 30 being used as a window sensor in a security alarm system with the window closed, with the magnetic field sensor shown coupled to a stile and a bottom rail of the window.

Referring now to FIGS. 37 to 46, magnetic field sensor 214 and magnet 210 and are shown in use as a proximity sensor in the form of a window sensor for window assembly 49 as part of various configurations of security alarm system 231. As seen in FIG. 37, magnet 210 and magnetic field sensor 214 are in this example mounted on window 50 and framing 51, respectively, with the magnetic field sensor generally being mounted first, although this is not strictly required. The magnet is mounted on stile 52 of the window while the magnetic field sensor is mounted on side jamb 54 of the framing near sill 56 of the framing. Window 50 is fully closed in FIGS. 37 to 39 with bottom rail 58 of the window abutting the sill thereof. When the window is fully closed, magnetic field sensor 214 is able to sense a magnetic field generated by magnet 210 when the magnet is mounted along stile 52 as indicated by the indicator light 216 which is turned on in FIGS. 37 to 39. The magnetic field sensor may also thus signal to the smartphone 239 and/or control panel 240 seen in FIG. 34 that the window is closed.

Figure 38:
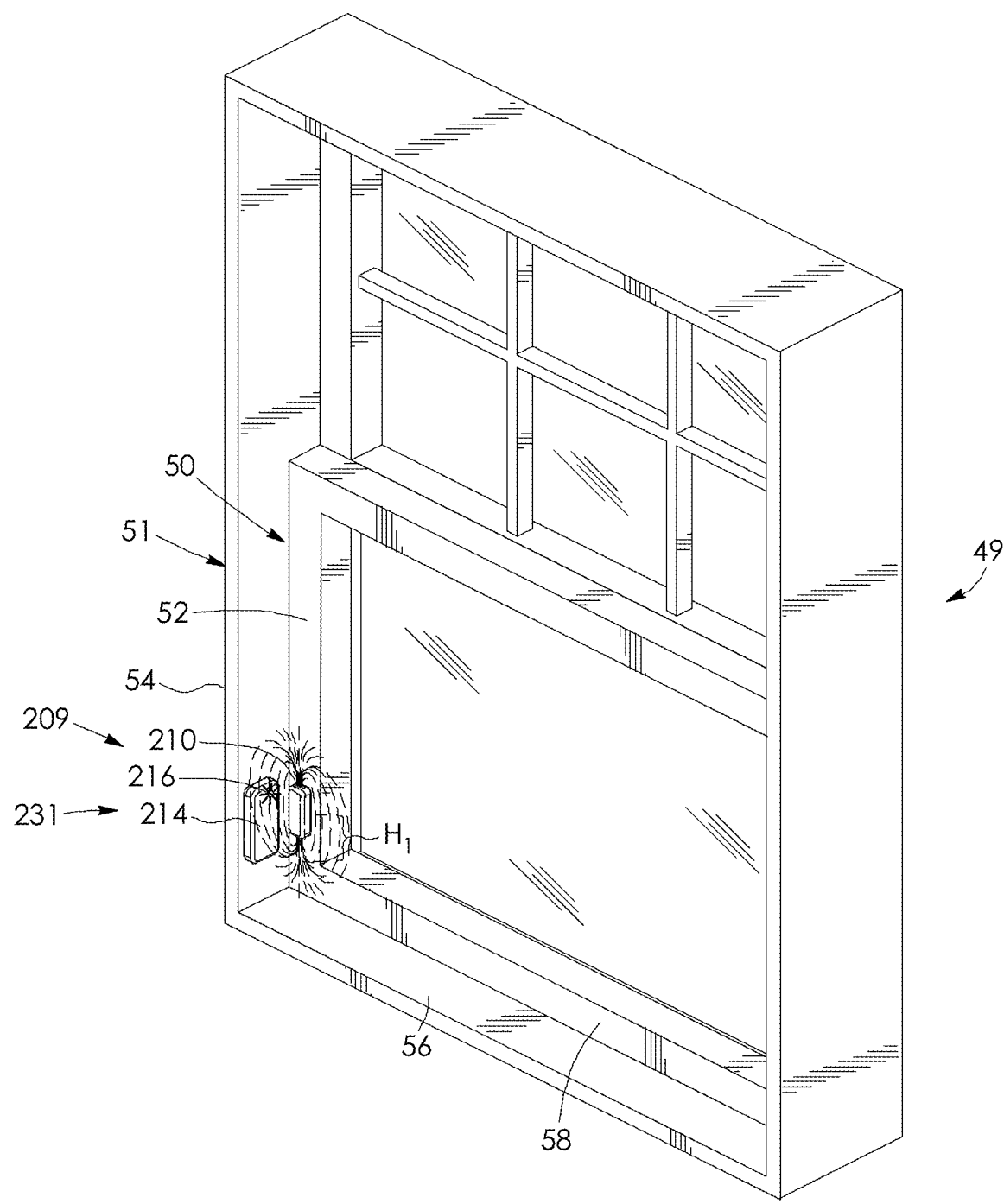
FIG. 38 is a front, top, left side perspective view showing the magnetic field sensor and magnet of FIG. 30 being used as a window sensor in a security alarm system with the window closed, with the magnetic field sensor shown coupled to the stile of the window and being spaced upwards from the bottom rail of the window.
Figure 39:
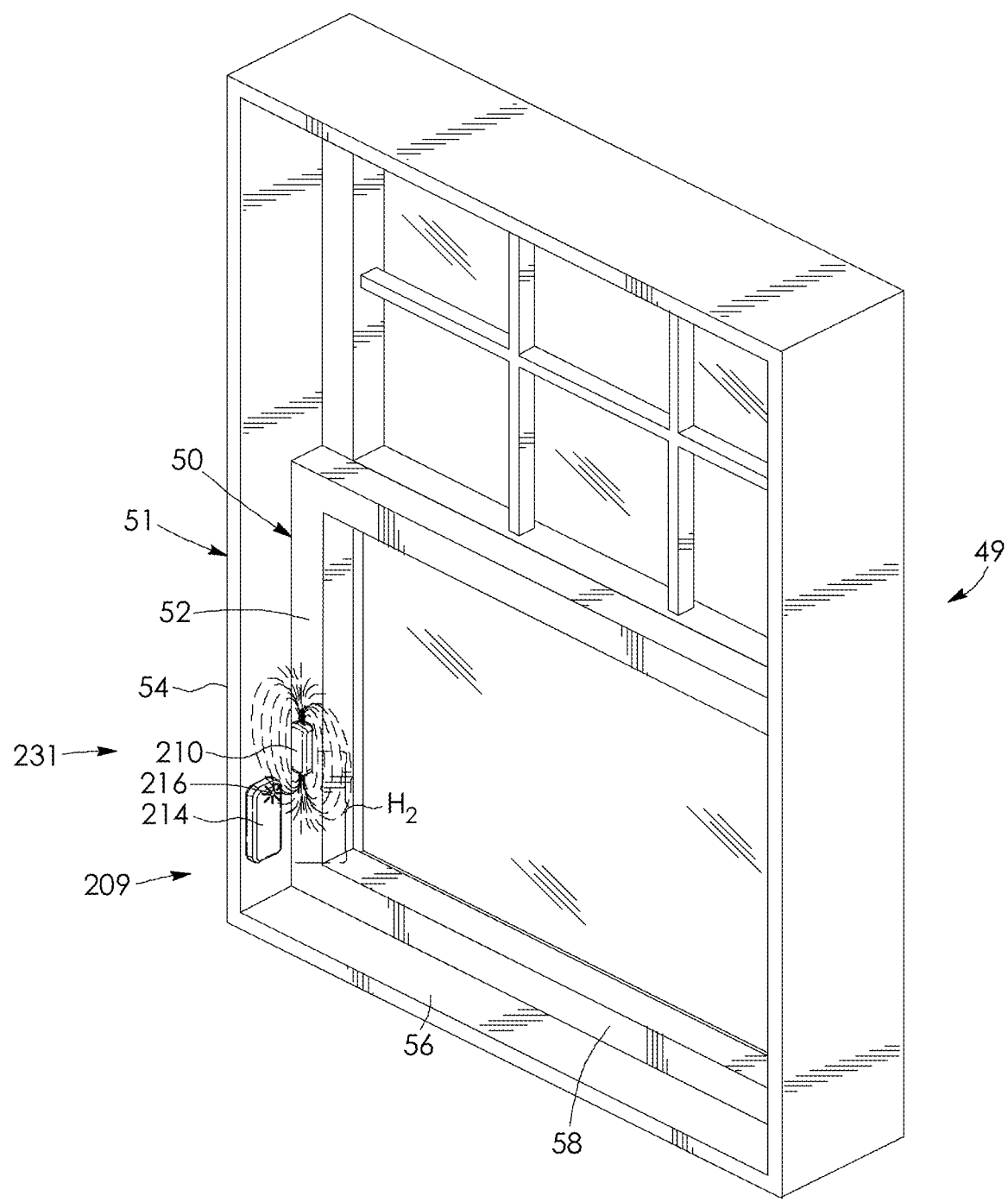
FIG. 39 is a front, top, left side perspective view showing the magnetic field sensor and magnet of FIG. 30 being used as a window sensor in a security alarm system with the window closed, with the magnetic field sensor coupling to the stile of the window and being spaced further upwards thereon relative to the position of the magnetic field sensor shown in FIG. 38.

Indicator light 216 of magnetic field sensor 214 is turned on when magnet 210 is mounted on stile 52 of window 50 at a first or lower position adjacent to bottom rail 58 of the window as shown in FIG. 37. As seen in FIG. 38, the indicator light is also turned on when the magnet is mounted on the stile of the window at a second or intermediate position, distance or height $H_1$ above the lower position of the magnet seen in FIG. 37. As seen in FIG. 39, indicator light 216 is likewise turned on when magnet 210 is mounted on stile 52 of window 50 at an upper position, distance or height $H_2$ above the lower position of the magnet seen in FIG. 37. Height $H_2$ is greater than height $H_1$. This provides a visible confirmation to an installer that, when magnetic field sensor 214 is mounted on side jamb 54 of framing 51 near sill 56 of window 50, magnet 210 may be mounted anywhere on stile 52 between the lower position thereof (shown in FIG. 37) and the upper position thereof (shown in FIG. 39) for the magnetic field sensor to still be able to sense a magnetic field generated by the magnet. An alarm will accordingly not be triggered when window 50 is fully closed and the magnet and magnetic field sensor are positioned relative to one another as shown in FIGS. 37 to 39.

Figure 40:
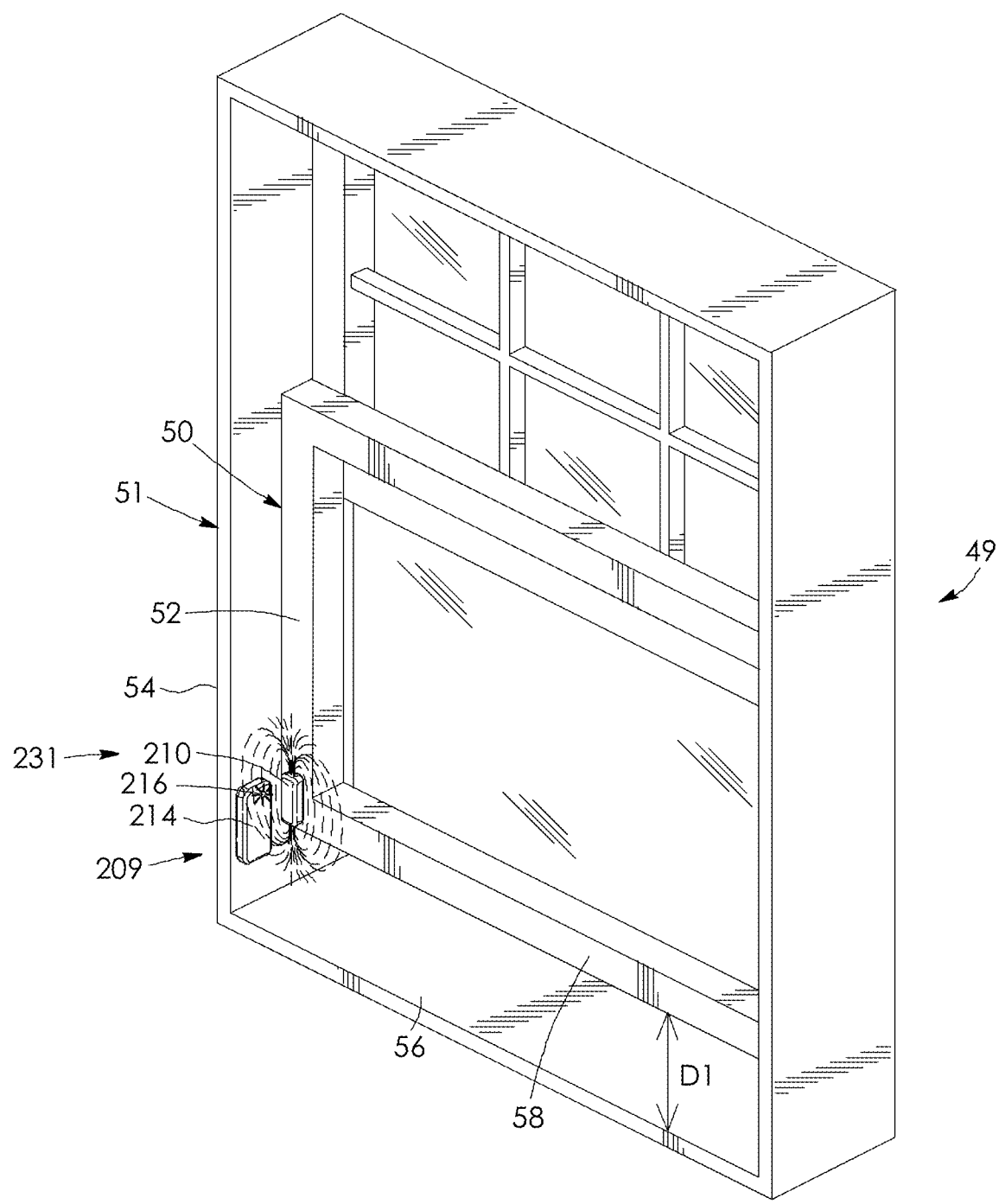
FIG. 40 is a front, top, left side perspective view showing the magnetic field sensor, magnet and window of FIG. 37, with the window opened distance D1.
Figure 41:
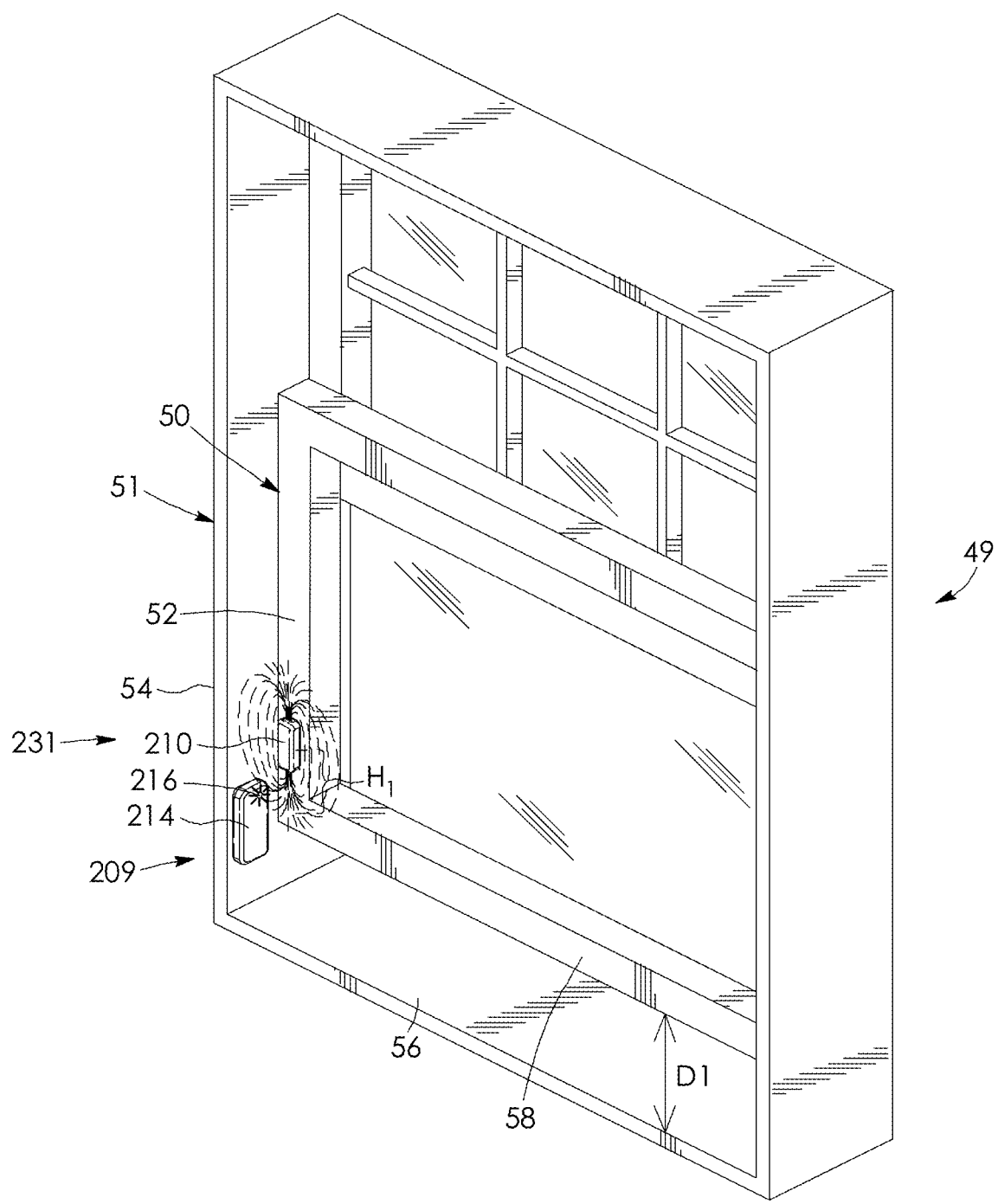
FIG. 41 is a front, top, left side perspective view of the magnetic field sensor, magnet and window of FIG. 38, with the window opened distance D1.
Figure 42:
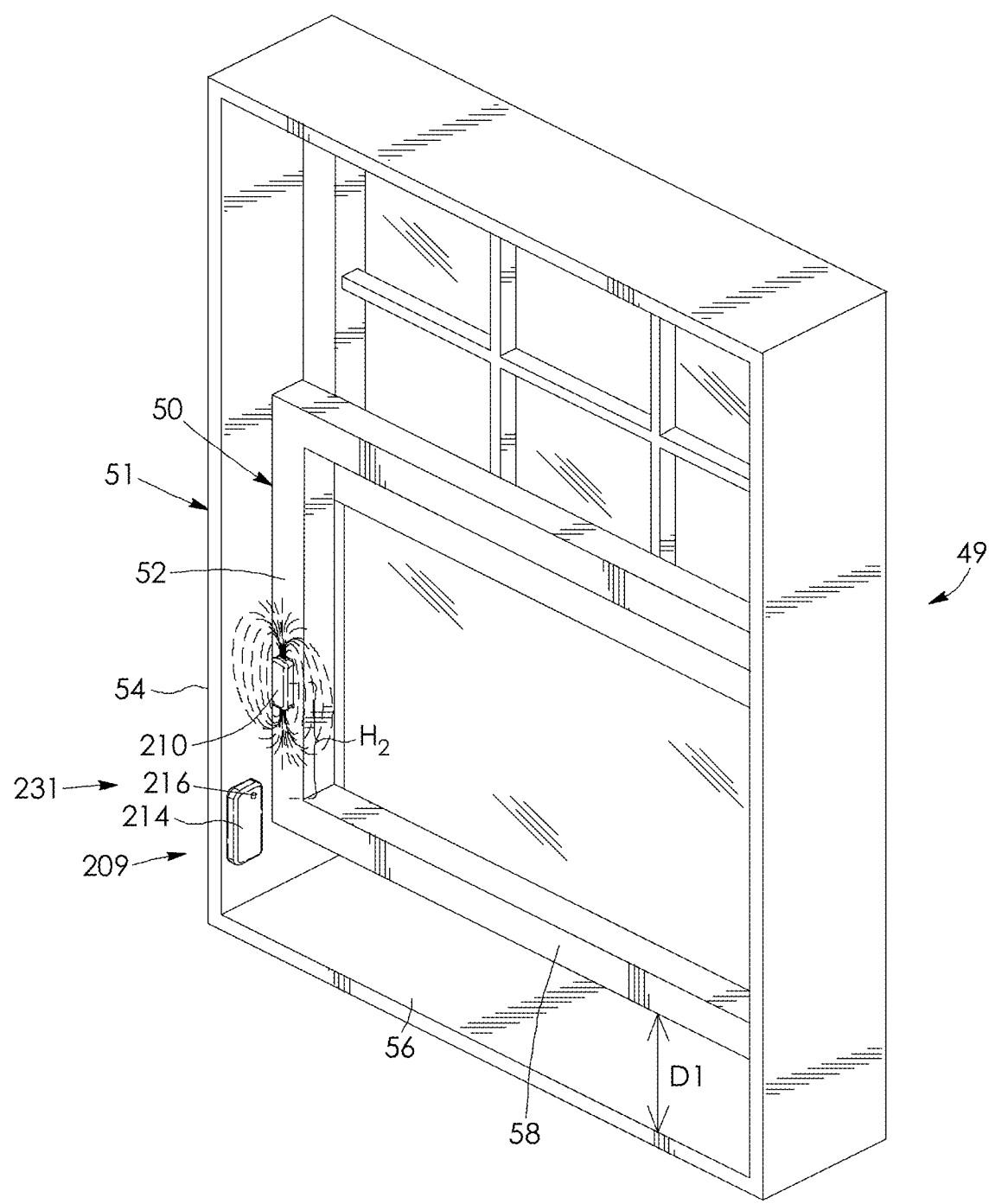
FIG. 42 is a front, top, left side perspective view of the magnetic field sensor, magnet and window of FIG. 39, with the window opened distance D1.

However, it may be desirable for an alarm to not be triggered when window 50 is not fully closed. This would allow the window to be partially opened for ventilation but not enough to allow an intruder to enter through the window. For example, as shown in FIGS. 40 to 42, it may be desired to allow the window to be opened threshold distance D1 without triggering an alarm. FIG. 40 shows that magnetic field sensor 214 is able to sense the magnetic field generated by magnet 210, as visually indicated by indicator light 216 which is turned on, when the magnet is mounted on stile 52 of window 50 adjacent to bottom rail 58 of the window and the window is open threshold distance D1. The magnetic field sensor may thus signal to smartphone 239 and/or control panel 240 seen in FIG. 34 that the window is open up to the threshold distance.

FIG. 41 shows that magnetic field sensor 214 is also able to sense the magnetic field generated by magnet 210, as visually indicated by indicator light 216 which is turned on, when the magnet is mounted on the stile upwards from bottom rail 58 of window 50 and lower position of the magnet (seen in FIG. 40) and the window is open threshold distance D1. The magnetic field sensor may thus signal to smartphone 239 and/or control panel 240 seen in FIG. 34 that the window is open up to the threshold distance.

FIG. 42 shows that magnetic field sensor 214 is unable to sense the magnetic field generated by magnet 210, as visually indicated by indicator light 216 which is turned off, when the magnet is mounted on stile 52 in the upper position further above from bottom rail 58 of window 50. The indicator light accordingly provides a visual indication to an installer as to where on the stile the magnet may be mounted to allow window 50 to be opened threshold distance D1 without triggering an alarm.

Figure 43:
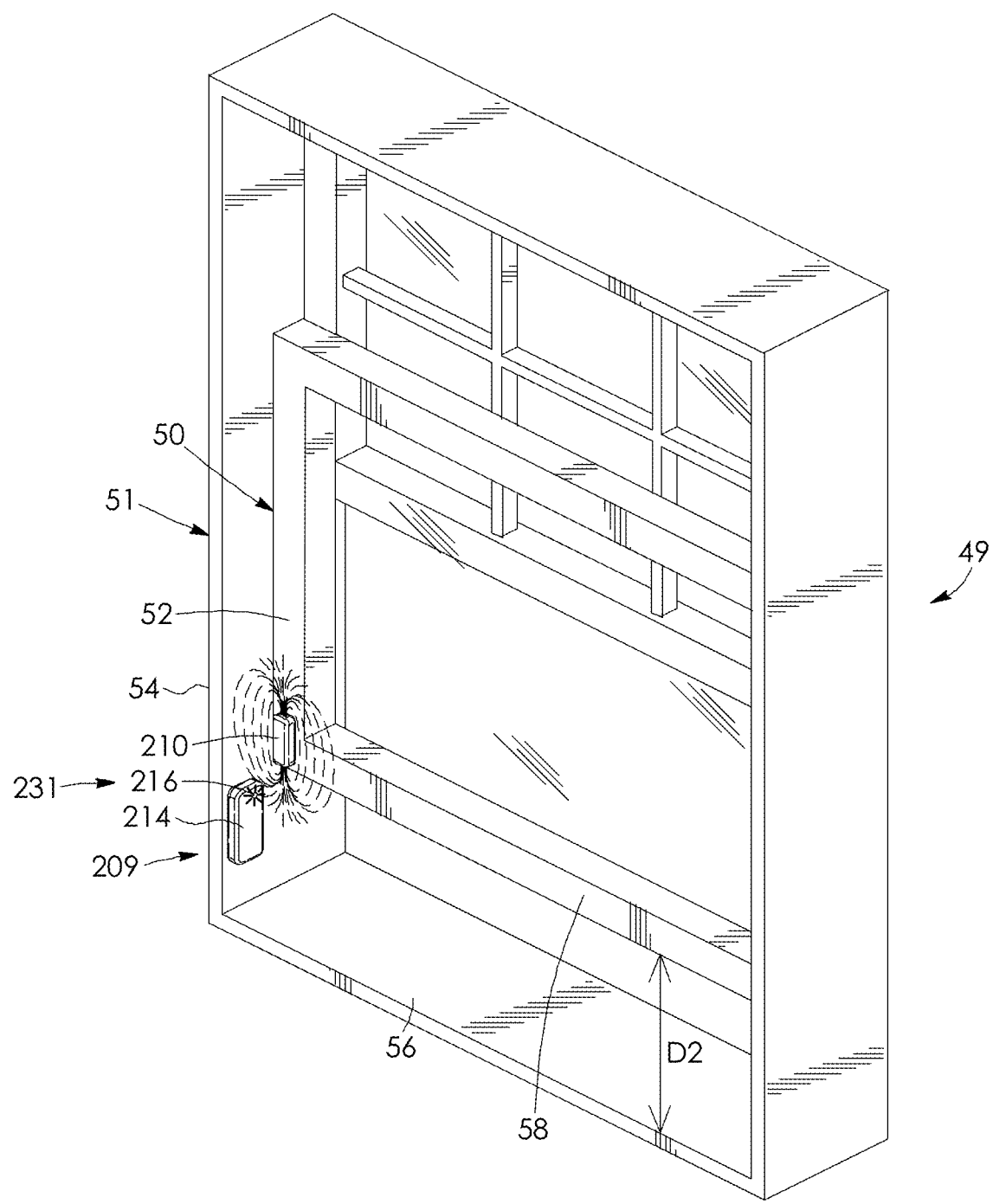
FIG. 43 is a front, top, left side perspective view of the magnetic field sensor, magnet and window of FIG. 37, with the window opened distance D2.

FIG. 43 shows where magnet 210 may be positioned to avoid triggering an alarm when the window is opened distance D2 that is greater than threshold distance D1. Magnetic field sensor 214 is able to sense a magnetic field generated by the magnet, as visually indicated by indicator light 216 which is turned on, when the magnet is mounted on stile 52 of window 50 in the lower position adjacent to bottom rail 58 of the window.

Figure 44:
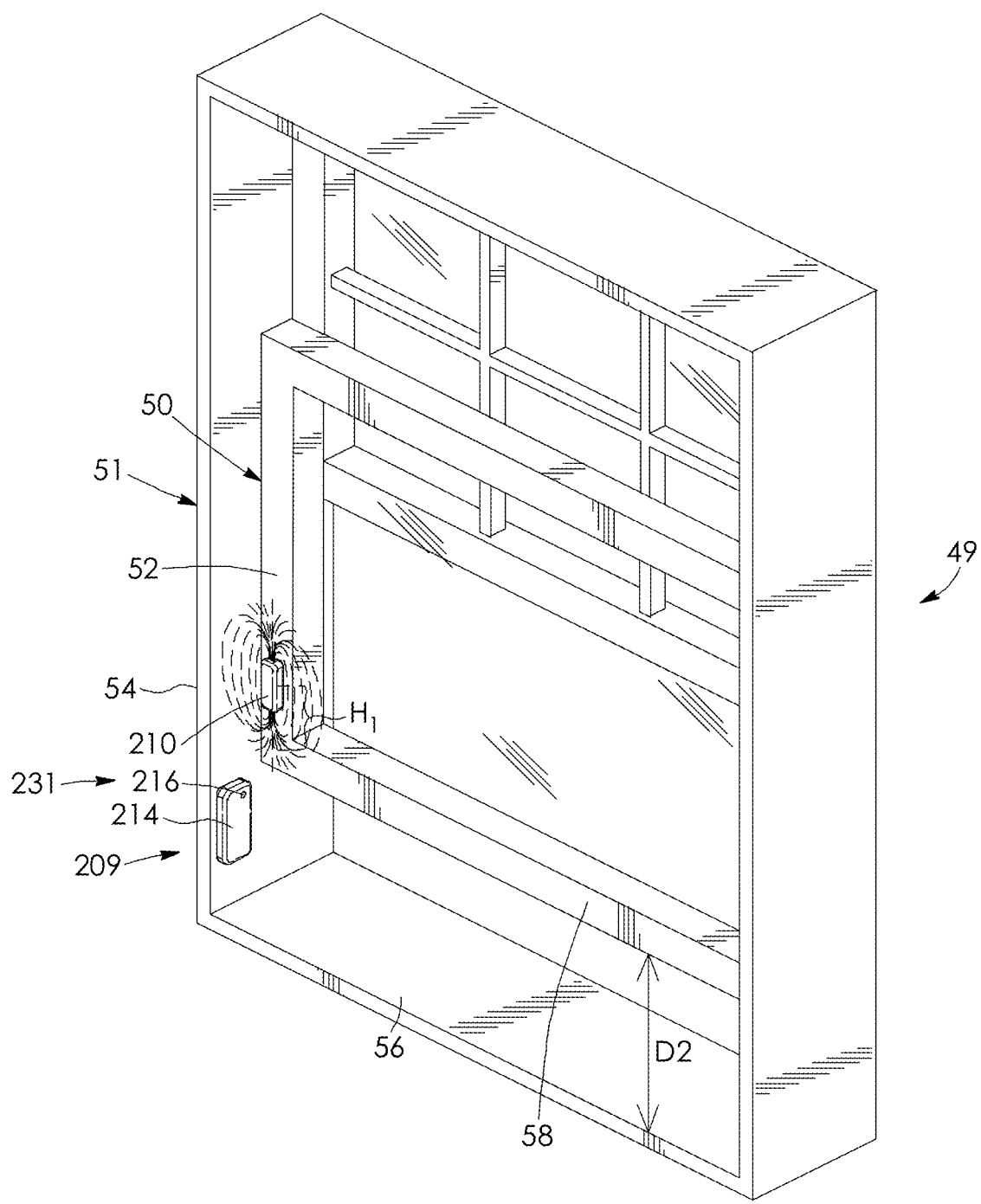
FIG. 44 is a front, top, left side perspective view of the magnetic field sensor, magnet and window of FIG. 38, with the window opened distance D2.

FIG. 44 shows that the magnetic field sensor is unable to sense the magnetic field generated by magnet 210, as visually indicated by the indicator light which is turned off, when the magnet is mounted on the stile of the window in the intermediate position away from the bottom rail of the window. Magnetic field sensor 214 may also send a signal or notification to smartphone 239 and/or control panel 240 seen in FIG. 34 indicating that window 50 is open greater than threshold distance D1. After installation of the magnetic field sensor and magnet is complete, the magnetic field sensor, smartphone and/or control panel may thereafter be programmed to trigger an alarm via the smartphone or the control panel upon receiving said signal or notification from the magnetic field sensor that the window is open greater than the threshold distance.

Figure 45:
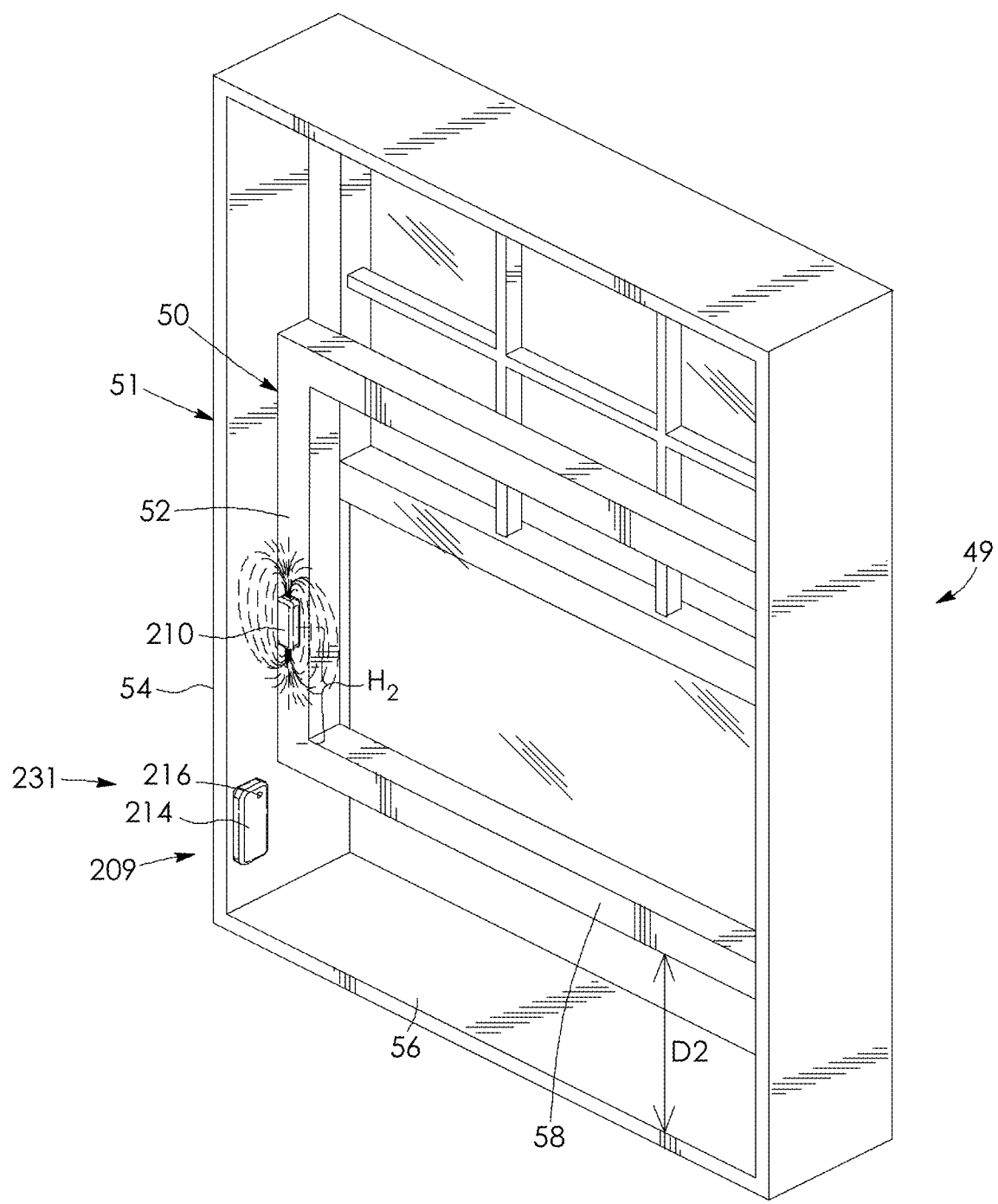
FIG. 45 is a front, top, left side perspective view of the magnetic field sensor, magnet and window of FIG. 39, with the window opened distance D2.

FIG. 45 shows that magnetic field sensor 214 is also unable to sense the magnetic field generated by magnet 210, as visually indicated by indicator light 216 which is turned off, when the magnet is mounted on stile 52 of window 50 in the upper position further away from bottom rail 58 of the window. The indicator light accordingly provides a visual indication to an installer that the magnet should be mounted on the stile adjacent to the bottom rail in the lower position seen in FIG. 43, allowing window 50 to be opened distance D2 without triggering an alarm. Magnetic field sensor 214 may likewise send a signal or notification to smartphone 239 and/or control panel 240 seen in FIG. 34 indicating that window 50 is open greater than threshold distance D1. After installation of the magnetic field sensor and magnet is complete, the magnetic field sensor, smartphone and/or control panel may also thereafter be programmed to trigger an alarm via the smartphone or the control panel upon receiving said signal or notification from the magnetic field sensor that the window is open greater than the threshold distance.

Figure 46:
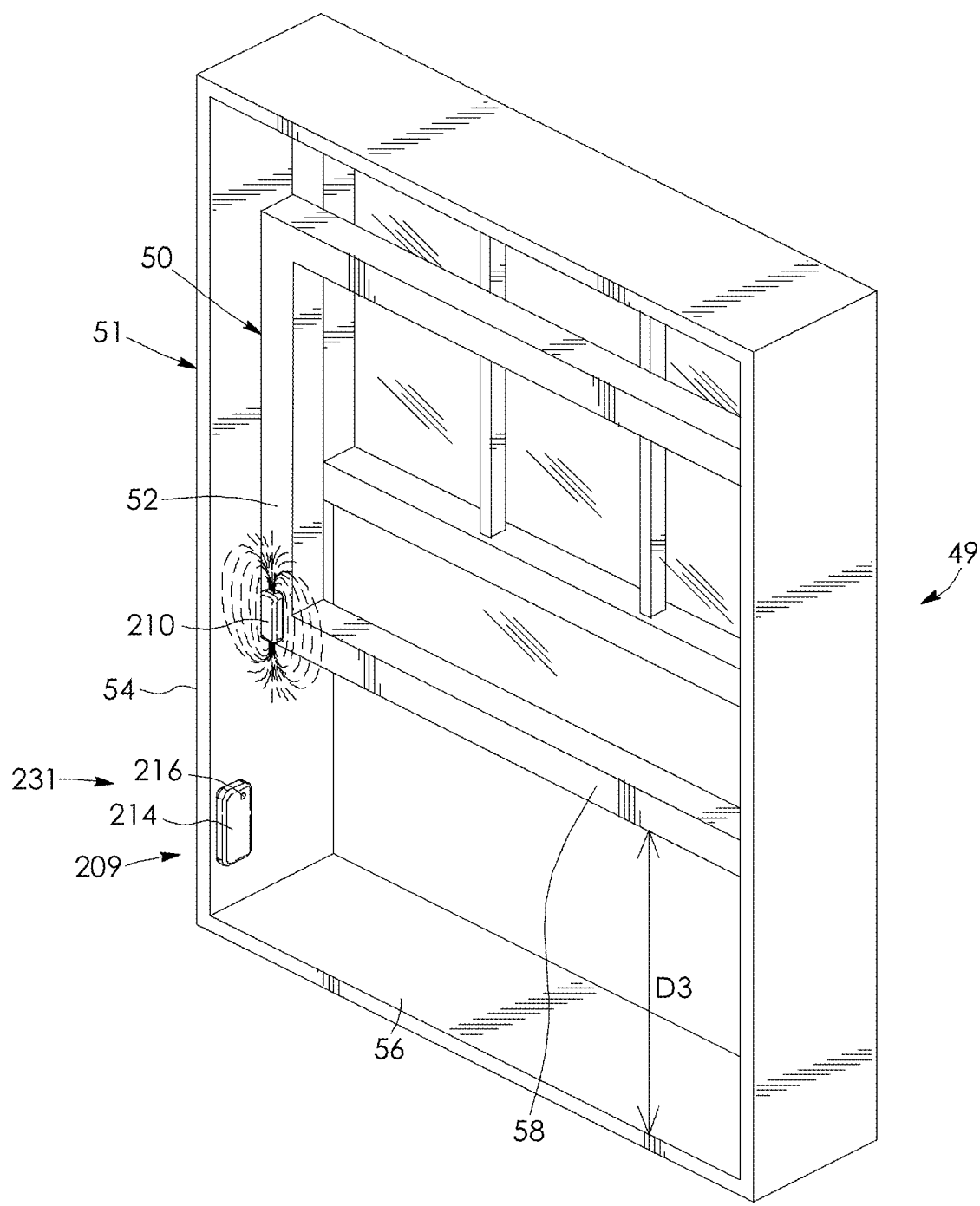
FIG. 46 is a front, top, left side perspective view of the magnetic field sensor, magnet and window of FIG. 37, with the window opened distance D3.

As seen in FIG. 46 where magnet 210 is in the lower position, opening the window distance D3 will cause window 50 to be open a distance greater than distance D2. Magnetic field sensor 214 will no longer be within range of the magnetic field of magnet 210 and indicator light 216 will be turned off. This is the case even if the magnet is mounted on stile 52 of window 50 adjacent to bottom rail 58 of the window. Indicator light 216 accordingly provides an installer with a visual indication to verify correct placement of the magnet to allow a maximum threshold opening of the window.

In this case magnetic field sensor 214 may send a signal or notification to smartphone 39 and/or control panel 40 seen in FIG. 1 indicating that window 50 is open greater than distance D2. After installation of the magnetic field sensor and magnet is complete, the magnetic field sensor, smartphone and/or control panel may also thereafter be programmed to trigger an alarm via the smartphone or the control panel upon receiving said signal or notification from the magnetic field sensor that the window is open greater than distance D2.

It will be understood by a person skilled in the art that mounting magnet 210 on stile 52 of window 50 and mounting magnetic field sensor 214 on side jamb 54 of framing 51 is only an example. The magnetic field sensor and magnet may be mounted anywhere provided there is relative movement of the magnetic field sensor and magnet when the window is opened. It will also be understood by a person skilled in the art that the magnet and magnetic field sensor may also be used as a door sensor for door assembly 59 seen in FIGS. 16 to 29 for example or in any other proximity sensor application.

More detail and additional variations are set out in U.S. patent application Ser. No. 16/938,962 and Ser. No. 17/055,287, priority to which is hereby claimed and the disclosures of which are hereby incorporated by reference.

Where a component (e.g. a software module, processor, assembly, device, circuit, etc.) is referred to herein, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

Embodiments of the invention may be implemented using specifically designed hardware, configurable hardware, programmable data processors configured by the provision of software (which may optionally comprise "firmware") capable of executing on the data processors, special purpose computers or data processors that are specifically programmed, configured, or constructed to perform one or more steps in a method as explained in detail herein and/or combinations of two or more of these. Examples of specifically designed hardware are: logic circuits, application-specific integrated circuits ("ASICs"), large scale integrated circuits ("LSIs"), very large scale integrated circuits ("VLSIs"), and the like. Examples of configurable hardware are: one or more programmable logic devices such as programmable array logic ("PALs"), programmable logic arrays ("PLAs"), and field programmable gate arrays ("FPGAs"). Examples of programmable data processors are: microprocessors, digital signal processors ("DSPs"), embedded processors, graphics processors, math co-processors, general purpose computers, server computers, cloud computers, mainframe computers, computer workstations, and the like. For example, one or more data processors in a control circuit for a device may implement methods as described herein by executing software instructions in a program memory accessible to the processors.

Processing may be centralized or distributed. Where processing is distributed, information including software and/or data may be kept centrally or distributed. Such information may be exchanged between different functional units by way of a communications network, such as a Local Area Network (LAN), Wide Area Network (WAN), or the Internet, wired or wireless data links, electromagnetic signals, or other data communication channel.

The invention may also be provided in the form of a program product. The program product may comprise any non-transitory medium which carries a set of computer-readable instructions which, when executed by a data processor, cause the data processor to execute a method of the invention. Program products according to the invention may be in any of a wide variety of forms. The program product may comprise, for example, non-transitory media such as magnetic data storage media including floppy diskettes, hard disk drives, optical data storage media including CD ROMs, DVDs, electronic data storage media including ROMs, flash RAM, EPROMs, hardwired or preprogrammed chips (e.g., EEPROM semiconductor chips), nanotechnology memory, or the like. The computer-readable signals on the program product may optionally be compressed or encrypted.

In some embodiments, the invention may be implemented in software. For greater clarity, "software" includes any instructions executed on a processor, and may include (but is not limited to) firmware, resident software, microcode, code for configuring a configurable logic circuit, applications, apps, and the like. Both processing hardware and software may be centralized or distributed (or a combination thereof), in whole or in part, as known to those skilled in the art. For example, software and other modules may be accessible via local memory, via a network, via a browser or other application in a distributed computing context, or via other means suitable for the purposes described above.

Software and other modules may reside on servers, workstations, personal computers, tablet computers, and other devices suitable for the purposes described herein.

Interpretation of Terms

Unless the context clearly requires otherwise, throughout the description and the claims:
"comprise", "comprising", and the like are to be construed in an inclusive sense, as opposed to an exclusive or exhaustive sense; that is to say, in the sense of "including, but not limited to";
"connected", "coupled", or any variant thereof, means any connection or coupling, either direct or indirect, between two or more elements; the coupling or connection between the elements can be physical, logical, or a combination thereof;
"herein", "above", "below", and words of similar import, when used to describe this specification, shall refer to this specification as a whole, and not to any particular portions of this specification;
"or", in reference to a list of two or more items, covers all of the following interpretations of the word: any of the items in the list, all of the items in the list, and any combination of the items in the list;
the singular forms "a", "an", and "the" also include the meaning of any appropriate plural forms. These terms ("a", "an", and "the") mean one or more unless stated otherwise;
"and/or" is used to indicate one or both stated cases may occur, for example A and/or B includes both (A and B) and (A or B);
"approximately" when applied to a numerical value means the numerical value±10%;
where a feature is described as being "optional" or "optionally" present or described as being present "in some embodiments" it is intended that the present disclosure encompasses embodiments where that feature is present and other embodiments where that feature is not necessarily present and other embodiments where that feature is excluded. Further, where any combination of features is described in this application this statement is intended to serve as antecedent basis for the use of exclusive terminology such as "solely," "only" and the like in relation to the combination of features as well as the use of "negative" limitation(s)" to exclude the presence of other features; and
"first" and "second" are used for descriptive purposes and cannot be understood as indicating or implying relative importance or indicating the number of indicated technical features.

Words that indicate directions such as "vertical", "transverse", "horizontal", "upward", "downward", "forward", "backward", "inward", "outward", "left", "right", "front", "back", "top", "bottom", "below", "above", "under", and the like, used in this description and any accompanying claims (where present), depend on the specific orientation of the apparatus described and illustrated. The subject matter described herein may assume various alternative orientations. Accordingly, these directional terms are not strictly defined and should not be interpreted narrowly.

Where a range for a value is stated, the stated range includes all sub-ranges of the range. It is intended that the statement of a range supports the value being at an endpoint of the range as well as at any intervening value to the tenth of the unit of the lower limit of the range, as well as any subrange or sets of sub ranges of the range unless the context clearly dictates otherwise or any portion(s) of the stated range is specifically excluded. Where the stated range includes one or both endpoints of the range, ranges excluding either or both of those included endpoints are also included in the invention.

Certain numerical values described herein are preceded by "about". In this context, "about" provides literal support for the exact numerical value that it precedes, the exact numerical value±5%, as well as all other numerical values that are near to or approximately equal to that numerical value. Unless otherwise indicated a particular numerical value is included in "about" a specifically recited numerical value where the particular numerical value provides the substantial equivalent of the specifically recited numerical value in the context in which the specifically recited numerical value is presented. For example, a statement that something has the numerical value of "about 10" is to be interpreted as: the set of statements:
in some embodiments the numerical value is 10;

in some embodiments the numerical value is in the range of 9.5 to 10.5;

and if from the context the person of ordinary skill in the art would understand that values within a certain range are substantially equivalent to 10 because the values with the range would be understood to provide substantially the same result as the value 10 then "about 10" also includes:

in some embodiments the numerical value is in the range of C to D where C and D are respectively lower and upper endpoints of the range that encompasses all of those values that provide a substantial equivalent to the value 10

Specific examples of systems, methods and apparatus have been described herein for purposes of illustration. These are only examples. The technology provided herein can be applied to systems other than the example systems described above. Many alterations, modifications, additions, omissions, and permutations are possible within the practice of this invention. This invention includes variations on described embodiments that would be apparent to the skilled addressee, including variations obtained by: replacing features, elements and/or acts with equivalent features, elements and/or acts; mixing and matching of features, elements and/or acts from different embodiments; combining features, elements and/or acts from embodiments as described herein with features, elements and/or acts of other technology; and/or omitting combining features, elements and/or acts from described embodiments.

As will be apparent to those of skill in the art upon reading this disclosure, each of the individual embodiments described and illustrated herein has discrete components and features which may be readily separated from or combined with the features of any other described embodiment(s) without departing from the scope of the present invention.

Any aspects described above in reference to apparatus may also apply to methods and vice versa.

Any recited method can be carried out in the order of events recited or in any other order which is logically possible. For example, while processes or blocks are presented in a given order, alternative examples may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, simultaneously or at different times.

Various features are described herein as being present in "some embodiments". Such features are not mandatory and may not be present in all embodiments. Embodiments of the invention may include zero, any one or any combination of two or more of such features. All possible combinations of such features are contemplated by this disclosure even where such features are shown in different drawings and/or described in different sections or paragraphs. This is limited only to the extent that certain ones of such features are incompatible with other ones of such features in the sense that it would be impossible for a person of ordinary skill in the art to construct a practical embodiment that combines such incompatible features. Consequently, the description that "some embodiments" possess feature A and "some embodiments" possess feature B should be interpreted as an express indication that the inventors also contemplate embodiments which combine features A and B (unless the description states otherwise or features A and B are fundamentally incompatible). This is the case even if features A and B are illustrated in different drawings and/or mentioned in different paragraphs, sections or sentences.

It is therefore intended that the following appended claims and claims hereafter introduced are interpreted to include all such modifications, permutations, additions, omissions, and sub-combinations as may reasonably be inferred. The scope of the claims should not be limited by the preferred embodiments set forth in the examples, but should be given the broadest interpretation consistent with the description as a whole.

What is claimed is:

1. A method of installing a security alarm system on a window/door and framing, the security alarm system including an object and a sensor which is capable of detecting the object within a predetermined range, the method comprising:
   coupling a first of the sensor and the object to a first of the window/door and the framing;
   opening the window/door to a threshold distance which facilitates ventilation and inhibits an intruder from passing through the window/door;
   next adjusting positioning a second of the sensor and the object along a second of the window/door and the framing such that the sensor is able to detect the object as the window/door is opened up to but not past said threshold distance; and
   then coupling the second of the sensor and the object so positioned to the second of the window/door and the framing.

2. A method according to claim 1, the method including configuring the sensor to send a signal which triggers an alarm when the window/door is open greater than said threshold distance.

3. A method according to claim 1, wherein the method includes configuring the sensor to send a signal or notification to an electronic device when the window/door is open greater than said threshold distance.

4. A method according to claim 3, wherein the electronic device is a smartphone.

5. A method according to claim 3, wherein the electronic device is a control panel.

6. A method according to claim 1, wherein the sensor is a magnetic field sensor and wherein the object is a magnet.

7. A method according to claim 1, wherein the sensor includes a radio-frequency identification (RFID) reader and wherein the object comprises one or more radio-frequency identification (RFID) tags.

8. A method according to claim 1, including:
   providing the sensor with an indicator configured to provide an indication of the presence or absence of a magnetic field; and
   within the positioning step, determining that the sensor is able to detect the object as the window/door is opened up to but not past said threshold distance via the indicator.

9. A method according to claim 1, wherein the threshold distance varies a function of the extent to which the sensor is spaced from the object.

10. A method according to claim 1, including reducing the threshold distance by positioning one of the sensor and the object on the window/door downstream of the other of the sensor and the object on the framing.

11. A method according to claim 1, including increasing the threshold distance by positioning the one of the sensor and the object on the window/door upstream of the other of the sensor and the object on the framing.

12. A method according to claim 1, wherein the method includes configuring the sensor to send one or more said signals or notifications to the electronic device conveying the extent to which the window/door is open or closed.

13. A method according to claim 1, wherein the method includes: configuring the sensor to send a signal or notification to an electronic device when the window/door is open greater than said threshold distance; and configuring the sensor to send one or more said signals or notifications to the electronic device conveying the extent to which the window/door is open or closed.

14. A method of arranging a security alarm system on a window/door and framing, the security alarm system including an object and a sensor which is capable of detecting the object within a predetermined range, the method comprising:

positioning a first of the sensor and the object on a first of the window/door and the framing;

opening the window/door to a threshold distance which facilitates ventilation and inhibits an intruder from passing through the window/door; and next adjusting positioning a second of the sensor and the object along a second of the window/door and the framing such that the sensor is able to detect the object as the window/door is opened up to but not past said threshold distance.

15. A method according to claim 14, the method including configuring the sensor to send a signal which triggers an alarm when the window/door is open greater than said threshold distance.

16. A method according to claim 14, the method including configuring the sensor to send a signal or notification to an electronic device when the window/door is open greater than said threshold distance.

17. A method according to claim 16, wherein the electronic device is one or more of: a smartphone and a control panel.

18. A method according to claim 14, wherein the sensor is a magnetic field sensor and wherein the object is a magnet.

19. A method according to claim 14, wherein the sensor includes a radio-frequency identification (RFID) reader and wherein the object comprises one or more radio-frequency identification (RFID) tags.

20. A method according to claim 14, the method including configuring the sensor to send one or more said signals or notifications to the electronic device conveying the extent to which the window/door is open or closed.

* * * * *

UNITED STATES PATENT AND TRADEMARK OFFICE
CERTIFICATE OF CORRECTION

| | | |
|---|---|---|
| PATENT NO. | : 11,763,652 B2 | Page 1 of 1 |
| APPLICATION NO. | : 17/686232 | |
| DATED | : September 19, 2023 | |
| INVENTOR(S) | : Julian Paul Carlson, Paul Justin Carlson and Dean David Schebel | |

It is certified that error appears in the above-identified patent and that said Letters Patent is hereby corrected as shown below:

In the Claims

Column 20, Line 13-30 Claim 1, Should read:
1. A method of installing a security alarm system on a window/door and framing, the security alarm system including an object and a sensor which is capable of detecting the object within a predetermined range, the method comprising:
    coupling a first of the sensor and the object to a first of the window/door and the framing;
    opening the window/door to a threshold distance which facilitates ventilation and inhibits an intruder from passing through the window/door;
    next adjusting positioning of a second of the sensor and the object along a second of the window/door and the framing such that the sensor is able to detect the object as the window/door is opened up to but not past said threshold distance; and
    then coupling the second of the sensor and the object so positioned to the second of the window/door and the framing.

Signed and Sealed this
Seventh Day of November, 2023

*Katherine Kelly Vidal*
Katherine Kelly Vidal
*Director of the United States Patent and Trademark Office*